(12) United States Patent
Omatsu et al.

(10) Patent No.: US 11,878,274 B2
(45) Date of Patent: Jan. 23, 2024

(54) FILTERING DEVICE, PURIFICATION DEVICE, AND METHOD FOR MANUFACTURING CHEMICAL LIQUID

(71) Applicant: FUJIFILM CORPORATION, Tokyo (JP)

(72) Inventors: Tadashi Omatsu, Shizuoka (JP); Tetsuya Kamimura, Shizuoka (JP); Tetsuya Shimizu, Shizuoka (JP); Satomi Takahashi, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 16/927,062

(22) Filed: Jul. 13, 2020

(65) Prior Publication Data

US 2020/0384416 A1 Dec. 10, 2020

Related U.S. Application Data

(63) Continuation of application No. PCT/JP2019/007308, filed on Feb. 26, 2019.

(30) Foreign Application Priority Data

Mar. 22, 2018 (JP) .................................. 2018-055152

(51) Int. Cl.
*B01D 61/18* (2006.01)
*B01D 61/20* (2006.01)
(Continued)

(52) U.S. Cl.
CPC ........... *B01D 61/18* (2013.01); *B01D 61/146* (2022.08); *B01D 61/20* (2013.01); *B01D 71/56* (2013.01);
(Continued)

(58) Field of Classification Search
CPC ........ B01D 61/18; B01D 61/20; B01D 71/56; B01D 71/64; B01D 69/02; B01D 2319/02;
(Continued)

(56) References Cited

U.S. PATENT DOCUMENTS 3,551,203 A * 12/1970 Corson .................. B01D 37/00
127/55
10,429,738 B2 * 10/2019 Nakata ..................... G03F 7/091
(Continued)

FOREIGN PATENT DOCUMENTS

CN 106552517 A 4/2017
EP 2008974 A1 * 12/2008 ........... B01D 61/025
(Continued)

OTHER PUBLICATIONS

International Search Report dated Jun. 4, 2019 from the International Searching Authority in International Application No. PCT/JP2019/007308.
(Continued)

*Primary Examiner* — Krishnan S Menon
(74) *Attorney, Agent, or Firm* — Sughrue Mion, PLLC

(57) ABSTRACT

A filtering device is for obtaining a chemical liquid by purifying a liquid to be purified, and the filtering device has an inlet portion, an outlet portion, a filter A, at least one filter B different from the filter A, and a flow path which includes the filter A and the filter B arranged in series and extends from the inlet portion to the outlet portion, in which the filter A is a porous membrane containing a polyimide-based resin.

25 Claims, 19 Drawing Sheets

(51) Int. Cl.
  *B01D 71/56* (2006.01)
  *B01D 71/64* (2006.01)
  *B01D 61/14* (2006.01)
  *B01D 69/02* (2006.01)

(52) U.S. Cl.
  CPC .............. *B01D 71/64* (2013.01); *B01D 69/02* (2013.01); *B01D 2319/02* (2013.01)

(58) Field of Classification Search
  CPC ............ B01D 2311/25; B01D 2313/50; B01D 2319/025; B01D 61/58; B01D 71/26; B01D 71/36; B01D 65/02; B01D 71/82; B01D 61/142; G03F 7/26; H01L 21/304
  See application file for complete search history.

(56) References Cited

U.S. PATENT DOCUMENTS

| | | | |
|---|---|---|---|
| 2006/0014098 A1 | 1/2006 | Hada et al. | |
| 2010/0292844 A1* | 11/2010 | Wolf | C02F 9/00 700/271 |
| 2014/0262989 A1* | 9/2014 | Pimentel | C02F 1/441 210/96.2 |
| 2016/0026088 A1 | 1/2016 | Yamanaka et al. | |
| 2017/0090293 A1 | 3/2017 | Nakata et al. | |
| 2018/0028983 A1 | 2/2018 | Takashima et al. | |
| 2020/0024157 A1 | 1/2020 | Kano et al. | |

FOREIGN PATENT DOCUMENTS

| | | |
|---|---|---|
| JP | 2002-099098 A | 4/2002 |
| JP | 2004-212975 A | 7/2004 |
| JP | 2014-202807 A | 10/2014 |
| JP | 2016-155121 A | 9/2016 |
| JP | 2017-068261 A | 4/2017 |
| JP | 2020-507462 A | 3/2020 |
| WO | 2018043697 A1 | 3/2018 |
| WO | WO-2018043697 A1 * | 3/2018 ............ B01D 15/00 |

OTHER PUBLICATIONS

Written Opinion dated Jun. 4, 2019 from the International Bureau in International Application No. PCT/JP2019/007308.
International Preliminary Report on Patentability dated Sep. 22, 2020 from the International Bureau in International Application No. PCT/JP2019/007308.
Office Action dated Oct. 14, 2021 in Korean Application No. 10-2020-7020669.
Notice of Reasons for Refusal dated Jun. 22, 2021 by the Japanese Patent Office in Japanese Application No. 2020-507462.
Notice of Final Rejection dated Apr. 25, 2022 from the Korean Patent Office in Korean Application No. 10-2020-7020669.
Office Action dated Feb. 1, 2022 in Japanese Application No. 2020-507462.
Office Action dated Nov. 17, 2022 in Taiwanese Application No. 108107701.
Office Action dated Jul. 25, 2022 in Taiwanese Application No. 108107701.
Office Action dated Aug. 18, 2022 in Korean Application No. 10-2020-7020669.
Communication dated May 9, 2023, issued in Japanese Application No. 2022-074027.
Office Action dated Aug. 2, 2023 in Korean Application No. 10-2022-7044199.

* cited by examiner

FILTERING DEVICE, PURIFICATION DEVICE, AND METHOD FOR MANUFACTURING CHEMICAL LIQUID

CROSS-REFERENCE TO RELATED APPLICATIONS

This application is a Continuation of PCT International Application No. PCT/JP2019/007308 filed on Feb. 26, 2019, which claims priority under 35 U.S.C § 119(a) to Japanese Patent Application No. 2018-055152 filed on Mar. 22, 2018. Each of the above application(s) is hereby expressly incorporated by reference, in its entirety, into the present application.

BACKGROUND OF THE INVENTION

1. Field of the Invention

The present invention relates to a filtering device, a purification device, and a method for manufacturing a chemical liquid.

2. Description of the Related Art

In a case where semiconductor devices are manufactured by a wiring forming process including photolithography, as a prewet solution, a resist solution (resist resin composition), a developer, a rinsing solution, a peeling solution, a chemical mechanical polishing (CMP) slurry, a post-CMP washing solution or the like or as a diluted solution of these, a chemical liquid containing water and/or an organic solvent is used.

In recent years, as photolithography techniques have become advanced, patterns have been further miniaturized.

The chemical liquid used in such a wiring forming process is required to have further improved defect inhibition performance. Generally, such a chemical liquid is considered to be obtained by purifying a liquid to be purified, which contains requisite components for the chemical liquid as main components, by using a filter or the like so as to remove impurities and the like.

As a method for manufacturing such a chemical liquid, JP2017-068261A describes "a method for manufacturing a chemical liquid purified product for lithography, including a filtration step of filtering a chemical liquid for lithography by using a filter comprising a polyimide-based resin porous membrane". Furthermore, in JP2016-155121A describes "a method for purifying a liquid, including causing a part or all of a liquid to permeate a polyimide and/or polyamideimide porous membrane having communicating holes from one side to the other side of the membrane by applying differential pressure thereto".

SUMMARY OF THE INVENTION

The inventors of the present invention obtained a chemical liquid by purifying a liquid to be purified by using the aforementioned purification method and evaluated the defect inhibition performance of the chemical liquid. As a result, the inventors have found that sometimes a sufficient defect inhibition performance is not obtained. Therefore, an object of the present invention is to provide a filtering device capable of manufacturing a chemical liquid having excellent defect inhibition performance. Another object of the present invention is to provide a purification device and a method for manufacturing a chemical liquid.

In order to achieve the aforementioned objects, the inventors of the present invention carried out intensive examinations. As a result, the inventors have found that the objects are achieved by the following constitution.

[1] A filtering device for obtaining a chemical liquid by purifying a liquid to be purified, the filtering device having an inlet portion, an outlet portion, a filter A, at least one filter B different from the filter A, and a flow path which includes the filter A and the filter B arranged in series and extends from the inlet portion to the outlet portion, in which the filter A is a porous membrane containing a polyimide-based resin.

[2] The filtering device described in [1], in which an imidization ratio of the polyimide-based resin is equal to or higher than 1.0.

[3] The filtering device described in [1] or [2], in which the filter B includes at least one filter BD that is disposed on a downstream side of the filter A of the flow path and has a pore size smaller than a pore size of the filter A.

[4] The filtering device described in [3], in which the pore size of the filter BD is equal to or smaller than 20 nm.

[5] The filtering device described in [3] or [4], in which the filter BD contains at least one kind of resin selected from the group consisting of polyethylene, nylon, and polytetrafluoroethylene.

[6] The filtering device described in any one of [3] to [5], in which the filter BD contains a second resin having a hydrophilic group.

[7] The filtering device described in [1] or [2], in which the filter B includes at least one filter BU that is disposed on an upstream side of the filter A on the flow path and has a pore size larger than a pore size of the filter A.

[8] The filtering device described in [7], in which the pore size of the filter BU is equal to or greater than 20 nm. [9] The filtering device described in any one of [1] to [8], in which the filter B includes at least one filter that is disposed on an upstream side of the filter A on the flow path and contains a resin having an ion exchange group.

[10] The filtering device described in [9], in which the ion exchange group is at least one kind of group selected from the group consisting of an acid group and a base group.

[11] The filtering device described in any one of [1] to [10], further having a tank arranged in series with the filter A on the flow path.

[12] The filtering device described in [11], further having a filter C having a pore size equal to or smaller than 20 nm that is arranged in series with the tank on an upstream side of the tank in the flow path.

[13] The filtering device described in [1] or [2], further having a return flow path capable of returning the liquid to be purified to an upstream side of the filter A from a downstream side of the filter A on the flow path.

[14] The filtering device described in any one of [3] to [6], further having a return flow path capable of returning the liquid to be purified to an upstream side of a reference filter from a downstream side of the reference filter, in which the reference filter consists of any of the at least one of the filters BD.

[15] The filtering device described in any one of [1] to [14], in which the chemical liquid is at least one kind of chemical liquid selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat or at least one kind of chemical liquid selected from the group consisting of an aqueous developer, an aqueous rinsing solution, a peeling solution, a remover, an etching solution, an acidic washing solution, phosphoric acid, and a phosphoric acid-aqueous hydrogen peroxide mixture.

[16] The filtering device described in any one of [1] to [15], in which a pH of the chemical liquid is 0 to 9.

[17] A purification device having the filtering device described in any one of [1] to [16] and at least one distiller connected to the inlet portion of the filtering device.

[18] The purification device described in [17], in which at least one distiller includes a plurality of distillers connected in series.

[19] A method for manufacturing a chemical liquid that is for obtaining a chemical liquid by purifying a liquid to be purified, the method having a filtration step of purifying the liquid to be purified by using the filtering device described in any one of [1] to [16] so as to obtain a chemical liquid.

[20] The method for manufacturing a chemical liquid described in [19], further having a filter washing step of washing the filter A and the filter B by using a washing solution before the filtration step.

[21] The method for manufacturing a chemical liquid described in [19] or [20], further having a device washing step of washing a liquid contact portion of the filtering device by using a washing solution before the filtration step.

[22] The method for manufacturing a chemical liquid described in [20] or [21], in which the washing solution contains at least one kind of compound selected from the group consisting of a hydroxyaliphatic carboxylic acid ester, an aliphatic carboxylic acid ester, chain-like or cyclic ketone, alkylene glycol monoalkyl ether, alkylene glycol monoalkyl ether acetate, and an aprotic polar solvent.

According to the present invention, it is possible to provide a filtering device capable of manufacturing a chemical liquid having excellent defect inhibition performance. Furthermore, the present invention can also provide a purification device and a method for manufacturing a chemical liquid.

In the present specification, "defect inhibition performance" of a chemical liquid means the performance of the chemical liquid evaluated by the method described in Examples. A chemical liquid used for manufacturing a semiconductor substrate is required to have "defect inhibition performance" corresponding to the type and role of the chemical liquid.

In the present specification, for a chemical liquid such as a prewet solution, a developer, or a rinsing solution that is used for forming a resist film, the residue defect described in [Test Example 1] in Examples, which will be described later, is adopted as one of the typical indices of defects in a lithography process, and the residue defect inhibition performance is regarded as "defect inhibition performance". Furthermore, for a resist resin composition containing a resin and used for forming a resist film, the bridge defect described in [Test Example 3] in Examples, which will be described later, is adopted as one of the typical indices of defects derived from the resist resin composition in a lithography process, and the bridge defect inhibition performance is regarded as "defect inhibition performance". In addition, for a chemical liquid used as an etching solution, a resist peeling solution, or the like, the particle defect described in [Test Example 2] in Examples, which will be described later, is adopted as one of the typical indices of defects derived from the chemical liquid, and the particle defect inhibition performance is regarded as "defect inhibition performance".

Hereinafter, in a case where a characteristic is simply referred to as "defect inhibition performance", this means the defect inhibition performance (residue defect inhibition performance, bridge defect inhibition performance, or particle defect inhibition performance) corresponding to the type of the chemical liquid.

DESCRIPTION OF THE PREFERRED EMBODIMENTS

Figure 1:
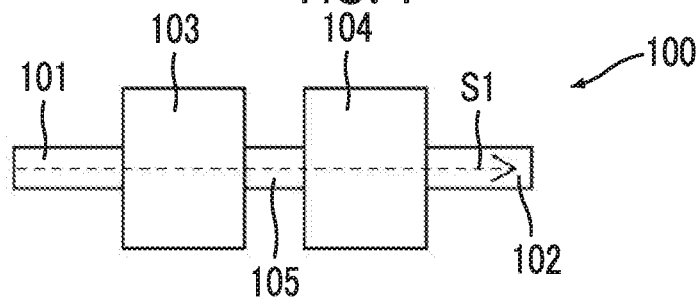
FIG. 1 is a schematic view illustrating a filtering device according to a first embodiment of the present invention.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values described before and after "to" as a lower limit and an upper limit respectively.

[Filtering Device]

The filtering device according to an embodiment of the present invention has an inlet portion, an outlet portion, a filter A, at least one filter B different from the filter A, and a flow path (path through which a liquid to be purified flows) which includes the filter A and the filter B arranged in series and extends from the inlet portion to the outlet portion (in other words, the filtering device has a flow path which includes a filter A and at least one filter B different from the filter A arranged in series between an inlet portion and an outlet portion and extends from the inlet portion to the outlet portion), in which the filter A is a porous membrane containing a polyamideimide-based resin (in other words, the filter A is a porous membrane containing a polyamideimide-based resin as a component (material component) constituting the material of the filter A).

Generally, as impurities in a chemical liquid involved in the defect inhibition performance of the chemical liquid, for example, a gel-like organic compound (particularly, a polymer compound) component, inorganic fine particles, inorganic ions, and the like are considered.

It is considered that among these, the gel-like polymer compound or the inorganic fine particles that can be solid contents in the chemical liquid may be easily removed by a sieving effect of a filter, and thus the defect inhibition performance of the obtained chemical liquid may be improved.

In contrast, it is considered that the inorganic components other than particles and the ionic components may be easily removed by an adsorption function of a filter (such as the adsorption by the interaction between ions and the adsorption by the hydrophilic and hydrophobic interaction), and thus the defect inhibition performance of the obtained chemical liquid may be improved.

By the inventors of the present invention, it has been found, for the first time, that in a case where a filter having a sieving effect and a filter having an adsorption effect are arranged in series on a flow path of a filtering device, a chemical liquid is obtained which has a defect inhibition performance improved further than in a case where the each of the above filters is used singly. According to the inventors of the present invention, the mechanism yielding the above result is assumed to be as below.

According to the study of the inventors of the present invention, it has been revealed that sometimes defects occur in a case where microgel (containing an organic compound) which is not a source of defect alone interacts with inorganic fine particles and/or inorganic ions, in a case where inorganic fine particles, trace metals, and the like which are not a source of defect alone interact with a gel-like organic compound, or in a case where microgel interacts with inorganic fine particles, trace metals, and the like.

Particularly, by the filtration based on a molecular sieving effect, microgel is not thoroughly removed due to the influence of solvation in a chemical liquid. In a case where the chemical liquid is applied to a wafer and then dried, the effect of solvation is reduced, and thus gel is formed, which is considered as one of the causes of the occurrence of defects.

For such a complex source of defect, it is effective to remove each of the causative components interacting with each other. It is considered that in a case where the microgel component and the inorganic ultrafine particle component and the inorganic ion component capable of interacting with the microgel component are removed by the sieving effect and the adsorption effect, defects could be further reduced.

It is considered that the defect removing efficiency of the filtering device according to an embodiment of the present invention may be improved by a combination of factors such as the ion trapping effect brought about by the filter A as a porous membrane containing a polyimide-based resin as a material component and the effect of removing gel-like fine particles and inorganic fine particles brought about by the filter B which is combined with the filter A, and thus a chemical liquid having excellent defect inhibition performance may be obtained.

In the filtering device according to the embodiment of the present invention, because the filter A and the filter B are arranged in series on the flow path, the liquid to be purified is sequentially filtered through the filter A and the filter B (or the filter B and the filter A). Hereinafter, a filtering device according to an embodiment of the present invention will be described. In the following section, a filtering device for a dead-end filtration method that filters the entirety of a liquid to be purified introduced into a filter by using the filter will be described for example. However, the filtering device according to the embodiment of the present invention is not limited thereto, and may be a filtering device for a cross-flow method that divides the introduced liquid to be purified into a liquid to be purified having undergone purification and a concentrate (sometimes the concentrate is introduced again into a filter as a liquid to be purified) or may be a filtering device for a method as a combination of the dead-end filtration method and the cross-flow method. Hereinafter, the filtering device will be described using drawings.

First Embodiment

FIG. 1 is a schematic view illustrating a filtering device according to a first embodiment of the present invention.

A filtering device 100 is a filtering device in which a filter 103 as a filter A and a filter 104 (filter BD) having a pore size smaller than a pore size of the filter 103 are connected in series through a piping 105 between the inlet portion 101 and the outlet portion 102.

The inlet portion 101, the filter 103, the piping 105, the filter 104, and the outlet portion 102 are constituted such that a liquid to be purified can flow in the interior of each of these members. These members are connected to one another and form a flow path S1 (path through which the liquid to be purified flows).

The shape of the inlet portion 101 and the outlet portion 102 is not particularly limited as long as the liquid to be purified can be introduced into and discharged from the filtering device. Typically, examples thereof include a hollow cylindrical piping (inlet portion and outlet portion) having an inlet port and an outlet port. Hereinafter, an embodiment in which each of the outlet portion and the inlet portion is a piping will be described for example.

The shapes of the inlet portion 101, the piping 105, and the outlet portion 102 are not particularly limited. Typically, examples thereof include a hollow cylinder shape in which the liquid to be purified can flow in these members. Although the material component of these is not particularly limited, it is preferable that a liquid contact portion (a portion that is likely to contact the liquid to be purified in a case where the liquid to be purified is filtered) thereof is formed of an anticorrosive material which will be described later.

The liquid to be purified introduced from the inlet portion 101 of the filtering device 100 flows in the filtering device 100 along the flow path S1. In the meantime, the liquid to be purified is sequentially filtered through the filter 103 (filter A) and the filter 104 (filter BD) and then discharged out of the filtering device 100 from the outlet portion 102. The form of the liquid to be purified will be described later.

For the purpose of allowing the liquid to be purified to flow, the filtering device 100 may have a pump, a damper, a valve, and the like, which are not shown in the drawing, on the flow path S1 (for example, in the inlet portion 101, the piping 105, the outlet portion 102, and the like).

The shape of the filter 103 (filter A) and the filter 104 (filter B) is not particularly limited. For example, the filter A and the filter B have a flat shape, a pleated shape, a spiral shape, a hollow cylindrical shape, and the like. Particularly, in view of further improving handleability, typically, the filter A and the filter B are preferably in the form of a cartridge filter having a core, which is formed of a material permeable to the liquid to be purified and/or has a structure permeable to the liquid to be purified, and a filter which is disposed on the core in a state of being wound around the core. In this case, although the material of the core is not particularly limited, it is preferable that the core is formed of the anticorrosive material which will be described later.

The method of arranging the filters is not particularly limited. Typically, it is preferable to arrange the filters in a housing not shown in the drawing that has at least one entrance, at least one exit, and at least one flow path formed between the entrance and the exit. In this case, the filters are arranged to cross the flow path in the housing. The flow path formed in the housing forms a portion of the flow path S1. While flowing through the flow path S1, the liquid to be purified is filtered through the filters that are arranged to cross the flow path S1.

The material of the housing is not particularly limited. Examples thereof include any appropriate hard and impermeable materials including impermeable thermoplastic materials compatible with the liquid to be purified. For example, the housing can be prepared from a metal such as stainless steel or a polymer. In an embodiment, the housing is a polymer such as polyacrylate, polypropylene, polystyrene, or polycarbonate.

Furthermore, in view of obtaining a filtering device having further improved effects of the present invention, at least a portion of a liquid contact portion of the housing, which is preferably 90% and more preferably 99% of the surface area of the liquid contact portion, is preferably formed of the anticorrosive material which will be described later. In the present specification, the liquid contact portion means a portion which is likely to contact the liquid to be purified (here, the filter is not included in the liquid contact portion), and means the inner wall of a unit such as the housing and the like.

<Filter A>

The filter A is a porous membrane containing a polyimide-based resin as a material component. In the present specification, "polyimide-based resin" means polyimide and polyamideimide, and the filter A may contain at least one resin selected from the group consisting of polyimide and polyamideimide as a material component. The polyimide-based resin may have at least one functional group selected from the group consisting of a carboxy group, a salt-type carboxy group, and a —NH— bond.

The filter A is a porous membrane containing a polyimide-based resin as a material component. The filter A may be a porous membrane consisting of a polyimide-based resin or a porous membrane containing a material component other than a polyimide-based resin.

In a case where the filter A contains a material component other than a polyimide-based resin, examples of the filter A include a porous membrane consisting of a laminate having a layer containing a polyimide-based resin and a layer containing another material (for example, nylon, polytetrafluoroethylene, a tetrafluoroethylene•perfluoroalkyl vinyl ether copolymer, and the like).

The filter A is a porous membrane and has a large number of pores in the membrane. The structure of the pores (pore structure) is not particularly limited, but it is preferable that the filter A has communicating holes formed of a large number of spherical holes communicating with each other. Furthermore, it is preferable that a flow path of a liquid to be purified is formed in the filter A by the communicating holes and the like.

The method of forming the porous membrane having the pore structure described above is not particularly limited. Typically, the porous membrane can be formed by forming a composite membrane containing a polyimide-based resin and fine particles and then removing the fine particles. In a case where the porous membrane is formed as above, in the composite membrane, communicating holes are easily formed in a portion where the fine particles contact each other. The method for manufacturing the porous membrane will be described later.

In a case where a liquid to be purified flows through the communicating holes, by separation and/or adsorption, impurities are removed from the liquid to be purified.

The communicating holes may be formed of each of the holes (hereinafter, simply referred to as "hole" in some cases) that impart porosity to the filter A. The hole is preferably a hole having a curved surface within the inner surface thereof that will be described later, and more preferably an approximately spherical hole that will be described later. It is preferable that the filter A has a structure in which portions where each of the above holes adjacent to each other forms communicating holes and the holes communicate with each other. Furthermore, it is preferable that a plurality of holes are connected to one another and the connected holes are found to form a flow path of a liquid to be purified in a case where the entire filter A is viewed.

In this case, the flow path is preferably formed by the connection of each of "holes" and/or "communicating holes".

Typically, it is preferable that each of the holes is a hole formed by removing each of the fine particles present in the polyimide-based resin-fine particle composite membrane by the latter step in the method for manufacturing the filter A that will be described later. Furthermore, the communicating holes may be each of the adjacent holes formed in portions, where each of the fine particles present in a polyimide-based resin-fine particle composite membrane are adjacent to each other, by removing the fine particles by the latter step in the method for manufacturing a polyimide-based resin porous membrane that will be described later.

The filter A preferably includes communicating holes having a B value equal to or smaller than 15 nm that is determined by the method which will be described later. According to the manufacturing method which will be described later, one communicating hole is typically formed of two adjacent particles in many cases. In this case, supposing that a direction along which two holes constituting the communicating hole continue is regarded as a longitudinal direction, sometimes the diameter of the hole is in a direction perpendicular to the longitudinal direction. In a case where each of the holes imparting porosity to the filter A has a broad pore size distribution, the pore size of the communicating holes formed of the adjacent holes tends to be reduced.

In the present specification, "B value" means a number (unit: nm) calculated by the following method.

First, adherent molecules are adsorbed onto or desorbed from the filter A so as to obtain an adsorption isotherm. Then, from the obtained adsorption isotherm, $[P/\{V_a(P_0-P)\}]$ is calculated based on the following Equation (1) and plotted against an equilibrium relative pressure ($P/P_0$). Thereafter, the plot is regarded as a straight line, a slope s $(=[(C-1)/(V_m \cdot C)])$ and an intercept i $(=[1/(V_m \cdot C)])$ are calculated based on the least square method. From the determined slope s and intercept i, $V_m$ and C are calculated based on Equation (2-1) and Equation (2-2). Furthermore, from $V_m$, a specific surface area A is calculated based on Equation (3).

Subsequently, the adsorption data on the determined adsorption isotherm is subjected to linear interpolation, and an adsorption amount under a relative pressure set as a relative pressure for calculating a pore volume is determined. The total pore volume V is calculated from the adsorption amount.

This method is generally based on the theory of a series of calculation methods of specific surface area called "BET (Brunauer, Emmett, Teller) method". In performing the above method, the details that are not described in the present specification are based on JIS R 1626-1996 "Method for measuring specific surface area of fine ceramic powder by gas adsorption BET method".

$$[P/\{V_a(P_0-P)\}]=[1/(V_m \cdot C)]+[(C-1)/(V_m \cdot C)](P/P_0) \quad (1)$$

$$V_m=1/(s+i) \quad (2\text{-}1)$$

$$C=(s/i)+1 \quad (2\text{-}2)$$

$$A=(V_m \cdot L \cdot \sigma)/22414 \quad (3)$$

$V_a$: Adsorption amount
$V_m$: Adsorption amount of monolayer
P: Pressure at equilibrium of adherent molecules
$P_0$: Saturated vapor pressure of adherent molecules
L: Avogadro's number
σ: Cross-sectional area of adherent molecules adsorbed.

After the specific surface area A and the total pore volume V are calculated based on the above method, the B value (nm) is calculated from Equation [4V/A] based on the obtained specific surface area A and the total pore volume V. The B value (nm) has significance as a micropore size estimated from the measurement result of the BET method.

In a case where the filter A has the communicating holes described above, and a liquid to be purified is passed through the filter A, the liquid to be purified can pass through the inside of the filter A. It is preferable that the filter A has a flow path, which is the connection of holes having a curved surface within the inner surface thereof by communicating holes, in the inside thereof.

As described above, the filter A is preferably a porous membrane containing holes having a curved surface within the inner surface thereof, and more preferably a porous membrane in which many of holes (preferably substantially all holes) are in the form of a curved surface. In the present specification, regarding holes, "having a curved surface within the inner surface thereof" means that at least the inner surface of the holes resulting in porosity has a curved surface within at least a portion of the inner surface.

It is preferable that the holes of the filter A have a curved surface substantially within at least the entirety of the inner surface of the holes. Hereinafter, such holes will be called "approximately spherical holes" in some cases. In the present specification, "approximately spherical holes" means holes having an approximately spherical internal space. The approximately spherical holes are easily formed in a case where the fine particles used in the manufacturing method, which will be described later, are approximately spherical.

In the present specification, "approximately spherical" is a concept including a perfect sphere. However, the concept is not necessarily limited to a perfect sphere, and includes holes that are substantially spherical. In the present specification, "substantially spherical" means that the sphericity, which is defined by a sphericity represented by a value obtained by dividing the major axis of a particle by the minor axis thereof, is within 1±0.3. The sphericity of the approximately spherical holes of the filter A is preferably within 1±0.1, and more preferably within 1±0.05.

It is considered that because the holes in the porous membrane have a curved surface within the inner surface thereof, in a case where a liquid to be purified is passed through the filter A, the liquid to be purified could thoroughly spread on the inside of the holes of the filter A and could thoroughly contact the inner surface of the holes, and thus sometimes convection is likely to occur along the curved surface of the inner surface. The approximately spherical holes may additionally have recesses on the inner surface thereof. The recesses may be formed, for example by holes having an opening within the inner surface of the approximately spherical holes and having a pore size smaller than that of the approximately spherical holes.

It is preferable that the filter A has a structure in which approximately spherical holes having an average sphere diameter equal to or smaller than 2,000 nm communicate with one another. The average sphere diameter of the approximately spherical holes is preferably equal to or smaller than 600 nm, and more preferably equal to or smaller than 500 nm. In a case where the average sphere diameter is in a range of 600 nm to 2,000 nm, the particle size distribution index (d25/d75) of the fine particles which will be described later is preferably 1.6 to 5 and more preferably in a range of 2 to 4. In a case where the average sphere diameter is equal to or smaller than 600 nm, the particle size distribution index (d25/d75) of the fine particles which will be described later is preferably 1 to 5 and more preferably 1.1 to 4. For a porous membrane subjected to a chemical etching treatment which will be described later, the average sphere diameter of the approximately spherical holes is a value obtained by determining the average amount of change in size of communicating holes by using a porometer and then calculating the actual average sphere diameter of the approximately spherical holes from the determined value. For a porous membrane such as polyamideimide not being subjected to the aforementioned chemical etching treatment, the average particle size of fine particles used for manufacturing the porous membrane can be adopted as the average sphere diameter of the approximately spherical holes.

The filter A contains a polyimide-based resin as a material component, and may contain other resins. The content of the resin in the material component of the filter A is not particularly limited. Generally, the content of the resin with respect to the total mass of the filter A is preferably equal to or greater than 95% by mass, more preferably equal to or greater than 98% by mass, and even more preferably equal to or greater than 99% by mass. The filter A may substantially consist only of a resin. "Consist only of a resin" means that the material component consists only of a resin except for impurities and the like unintentionally intermixed.

The polyimide-based resin may have at least one kind of substituent selected from the group consisting of a carboxy group, a salt-type carboxy group, and a —NH— bond.

It is preferable that the polyimide-based resin is a polymer having the aforementioned substituent in a portion other than the terminal of a main chain. Examples of the polymer having the substituent in a portion other than the terminal of a main chain include polyamic acid.

In the present specification, "salt-type carboxy group" means a carboxy group in which a hydrogen atom is substituted with a cation component. "Cation component" may be a cation which is in a completely ionized state, a cation constituent which is substantially in an uncharged state by forming an ionic bond with —COO⁻, or a partially charged cation constituent which is in a state in between the above ones.

In a case where "cation component" is an M ion component consisting of an n-valent metal M, the cation is represented by $M^{n+}$, and the cation constituent is an element represented by "M" in "—$COOM_{1/n}$".

"Cation component" is not particularly limited. Generally, examples thereof include an ion component or an organic alkali ion component. For example, in a case where the alkali metal ion component is a sodium ion component, the cation is a sodium ion ($Na^+$), and the cation constituent is an element represented by "Na" in "—COONa". The partially charged cation constituent is $Na^{\delta+}$.

The cation component is not particularly limited, and examples thereof include an inorganic component; an organic component such as $NH_4^+$ and $N(CH_3)_4^+$; and the like. Examples of the inorganic component include metal elements like alkali metals such as Li, Na, and K; and alkali earth metals such as Mg and Ca. Examples of the organic component include organic alkali ion components. Examples of the organic alkali ion components include a quaternary ammonium cation represented by $NH_4^+$, for example, $NR_4^+$ (4 R's each represent an organic group and may be the same or different from each other), and the like. The organic group represented by R is preferably an alkyl group, and more preferably an alkyl group having 1 to 6 carbon atoms. Examples of the quaternary ammonium cation include $N(CH_3)_4^+$, and the like.

The state of the cation component in the salt-type carboxy group is not particularly limited. Generally, the cation component is in an environment where the polyimide-based resin is present, for example, in an aqueous solution, in an organic solvent, or in a dry state. That is, the state of the cation component can change depending on the environment. In a case where the cation component is a sodium ion component and is, for example, in an aqueous solution for example, sometimes the cation component is dissociated into —COO⁻ and $Na^+$. In a case where the cation component is in an organic solvent or dry, sometimes —COONa is not dissociated.

The polyimide-based resin may have at least one substituent selected from the group consisting of a carboxy group, a salt-type carboxy group, and a —NH— bond. Generally, in a case where the polyimide-based resin has at least one of these, the resin has both the carboxy group and/or salt-type carboxy group and the —NH— bond. Having the carboxy group and/or salt-type carboxy group means that the polyimide-based resin may have either or both of the carboxy group and the salt-type carboxy group. Even for the same polyimide-based resins, the ratio between the carboxy group and the salt-type carboxy group in the polyimide-based resin can vary with the environment where the polyimide-based resin is present. The ratio is also affected by the concentration of the cation component.

In a case where the polyimide-based resin is polyimide, the total number of moles of the carboxy group and the salt-type carboxy group in the polyimide-based resin usually equals the number of moles of the —NH— bond.

Particularly, in a case where either or both of the carboxy group and the salt-type carboxy group are formed from some of the imide bonds in polyimide in the method for manufacturing a polyimide porous membrane that will be described later, the —NH— bond is also formed substantially at the same time. The total number of moles of the carboxy group and salt-type carboxy group formed equals the number of moles of the —NH— bond formed.

In the case of the method for manufacturing a polyamideimide porous membrane, the total number of moles of the carboxy group and salt-type carboxy group in the polyamideimide does not necessarily equal the number of moles of the —NH— bond, and depends on the condition of chemical etching or the like in the etching step (ring opening of an imide bond) which will be described later.

It is preferable that the polyimide-based resin has, for example, at least one kind of unit selected from the group consisting of repeating units (hereinafter, also simply referred to as "units") represented by the following General Formulas (1) to (4).

Among the polyimide-based resins, it is preferable that polyimide has at least one kind of unit selected from the group consisting of a unit represented by the following General Formula (1) and a unit represented by the following General Formula (2).

Among the polyimide-based resins, it is preferable that polyamideimide has at least one kind of unit selected from the group consisting of a unit represented by the following General Formula (3) and a unit represented by the following General Formula (4).

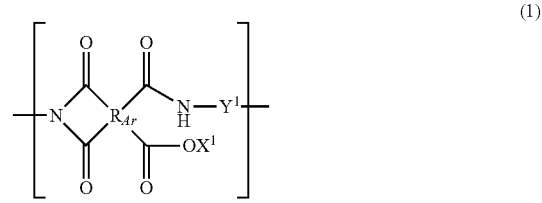

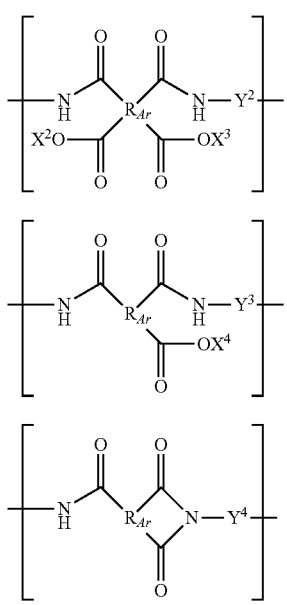

In Formulas (1) to (3), $X^1$ to $X^4$ may be the same as or different from each other and each independently represent a hydrogen atom or the cation component described above.

$R_{Ar}$ is an aryl group, and examples thereof are the same as the examples of the aryl group represented by $R_{Ar}$ bonded to a carbonyl group in each of the unit represented by Formula (5) constituting polyamic acid and the unit represented by Formula (6) constituting aromatic polyimide that will be described later.

$Y^1$ to $Y^4$ are each independently a divalent residue excluding an amino group of a diamine compound, and examples thereof are the same as the examples of the arylene group represented by $R'_{Ar}$ bonded to N in each of the unit represented by Formula (5) constituting polyamic acid and the unit represented by Formula (6) constituting aromatic polyimide that will be described later.

In a case where the polyimide-based resin is polyimide, the polyimide may have each unit represented by General Formula (1) or General Formula (2) described above by the ring opening of some of imide bonds (—N[—C(=O)]₂) that polyimide generally has. In a case where the polyimide-based resin is polyamideimide, the polyamideimide may have the unit represented by General Formula (3) described above by the ring opening of some of imide bonds (—N[—C(=O)]₂) that polyamideimide generally has.

The polyimide-based resin porous membrane may contain a polyimide-based resin having at least one substituent selected from the group consisting of a carboxy group, a salt-type carboxy group, and a —NH— bond by the ring opening of some of imide bonds.

The rate of invariance obtained in a case where some of imide bonds subjected to ring opening is determined by the following procedures (1) to (3).

Procedure (1): in a case where the etching step (ring opening of imide bond) that will be described later is not performed, a value (X01) is determined which is represented by a value obtained by dividing the area of a peak representing imide bonds measured for a porous membrane (here, in a case where varnish for preparing the porous membrane contains polyamic acid, the imidization reaction is regarded as having substantially finished in a step of baking a composite membrane that has not yet been baked) by using a Fourier transform infrared spectrometer by the area of a peak representing benzene measured in the same manner by using the Fourier transform infrared spectrometer.

Procedure (2): A porous membrane is obtained using the same polymer (varnish) as that used for preparing the porous membrane, for which X01 has been determined, and subjected to the etching step (ring opening of imide bond) that will be described later, and then a value (X02) is determined which is represented by a value obtained by dividing the area of a peak representing imide bonds measured for the porous membrane by using a Fourier transform infrared spectrometer by the area of a peak representing benzene measured in the same manner by using the Fourier transform infrared spectrometer.

Procedure (3): The rate of invariance is calculated by the following equation.

Rate of invariance (%)=(X02)÷(X01)×100

The rate of invariance in the porous membrane is preferably equal to or higher than 60%, more preferably 70% to 99.5%, and even more preferably 80% to 99%.

The porous membrane containing polyamideimide has a —NH— bond. Therefore, the rate of invariance may be 100%.

In a case where the porous membrane is a polyimide porous membrane, a value obtained by dividing the area of a peak representing imide bonds measured using the Fourier transform infrared spectrometer (FT-IR) by the area of a peak representing benzene measured in the same manner by using the FT-IR is regarded as "imidization ratio".

The imidization ratio for the value (X02) determined by the procedure (2) is not particularly limited, but is preferably equal to or higher than 1.0. Particularly, in a case where the solubility parameter of a liquid to be purified which will be described later is less than than 20 (MPa)$^{1/2}$, the imidization ratio is more preferably 1.0 to 1.5. Furthermore, in a case where the solubility parameter of a liquid to be purified which will be described later is equal to or higher than 20 (MPa)$^{1/2}$ (the upper limit thereof is not particularly limited, but is preferably equal to or lower than 30 (MPa)$^{1/2}$), the imidization ratio is preferably higher than 1.5. In this case, the upper limit thereof is not particularly limited, but is preferably equal to or lower than 2.0.

(Method for Manufacturing Filter A)

The method for manufacturing the filter A according to the present embodiment is not particularly limited, but preferably has a step of forming a carboxy group and/or a salt-type carboxy group from some of imide bonds in polyimide and/or polyamideimide (hereinafter, this step will be referred to as "etching step"). In a case where either or both of a carboxy group and a salt-type carboxy group are formed from some of imide bonds in the etching step, theoretically, —NH— bonds are also formed substantially simultaneously with the above groups in the same number of moles.

In a case where the resin contained in the filter A substantially consists of polyamideimide, the filter A already has —NH— bonds even though the filter A is not subjected to the etching step, and thus exhibits excellent adsorptivity to foreign substances in a liquid to be purified. In this case, the method for manufacturing the filter A may or may not have the etching step.

In the method for manufacturing the filter A, the etching step is preferably performed after a molded membrane containing polyimide and/or polyamideimide as a main component is prepared (hereinafter, the membrane will be simply referred to as "polyimide-based resin molded membrane in some cases).

The polyimide-based resin molded membrane which is to be subjected to the etching step may be porous or non-porous. The form of the polyimide-based resin molded membrane is not particularly limited. However, the polyimide-based resin molded membrane is preferably in the form of a thin substance such as a film and more preferably in the form of a porous thin substance such as a film, because then the porosity of the obtained polyimide-based resin porous membrane can be increased.

As described above, the polyimide-based resin molded membrane may be non-porous in a case where the membrane is subjected to the etching step. In this case, it is preferable that the membrane is made porous after the etching step.

As a method of making the polyimide-based resin molded membrane porous before or after the etching step, a method is preferable which has a fine particle removing step of removing fine particles from a composite membrane containing polyimide and/or polyamideimide and fine particles (hereinafter, the composite membrane will be referred to as "polyimide-based resin-fine particle composite membrane") so as to obtain a porous membrane.

Examples of the method for manufacturing the filter A include the following manufacturing method (a) or manufacturing method (b).

Manufacturing method (a): method having a step of etching the composite membrane containing polyimide and/or polyamideimide and fine particles before the fine particle removing step Manufacturing method (b): a method having a step of etching the polyimide-based resin molded membrane, which has been made porous by the fine particle removing step, after the fine particle removing step Between these, the manufacturing method (b) is preferable because this method makes it possible to further increase the porosity of the obtained filter A.

Hereinafter, typical examples of the method for manufacturing the filter A according to the present embodiment will be described.

The filter A according to the present embodiment is typically formed of a varnish prepared by the following method. The varnish is prepared by mixing a fine particle dispersion, which is obtained by dispersing fine particles in an organic solvent in advance, with polyamic acid, polyimide, or polyamideimide at any ratio or by polymerizing tetracarboxylic dianhydride with diamine in a fine particle dispersion so as to obtain polyamic acid or to obtain polyimide by further imidizing the polyamic acid.

The viscosity of the varnish is preferably 300 to 2,000 cP (0.3 to 2 Pa·s), and more preferably 400 to 1,800 cP (0.4 to 1.8 Pa·s). In a case where the viscosity of the varnish is within the above range, a more uniform membrane can be formed.

The viscosity of the varnish can be measured with an E-type rotational viscometer under a temperature condition of 25° C.

The mass ratio between the polyimide-based resin and fine particles (preferably fine resin particles) contained in the varnish is not particularly limited. In a case where the varnish is subjected to baking (sometimes drying is performed as baking) so as to prepare a polyimide-based resin-fine particle composite membrane, the fine (resin) particles and polyamic acid, polyimide, or polyamideimide are mixed together such that the mass ratio of the content of the fine particles to the content of the polyimide-based resin (ratio of fine particles/polyimide-based resin) preferably becomes 1 to 4 (mass ratio) and more preferably becomes 1.1 to 3.5 (mass ratio).

Furthermore, the volume ratio between the polyimide-based resin and the fine particles contained in the varnish is not particularly limited. In a case where the varnish is made into a polyimide-based resin-fine particle composite membrane, the fine particles and polyamic acid, polyimide, or polyamideimide are mixed together such that the ratio of the volume of the fine particles contained in the varnish to the volume of the polyimide-based resin contained in the varnish preferably becomes 1.1 to 5 and more preferably becomes 1.1 to 4.5.

In a case where the mass ratio or volume ratio of the resin and fine particles contained in the varnish is equal to or higher than the preferable lower limit of the range described above, the porous membrane can easily obtain holes at an appropriate density. In a case where the mass ratio or volume ratio is equal to or lower than the preferable upper limit of the range described above, the varnish tends to have appropriate viscosity, and thus a uniform membrane can be more stably manufactured.

In the present specification, the volume ratio of the resin and fine particles contained in the varnish means a value at 25° C.

The material of the fine particles contained in the varnish is not particularly limited, but is preferably a material which is insoluble in the organic solvent used in the varnish and can be selectively removed after the membrane is formed.

Examples of the material of the fine particles include silica (silicon dioxide), titanium oxide, alumina ($Al_2O_3$), calcium carbonate, and the like. Examples of the material also include a high-molecular-weight olefin (polypropylene, polyethylene, or the like), polystyrene, an acrylic resin (methyl methacrylate, isobutyl methacrylate, polymethyl methacrylate (PMMA), or the like), an epoxy resin, cellulose, polyvinyl alcohol, polyvinyl butyral, polyester, polyether, polyethylene, and the like.

Among these, silica such as colloidal silica is preferable as an inorganic material because this material makes it easy to form microholes, which have a curved surface within the inner surface thereof, in the porous membrane. As an organic material, an acrylic resin such as PMMA is preferable.

The fine resin particles can be selected from a general linear polymer and/or a known depolymerizable polymer according to the purpose without particular limitation. The general linear polymer is a polymer whose molecular chain is randomly broken during thermal decomposition. The depolymerizable polymer is a polymer decomposed into monomers during thermal decomposition. Any of the above polymers can be removed from the polyimide-based resin membrane by being decomposed into a monomer, a low-molecular-weight substance, or $CO_2$ by heating.

Among depolymerizable polymers, in view of handleability during the formation of holes, a homopolymer of methyl methacrylate or isobutyl methacrylate (polymethyl methacrylate or polyisobutyl methacrylate) thermally decomposed at a low temperature or a copolymer containing these as a main component is preferable.

The decomposition temperature of the fine resin particles is preferably 200° C. to 320° C., and more preferably 230° C. to 260° C. In a case where the decomposition temperature is equal to or higher than 200° C., a membrane can be formed even in a case where a solvent having a high boiling point is used in the varnish, and a wider choice of baking conditions of the polyimide-based resin is provided. In a case where the decomposition temperature is equal to or lower than 320° C., it is possible to easily remove only the fine resin particles without causing thermal damage to the polyimide-based resin.

It is preferable that the fine particles have a high sphericity because such particles make it easy for the holes in the formed porous membrane to have a curved surface within the inner surface thereof. The particle size (average diameter) of the fine particles used is, for example, preferably 5 to 2,000 nm, and more preferably 10 to 600 nm.

In a case where the average diameter of the fine particles is within the above range, during a process of passing a liquid to be purified through the filter A according to the present embodiment that is obtained by removing fine particles, the liquid to be purified can uniformly contact the inner surface of the holes of the filter A, and the impurities in the liquid to be purified can be efficiently adsorbed onto the filter A.

The particle size distribution index (d25/d75) of the fine particles is preferably 1 to 6, more preferably 1.6 to 5, and even more preferably 2 to 4.

In a case where the particle size (average diameter) of the fine particles is equal to or smaller than 600 nm, d25/d75 is preferably 1 to 5, and more preferably 1.1 to 4. One kind of fine particles may be used singly, or two or more kinds of fine particles may be used in combination.

In a case where the particle size distribution index is equal to or higher than the lower limit of the above range, the porous membrane can be efficiently filled with the fine particles. Accordingly, it is easy to form a flow path in the filter A and to adjust the flow rate of the liquid to be purified passing through the filter A. In a case where the particle size distribution index is equal to or lower than the upper limit of the above range, holes having different sizes are easily formed. Accordingly, different convection currents occur while the liquid to be purified is passing through the filter A, and thus the adsorption rate of foreign substances is more easily improved.

d25 and d75 are values of particle size at 25% and 75% in the cumulative particle size distribution respectively. In the present specification, d25 is the larger particle size.

Furthermore, in a case where a double-layered unbaked composite membrane is formed in "Formation of unbaked composite membrane" which will be described later, fine particles (B1) used in a first varnish and fine particles (B2) used in a second varnish may be the same as or different from each other. The pore structure can be adjusted by controlling the particle size, shape, particle size distribution index, and the like of the fine particles B1 and the fine particles B2.

Specifically, in order to make the holes on the side contacting the base material denser, it is preferable that the fine particles (B1) have a particle size distribution index lower than or the same as that of the fine particles (B2).

Furthermore, it is preferable that the fine particles (B1) have a sphericity lower than or the same as that of the fine particles (B2).

In addition, it is preferable that the particle size (average diameter) of the fine particles (B1) is smaller than that of the fine particles (B2). Particularly, it is preferable to use particles having a particle size of 100 to 1,000 nm (more preferably 100 to 600 nm) as the fine particles (B1) and particles having a particle size of 500 to 2,000 nm (more preferably 700 to 2,000 nm) as the fine particles (B2). In a case where particles having a particle size smaller than that of the fine particles (B2) are used as the fine particles (B1), it is possible to increase the opening ratio of holes within the surface of the obtained polyimide-based resin porous membrane, to uniformize the diameter of the holes, and to enable the entire polyimide-based resin porous membrane to be harder than a porous membrane using only the fine particles (B1).

In the present specification, for the purpose of uniformly dispersing fine particles, in addition to the fine particles described above, a dispersant may be added to the varnish. In a case where the dispersant is further added, polyamic acid, polyimide, or polyamideimide and the fine particles can be more uniformly mixed together. Moreover, the fine particles can be uniformly distributed in the unbaked composite membrane. As a result, it is possible to provide dense openings within the surface of the finally obtained filter A according to the present embodiment, and to efficiently form communicating holes allowing the front and back surfaces of the porous membrane to communicate with each other such that gas permeability of the polyimide-based resin porous membrane is improved.

As the dispersant, known dispersants can be used without particular limitation. Examples of the dispersant include anionic surfactants such as a palm fatty acid salt, a sulfonated castor oil salt, a lauryl sulfate salt, a polyoxyalkylene allyl phenyl ether sulfate salt, alkylbenzene sulfonic acid, alkylbenzene sulfonate, alkyl diphenyl ether disulfonate, alkyl naphthalene sulfonate, a dialkylsulfosuccinate salt, isopropyl phosphate, a polyoxyethylene alkyl ether phosphate salt, and a polyoxyethylene allyl phenyl ether phosphate salt; cationic surfactants such as oleylamine acetate, laurylpyridinium chloride, cetylpyridinium chloride, lauryltrimethylammonium chloride, stearyltrimethylammonium chloride, behenyltrimethylammonium chloride, and didecyldimethylammonium chloride; amphoteric surfactants such as palm alkyldimethylamine oxide, fatty acid amidopropyldimethylamine oxide, alkylpolyaminoethyl glycine hydrochloride, an amidobetaine-type activator, an alanine-type activator, and lauryl iminodipropionic acid; other nonionic surfactants based on a polyoxyalkylene primary alkyl ether or a polyoxyalkylene secondary alkyl ether, such as polyoxyethylene octyl ether, polyoxyethylene decyl ether, polyoxyethylene lauryl ether, polyoxyethylene lauryl amine, polyoxyethylene oleyl amine, polyoxyethylene polystyryl phenyl ether, and polyoxyalkylene polystyryl phenyl ether and other polyoxyalkylene-based nonionic surfactants such as polyoxyethylene dilaurate, polyoxyethylene laurate, polyoxyethylated castor oil, polyoxyethylated hydrogenated castor oil, a sorbitan lauric acid ester, a polyoxyethylene sorbitan lauric acid ester, and fatty acid diethanolamide; fatty acid alkyl esters such as octyl stearate and trimethylolpropane tridecanoate; and polyether polyols such as polyoxyalkylene butyl ether, polyoxyalkylene oleyl ether, and trimethylolpropane tris(polyoxyalkylene) ether. One kind of each of the above dispersants can be used singly, or two or more kinds of the above dispersants can be used by being mixed together.

As the polyamic acid, those obtained by polymerizing any tetracarboxylic acid dianhydride and diamine and the like can be used without particular limitation.

As the tetracarboxylic acid dianhydride, known compounds can be used without particular limitation. As he tetracarboxylic acid dianhydride, particularly, an aromatic tetracarboxylic acid dianhydride, an aliphatic tetracarboxylic acid dianhydride, and the like are preferable.

Examples of the aromatic tetracarboxylic acid dianhydride include pyromellitic dianhydride, 1,1-bis(2,3-dicarboxyphenyl)ethane dianhydride, bis(2,3-dicarboxyphenyl) ethane dianhydride, bis(3,4-dicarboxyphenyl)methane dianhydride, 3,3',4,4'-biphenyltetracarboxylic dianhydride, 2,3,3',4'-biphenyltetracarboxylic dianhydride, 2,2,6,6-biphenyltetracarboxylic dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)-1,1,1,3,3,3-hexafluoropropane dianhydride, 2,2-bis(2,3-dicarboxypheny)-1,1,1,3,3,3-hexafluoropropane dianhydride, 3,3',4,4'-benzophenonetetracarboxylic dianhydride, bis(3,4-dicarboxyphenyl)ether dianhydride, bis(2,3-dicarboxyphenyl)ether dianhydride, 2,2',3,3'-benzophenonetetracarboxylic dianhydride, 4,4-(p-phenylenedioxy)diphthalic dianhydride, 4,4-(m-phenylenedioxy)diphthalic dianhydride, 1,2,5,6-naphthalenetetracarboxylic dianhydride, 1,4,5,8-naphthalenetetracarboxylic dianhydride 2,3,6,7-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, fluorene 9,9-bisphthalic anhydride, 3,3',4,4'-diphenylsulfonetetracarboxylic dianhydride, and the like.

Examples of the aliphatic tetracarboxylic dianhydride include ethylene tetracarboxylic dianhydride, butane tetracarboxylic dianhydride, cyclopentane tetracarboxylic dianhydride, cyclohexane tetracarboxylic dianhydride, 1,2,4,5-cyclohexanetetracarboxylic dianhydride, 1,2,3,4-cyclohexanetetracarboxylic dianhydride, and the like.

Among the above, in view of heat resistance of the obtained polyimide-based resin, aromatic tetracarboxylic dianhydride is preferable. Particularly, in view of price, ease of availability, and the like, 3,3',4,4'-biphenyltetracarboxylic dianhydride and pyromellitic dianhydride are preferable.

One kind of tetracarboxylic dianhydride may be used singly, or two or more kinds of tetracarboxylic dianhydrides may be used in combination.

As the diamine, known diamines can be used without particular limitation. The diamine may be an aromatic diamine or an aliphatic diamine. However, in view of heat resistance of the obtained polyimide resin, an aromatic diamine is preferable. One kind of diamine can be used singly, or two or more kinds of diamines can be used by being mixed together.

Examples of the aromatic diamine include diamino compounds bonded to one phenyl group or about 2 to 10 phenyl groups. Specifically, examples of the aromatic diamine include phenylenediamine or derivatives thereof, a diaminobiphenyl compound or derivatives thereof, a diaminodiphenyl compound or derivative thereof, a diaminotriphenyl compound or derivatives thereof, diaminonaphthalene or derivatives thereof, aminophenyl aminoindane or derivatives thereof, a diaminotetraphenyl compound or derivatives thereof, a diaminohexaphenyl compound or derivatives thereof, and Cardo-type fluorenediamine derivatives.

As the phenylenediamine, m-phenylenediamine and p-phenylenediamine are preferable. Examples of the phenylenediamine derivatives include diamines bonded to an alkyl group such as a methyl group or an ethyl group, for example, 2,4-diaminotoluene and 2,4-triphenylenediamine, and the like.

The diaminobiphenyl compound is a compound in which two aminophenyl groups are bonded to each other by phenyl groups. Examples of the diaminobiphenyl compound include 4,4'-diaminobiphenyl, 4,4'-diamino-2,2'-bis(trifluoromethyl)biphenyl, and the like.

The diaminodiphenyl compound is a compound in which two aminophenyl groups are bonded to each other by phenyl groups through other groups. Examples of those other groups include an ether bond, a sulfonyl bond, a thioether bond, a bond by an alkylene group or a derivative group thereof, an imino bond, an azo bond, a phosphine oxide bond, an amide bond, a ureylene bond, and the like. The alkylene group preferably has about 1 to 6 carbon atoms, and the derivative group thereof is a group obtained in a case where one or more hydrogen atoms in an alkylene group are substituted with a halogen atom or the like.

Examples of the diaminodiphenyl compound include 3,3'-diaminodiphenyl ether, 3,4'-diaminodiphenyl ether, 4,4'-diaminodiphenyl ether, 3,3'-diaminodiphenyl sulfone, 3,4'-diaminodiphenyl sulfone, 4,4'-diaminodiphenyl sulfone, 3,3'-diaminodiphenyl methane, 3,4'-diaminodiphenyl methane, 4,4'-diaminodiphenyl methane, 4,4'-diaminodiphenyl sulfide, 3,3'-diaminodiphenyl ketone, 3,4'-diaminodiphenyl ketone, 2,2-bis(p-aminophenyl)propane, 2,2'-bis(p-aminophenyl)hexafluoropropane, 4-methyl-2,4-bis(p-aminophenyl)-1-pentene, 4-methyl-2,4-bis(p-aminophenyl)-2-pentene, iminodianiline, 4-methyl-2,4-bis(p-aminophenyl) pentane, bis(p-aminophenyl)phosphine oxide, 4,4'-diaminoazobenzene, 4,4'-diaminodiphenylurea, 4,4'-diaminodiphenylamide, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, bis[4-(4-aminophenoxy)phenyl]sulfone, bis [4-(3-aminophenoxy)phenyl]sulfone 2,2-bis[4-(4-aminophenoxy)phenyl] propane, 2,2-bis[4-(4-aminophenoxy)phenyl] hexafluoropropane, and the like.

The diaminotriphenyl compound is a compound in which two aminophenyl groups and one phenylene group are bonded to each other through other groups. Examples of those other groups are the same as the examples of those other groups in the diaminodiphenyl compound.

Examples of the diaminotriphenyl compound include 1,3-bis(m-aminophenoxy)benzene, 1,3-bis(p-aminophenoxy)benzene, 1,4-bis(p-aminophenoxy) benzene, and the like.

Examples of the diaminonaphthalene include 1,5-diaminonaphthalene, 2,6-diaminonaphthalene, and the like.

Examples of the aminophenyl aminoindane include 5- or 6-amino-1-(p-aminophenyl)-1,3,3-trimethylindane, and the like.

Examples of the diaminotetraphenyl compound include 4,4'-bis(p-aminophenoxy)biphenyl, 2,2'-bis[p-(p'-aminophenoxy)phenyl]propane, 2,2'-bis[p-(p'-aminophenoxy)biphenyl]propane, 2,2'-bis[p-(m-aminophenoxy)phenyl]benzophenone, and the like.

Examples of the Cardo-type fluorenediamine derivative include 9,9-bisanilinefluorene, and the like.

The number of carbon atoms in the aliphatic diamine is preferably about 2 to 15 for example. Specifically, examples thereof include pentamethylene diamine, hexamethylene diamine, heptamethylene diamine, and the like.

The diamine may be a compound in which a hydrogen atom is substituted with at least one kind of substituent selected from the group consisting of a halogen atom, a methyl group, a methoxy group, a cyano group, and a phenyl group.

Among the above, phenylenediamine, a phenylenediamine derivative, and a diaminodiphenyl compound are preferable as the diamine. Particularly, in view of price, ease of availability, and the like, p-phenylenediamine, m-phenylenediamine, 2,4-diaminotoluene, and 4,4'-diaminodiphenyl ether are more preferable.

The method for manufacturing the polyamic acid is not particularly limited, and it is possible to use known methods such as a method of causing a reaction between any tetracarboxylic dianhydride and diamine in an organic solvent.

The reaction between the tetracarboxylic dianhydride and the diamine is generally performed in an organic solvent. The organic solvent used in this case is not particularly limited as long as it can dissolve the tetracarboxylic dianhydride and the diamine but does not react with the tetracarboxylic dianhydride and the diamine. One kind of organic solvent can be used singly, or two or more kinds of organic solvents can be used by being mixed together.

Examples of the organic solvent used for the reaction between the tetracarboxylic dianhydride and the diamine include a nitrogen-containing polar solvents such as N-methyl-2-pyrrolidone, N,N-dimethylacetamide, N,N-diethylacetamide, N,N-dimethylformamide, N,N-diethylformamide, N-methylcaprolactam, and N,N,N',N'-tetramethylurea; lactone-based polar solvents such as β-propiolactone, γ-butyrolactone, γ-valerolactone, δ-valerolactone, γ-caprolactone, and ε-caprolactone; dimethyl sulfoxide; acetonitrile; fatty acid esters such as ethyl lactate and butyl lactate; ethers such as diethylene glycol dimethyl ether, diethylene glycol diethyl ether, dioxane, tetrahydrofuran, methyl cellosolve acetate, and ethyl cellosolve acetate; phenolic solvents such as cresols, and the like.

In view of solubility of the generated polyamic acid, the nitrogen-containing polar solvents are preferably used as organic solvents among the above.

Furthermore, from the viewpoint of membrane forming properties, it is preferable to use a mixed solvent containing a lactone-based polar solvent. In this case, the content of the lactone-based polar solvent with respect to the total amount of the organic solvent (100% by mass) is preferably 1% to 20% by mass and more preferably 5% to 15% by mass.

As the organic solvent, one or more kinds of organic solvents selected from the group consisting of a nitrogen-containing polar solvent and a lactone-based polar solvent are preferably used, and a mixed solvent of a nitrogen-containing polar solvent and a lactone-based polar solvent is more preferably used.

The amount of the organic solvent used is not particularly limited, but is preferably set such that the content of the polyamic acid generated in the reaction solution obtained after the reaction becomes about 5% to 50% by mass.

The amount of each of the tetracarboxylic dianhydride and diamine used is not particularly limited. The amount of the diamine used with respect to 1 mol of the tetracarboxylic dianhydride is preferably 0.50 to 1.50 mol, more preferably 0.60 to 1.30 mol, and particularly preferably 0.70 to 1.20 mol.

Generally, the reaction (polymerization) temperature is preferably −10° C. to 120° C., and more preferably 5° C. to 30° C.

The reaction (polymerization) time varies with the composition of raw materials used, but is preferably 3 to 24 hours in general.

The intrinsic viscosity of the polyamic acid solution is not particularly limited, but is preferably 1,000 to 100,000 cP (centipoise) (1 to 100 Pa·s), and more preferably 5,000 to 70,000 cP (5 to 70 Pa·s).

The intrinsic viscosity of the polyamic acid solution can be measured with an E-type rotational viscometer under a temperature condition of 25° C.

The polyimide that can be used for manufacturing the filter A according to the present embodiment is not limited in terms of the structure or molecular weight as long as the polyimide can dissolve in the organic solvent used in the varnish, and known polyimides can be used.

The polyimide may have a condensable substituent such as a carboxy group on a side chain thereof or a substituent accelerating a crosslinking reaction or the like during baking.

In order to make polyimide soluble in the organic solvent used in the varnish, it is effective to use a monomer for introducing a flexible bending structure into the main chain. Examples of such a monomer include aliphatic diamines such as ethylenediamine, hexamethylenediamine, 1,4-diaminocyclohexane, 1,3-diaminocyclohexane, and 4,4'-diaminodicyclohexylmethane; aromatic diamines such as 2-methyl-1,4-phenylenediamine, o-tolidine, m-tolidine, 3,3'-dimethoxybenzidine, and 4,4'-diaminobenzanilide; polyoxyalkylene diamines such as polyoxyethylene diamine, polyoxypropylene diamine, and polyoxybutylene diamine; polysiloxane diamine; 2,3,3',4'-oxydiphthalic anhydride, 3,4,3',4'-oxydiphthalic anhydride, 2,2-bis(4-hydroxyphenyl)propanedibenzoate-3,3',4,4'-tetracarboxylic dianhydride, and the like.

It is also effective to use a monomer having a substituent that improves the solubility in such an organic solvent. Examples of the monomer having such a substituent include fluorinated diamines such as 2,2'-bis(trifluoromethyl)-4,4'-diaminobiphenyl and 2-trifluoromethyl-1,4-phenylenediamine.

Furthermore, in addition to the monomer having such a substituent, as long as the solubility does not deteriorate, the monomers exemplified above regarding the polyamic acid can be used together.

The method for manufacturing the polyimide is not particularly limited, and examples thereof include known methods such as a method of dissolving the polyamic acid in an organic solvent by chemical or thermal imidization.

Examples of the polyimide include aliphatic polyimide (all aliphatic polyimides), aromatic polyimide, and the like. Among these, aromatic polyimide is preferable.

The aromatic polyimide may be obtained by causing a thermal or chemical ring-closing reaction of a polyamic acid having a unit represented by the following General Formula (5) or obtained by dissolving polyimide having a unit represented by the following General Formula (6) in a solvent.

In the formulas, $R_{Ar}$ represents an aryl group, and $R'_{Ar}$ represents an arylene group.

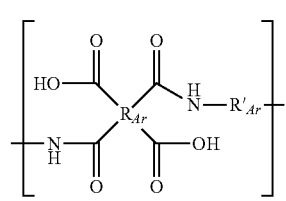

(5)

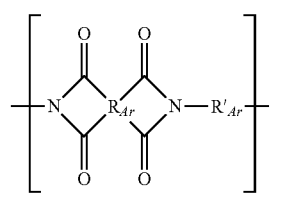

(6)

In the formulas, $R_{Ar}$ is not particularly limited as long as it is a cyclic conjugated system having $4n+2\pi$ electrons, and may be monocyclic or polycyclic. The number of carbon atoms in the aromatic ring is preferably 5 to 30, more preferably 5 to 20, even more preferably 6 to 15, and particularly preferably 6 to 12. Specific examples of the aromatic ring include aromatic hydrocarbon rings such as benzene, naphthalene, anthracene, and phenanthrene; aromatic heterocycles in which some of carbon atoms constituting the aromatic hydrocarbon ring are substituted with hetero atoms, and the like. Examples of the hetero atoms in the aromatic heterocycle include an oxygen atom, a sulfur atom, a nitrogen atom, and the like. Specific examples of the aromatic heterocycle include a pyridine ring, a thiophene ring, and the like. Among these, $R_{Ar}$ is preferably an aromatic hydrocarbon ring, more preferably benzene or naphthalene, and particularly preferably benzene.

Examples of $R'_{Ar}$ in the formulas include a group obtained by removing two hydrogen atoms from the aromatic ring in $R_{Ar}$. Among these, $R'_{Ar}$ is preferably a group obtained by removing two hydrogen atoms from the aromatic hydrocarbon ring, more preferably a group obtained by removing two hydrogen atoms from benzene or naphthalene, and particularly preferably a phenylene group obtained by removing two hydrogen atoms from benzene.

The aryl group represented by $R_{Ar}$ and the arylene group represented by $R'_{Ar}$ may each have a substituent.

The polyamideimide is not limited in terms of the structure or molecular weight as long as the polyamideimide can dissolve in the organic solvent used in the varnish, and known polyamideimides can be used.

The polyamideimide may have a condensable substituent such as a carboxy group on a side chain thereof or a substituent accelerating a crosslinking reaction or the like during baking.

As the polyamideimide, it is possible to use polyamideimide obtained by causing a reaction between any trimellitic anhydride and diisocyanate, polyamideimide obtained by imidizing a precursor polymer obtained by causing a reaction between a reactive derivative of any trimellitic anhydride and diamine, and the like.

Examples of the reactive derivative of any trimellitic anhydride include trimellitic anhydride halides such as trimellitic anhydride chloride, trimellitic anhydride esters, and the like.

Examples of any diisocyanate described above include m-phenylene diisocyanate, p-phenylene diisocyanate, o-tolidine diisocyanate, p-phenylene diisocyanate, m-phenylene diisocyanate, 4,4'-oxybis(phenylisocyanate), diphenylmethane 4,4'-diisocyanate, bis[4-(4-isocyanatophenoxy)phenyl] sulfone, 2,2'-bis[4-(4-isocyanatophenoxy)phenyl]propane, 2,4-tolylene diisocyanate, 2,6-tolylene diisocyanate 4,4'-diphenylmethane diisocyanate, 3,3'-dimethyldiphenyl-4,4'-diisocyanate, 3,3'-diethyldiphenyl-4,4'-diisocyanate, isophorone diisocyanate, hexamethylene diisocyanate, 4,4'-dicyclohexylmethane diisocyanate, m-xylene diisocyanate, p-xylene diisocyanate, naphthalene diisocyanate, and the like.

Examples of any diamine described above are the same as the examples of the diamine described above regarding the polyamic acid.

The organic solvent that can be used for preparing the varnish is not particularly limited as long as it can dissolve the polyamic acid and/or the polyimide-based resin and does not dissolve the fine particles. Examples of the organic solvent are the same as the examples of the organic solvent used in the reaction between tetracarboxylic dianhydride and diamine.

One kind of organic solvent can be used singly, or two or more kinds of organic solvents can be used by being mixed together.

The content of the organic solvent in the varnish with respect to the total mass of the varnish is preferably 50% to 95% by mass, and more preferably 60% to 85% by mass. The solid contents in the varnish are preferably 5% to 50% by mass, and more preferably 15% to 40% by mass.

In a case where the unbaked composite membrane is formed as a double-layered membrane, first, a base material such as a glass substrate is directly coated with the first varnish described above and dried under the condition of 0° C. to 120° C. (preferably 0° C. to 90° C.) at normal pressure or in a vacuum and more preferably under the condition of 10° C. to 100° C. (more preferably 10° C. to 90° C.) at normal pressure, thereby forming a first unbaked composite membrane having a film thickness of 1 to 5 m.

Then, the first unbaked composite membrane is coated with the second varnish described above and dried in the same manner under the condition of 0° C. to 80° C. (preferably 0° C. to 50° C.) and more preferably under the condition of 10° C. to 80° C. (more preferably 10° C. to 30° C.) at normal pressure, thereby forming a second unbaked composite membrane having a film thickness of 5 to 50 m. In this way, a double-layered unbaked composite membrane can be formed.

By performing a heating treatment (baking) on the formed unbaked composite membrane, a composite membrane consisting of a polyimide-based resin and fine particles (polyimide-based resin-fine particle composite membrane) is formed.

In a case where the varnish includes polyamic acid, it is preferable that the imidization is completed by baking the unbaked composite membrane in this step.

The temperature of the heating treatment (baking temperature) varies with the structure of polyamic acid, polyimide, or polyamideimide contained in the unbaked composite membrane or varies depending on whether or not a condensing agent is used. However, the baking temperature is preferably 120° C. to 400° C., and more preferably 150° C. to 375° C.

In performing baking, the baking operation does not necessarily need to be clearly separated from drying in the preceding step, and a stepwise drying-thermal imidization method can also be used. Specifically, in a case where baking is performed at 375° C., it is possible to use a method of heating the membrane from room temperature to 375° C. for 3 hours and then keeping the membrane at 375° C. for 20 minutes. Furthermore, it is also possible to use a method of heating the membrane in stages from room temperature to 375° C. by 50° C. (keeping the membrane for 20 minutes at each stage) and then keeping the membrane at 375° C. for 20 minutes at the final stage. A method may also be adopted in which the end of the unbaked composite membrane is fixed to a mold made of SUS so as to prevent deformation.

The thickness of the polyimide-based resin-fine particle composite membrane obtained after the heating treatment (baking) is, for example, preferably equal to or greater than 1 m, more preferably 5 to 500 m, and even more preferably 8 to 100 m.

The thickness of the polyimide-based resin-fine particle composite membrane is determined by measuring thicknesses at a plurality of sites by using a micrometer and calculating the average thereof.

Note that the present step is an optional step. Particularly, in a case where polyimide or polyamideimide is used in the varnish, the present step may not be performed.

After the unbaked composite membrane is baked, the fine particles are removed from the polyimide-based resin-fine particle composite membrane. In this way, a polyimide-based resin porous membrane is manufactured.

For example, in a case where silica is used as the fine particles, the polyimide-based resin-fine particle composite membrane is brought into contact with low-concentration aqueous hydrogen fluoride (HF) so as to dissolve and remove the silica, thereby obtaining a porous membrane. In a case where the fine particles are fine resin particles, the membrane is heated to a temperature, which is equal to or higher than the thermal decomposition temperature of the fine resin particles and lower than the thermal decomposition temperature of the polyimide-based resin, so as to dissolve and remove the fine resin particles, thereby obtaining a porous membrane.

The etching step can be performed by a chemical etching method, a physical removal method, or a method as a combination of these.

As the chemical etching method, conventionally known methods can be adopted.

The chemical etching method is not particularly limited, and examples thereof include a treatment with an etching solution such as an inorganic alkaline solution or an organic alkaline solution. Particularly, a treatment with an inorganic alkaline solution is preferable.

Examples of the inorganic alkaline solution include a hydrazine solution containing hydrazine hydrate and ethylene diamine; a solution of an alkali metal hydroxide such as potassium hydroxide, sodium hydroxide, sodium carbonate, sodium silicate, and sodium metasilicate; an ammonia solution; an etching solution containing alkali hydroxide, hydrazine, and 1,3-dimethyl-2-imidazolidinone as main components, and the like.

Examples of the organic alkaline solution include alkaline etching solutions like primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and cyclic amines such as pyrrole and piperidine. The alkali concentration in the etching solution is 0.01% to 20% by mass for example.

As a solvent of each of the etching solutions, pure water or alcohols can be appropriately selected. Furthermore, a solvent to which an appropriate amount of surfactant is added can also be used.

As the physical removal method, for example, it is possible to use a dry etching method using plasma (oxygen, argon, or the like), corona discharge, and the like.

The aforementioned chemical etching method or physical removal method can be used before or after the fine particle removing step described above.

Particularly, it is preferable to use the chemical etching method or physical removal method after the fine particle removing step, because then the communicating holes are more easily formed in the polyimide-based resin porous membrane, and foreign substances are removed better.

In a case where the chemical etching method is performed in the etching step, in order to remove an excess of etching solution, a step of washing the polyimide-based resin porous membrane may be performed after the present step.

The washing after the chemical etching may be performed using only water. However, it is preferable to perform the washing by using acid and water in combination.

In addition, after the etching step, in order to improve wettability of the organic solvent with respect to the surface of the polyimide-based resin porous membrane and to remove residual organic substances, a heating treatment (rebaking) may be performed on the polyimide-based resin porous membrane. The heating conditions are the same as the conditions for baking the unbaked composite membrane.

The pore size of the filter A according to the present embodiment is not particularly limited. Generally, the pore size of the filter A is preferably 0.1 to 100 nm, more preferably 0.1 to 50 nm, and even more preferably 0.1 to 20 nm.

In the present specification, "pore size" means a pore size determined by the bubble point of isopropanol (IPA) or HFE-7200 ("NOVEC 7200", manufactured by 3M, hydrofluoroether, $C_4F_9OC_2H_5$).

<Filter BD>

The filter BD is a filter different from the filter A in terms of pore size (the filter BD has a pore size smaller than that of the filter A), and is arranged in series with the filter A on the downstream side of the filter A on the flow path. "Downstream side" refers to the side of the outlet portion on the flow path. In the present specification, "filters different from each other" means that the filters are different from each other in terms of at least one kind of item selected from the group consisting of pore size, material, and pore structure. Particularly, in view of obtaining a filtering device having further improved effects of the present invention, the filter BD is preferably different from the filter A at least in terms of pore size, and more preferably different from the filter A in terms of pore size and material.

The pore size of the filter BD according to the present embodiment is not particularly limited as long as it is smaller than the pore size of the filter A, and a filter having a pore size generally used for filtering a liquid to be purified can be used. Particularly, the pore size of the filter is preferably equal to or smaller than 200 nm, more preferably equal to or smaller than 20 nm, still more preferably equal to or smaller than 10 nm, particularly preferably equal to or smaller than 5 nm, and most preferably equal to or smaller than 3 nm. The lower limit thereof is not particularly limited, but is generally preferably equal to or greater than 1 nm from the viewpoint of productivity.

The inventors of the present invention have found that in a case where a liquid to be purified is filtered using the filter A, because the liquid to be purified flows through the filter A, sometimes fine particles derived from the material of the filter A are generated and mixed into the liquid to be purified. The filtering device according to the present embodiment has the filter BD in the downstream of the filter A on the flow path. Therefore, the fine particles resulting from the filter A can be separated from the liquid to be purified by filtration, and a chemical liquid having further improved defect inhibition performance is easily obtained.

Although the filtering device in FIG. 1 has one filter BD, the filtering device according to the present embodiment may have a plurality of filters BD. In this case, the relationship between the pore sizes of the plurality of filters BD is not particularly limited. However, in view of easily obtaining a chemical liquid having further improved defect inhibition performance, it is preferable that a filter BD disposed on the downmost stream side on the flow path has the smallest pore size.

The material of the filter BD is not particularly limited, and may be the same as or different from the material of the filter A. Particularly, in view of obtaining a filtering device having further improved effects of the present invention, it is preferable that the material of the filter BD is different from that of the filter A.

Specifically, in a case where the material is a resin, the filter BD may contain, as a material component, polyamide such as 6-nylon and 6,6-nylon; polyolefin such as polyethylene and polypropylene; polystyrene; polyimide; polyamideimide; poly(meth)acrylate; polyfluorocarbons such as polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate, and the like. Particularly, in view of obtaining further improved solvent resistance and obtaining a chemical liquid having further improved defect inhibition performance, the filter BD preferably contains at least one kind of resin selected from the group consisting of nylon (particularly preferably 6,6-nylon), polyolefin (particularly preferably polyethylene), poly(meth)acrylate, and polyfluorocarbon (particularly preferably polytetrafluoroethylene (PTFE) and perfluoroalkoxyalkane (PFA)) as a material component, and more preferably contains at least one kind of resin selected from the group consisting of polyethylene, nylon, and polytetrafluoroethylene as a material component. One kind of each of these polymers can be used singly, or two or more kinds of these polymers can be used in combination.

In addition to the resin, diatomite, glass, and the like may also be used.

Furthermore, the filter may be subjected to surface treatment. As the surface treatment method, known methods can be used without particular limitation. Examples of the surface treatment method include a chemical modification treatment, a plasma treatment, a hydrophobization treatment, coating, a gas treatment, sintering, and the like.

The plasma treatment is preferable because the surface of the filter is hydrophilized by this treatment. Although the water contact angle on the surface of each filter hydrophilized by the plasma treatment is not particularly limited, a static contact angle measured at 25° C. by using a contact angle meter is preferably equal to or smaller than 60° more preferably equal to or smaller than 50°, and even more preferably equal to or smaller than 30°.

As the chemical modification treatment, a method of introducing ion exchange groups into the base material is preferable.

That is, the filter is preferably obtained by using various materials exemplified above as a base material and introducing ion exchange groups into the base material. Typically, it is preferable that the filter includes a layer, which includes a base material having ion exchange groups, on a surface of the base material described above. Although there is no particular limitation, as the surface-treated base material, a base material obtained by introducing ion exchange groups into the aforementioned polymer is preferable because the manufacturing of such a base material is easier.

Examples of the ion exchange groups include cation exchange groups such as a sulfonic acid group, a carboxy group, and a phosphoric acid group and anion exchange groups such as a quaternary ammonium group. The method for introducing ion exchange groups into the polymer is not particularly limited, and examples thereof include a method of reacting a compound, which has ion exchange groups and polymerizable groups, with the polymer such that the compound is grafted on the polymer typically.

The method for introducing the ion exchange groups is not particularly limited. In a case where the aforementioned resin fiber is irradiated with ionizing radiation (such as α-rays, β-rays, γ-rays, X-rays, or electron beams), active portions (radicals) are generated in the resin. The irradiated resin is immersed in a monomer-containing solution such that the monomer is graft-polymerize with the base material. As a result, a product is generated in which the monomer is bonded to polyolefin fiber as a side chain by graft polymerization. By bringing the resin having the generated polymer as a side chain into contact with a compound having an anion exchange group or a cation exchange group so as to cause a reaction, an end product is obtained in which the ion exchange group is introduced into the polymer of the graft-polymerized side chain.

Furthermore, the filter may be constituted with woven cloth or nonwoven cloth, in which ion exchange groups are formed by a radiation graft polymerization method, combined with glass wool, woven cloth, or nonwoven filter material that is conventionally used.

Particularly, in view of obtaining a filtering device having further improved effects of the present invention, the filter BD preferably contains at least one kind of resin selected from the group consisting of polyolefin, polyamide, polyfluorocarbon, polystyrene, and polyethersulfone as a material component, and more preferably consists of at least one kind of material component selected from the group consisting of polyolefin, polyamide, polyfluorocarbon, polystyrene, and polyethersulfone.

Examples of the polyolefin include polyethylene, polypropylene, and the like. Among these, ultra-high-molecular-weight polyethylene is preferable. Examples of the polyamide include 6-nylon, 6,6-nylon, and the like. Examples of the polyfluorocarbon include polytetrafluoroethylene, perfluoroalkoxyalkane, a perfluoroethylene propene copolymer, an ethylene-tetrafluoroethylene copolymer, an ethylene-chlorotrifluoroethylene copolymer, polychlorotrifluoroethylene, polyvinylidene fluoride, polyvinyl fluoride, and the like. Among these, at least one kind of compound selected from the group consisting of polyethylene and nylon is preferable, and in another embodiment, polytetrafluoroethylene is preferable.

Furthermore, it is also preferable that the filter BD contains a second resin having a hydrophilic group as a material component. The hydrophilic group is not particularly limited, and examples thereof include a hydroxyl group, an ether group, an oxyalkylene group, a carboxylic acid group, an ester group, a carbonic acid ester group, a thiol group, a thioether group, a phosphoric acid group, and a phosphoric acid ester group, an amide group, an imide group, a group obtained by combining these, and the like. Among these, a hydroxyl group, an ether group, an oxyalkylene group, an ester group, a carbonic acid ester group, a thiol group, and a thioether group are preferable.

The second resin is not particularly limited, and examples thereof include polyolefin, polyamide, polyimide, polyether, novolac, polystyrene, a cycloolefin polymer, polylactic acid, and the like. Among these, polyolefin, polyimide, polystyrene, and a cycloolefin polymer are preferable.

The pore structure of the filter BD is not particularly limited, and may be appropriately selected according to the components of the liquid to be purified. In the present specification, the pore structure of the filter BD means a pore size distribution, a positional distribution of pores in the filter, a pore shape, and the like. Typically, the pore structure can be controlled by the manufacturing method of the filter.

For example, in a case where powder of a resin or the like is sintered to form a membrane, a porous membrane is obtained. Furthermore, in a case where a methods such as electrospinning, electroblowing, and melt blowing are used to form a membrane, a fiber membrane is obtained. These have different pore structures.

"Porous membrane" means a membrane which retains components in a liquid to be purified, such as gel, particles, colloids, cells, and polyoligomers, but allows the components substantially smaller than the pores of the membrane to pass through the membrane. The retention of components in the liquid to be purified by the porous membrane depends on operating conditions, for example, the surface velocity, the use of a surfactant, the pH, and a combination of these in some cases. Furthermore, the retention of components can depend on the pore size and structure of the porous membrane, and the size and structure of particles supposed to be removed (such as whether the particles are hard particles or gel).

An ultra-high-molecular-weight polyethylene (UPE) filter is typically a sieving membrane. A sieving membrane means a membrane that traps particles mainly through a sieving retention mechanism or a membrane that is optimized for trapping particles through a sieving retention mechanism.

Typical examples of the sieving membrane include, but are not limited to, a polytetrafluoroethylene (PTFE) membrane and a UPE membrane.

"Sieving retention mechanism" refers to the retention caused in a case where the particles to be removed are larger than the size of micropores of the porous membrane. Sieving retentivity can be improved by forming a filter cake (aggregate of particles to be removed on the surface of the membrane). The filter cake effectively functions as a secondary filter.

The pore structure of the porous membrane (for example, a porous membrane including UPE, PTFE, and the like) is not particularly limited. The pores have, for example, a lace shape, a string shape, a node shape, and the like.

The size distribution of pores in the porous membrane and the positional distribution of pores size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is also called "asymmetric porous membrane"). In the asymmetric porous membrane, the size of the holes changes in the membrane. Typically, the pore size increases toward the other surface of the membrane from one surface of the membrane. In this case, the surface containing pores having a large pore size is called "open side", and the surface containing pores having a small pore size is also called "tight side".

Examples of the asymmetric porous membrane include a membrane in which the pore size is minimized at a position in the thickness direction of the membrane (this is also called "hourglass shape").

In a case where the asymmetric porous membrane is used such that large holes are on the primary side (upstream side of the flow path), in other words, in a case where the primary side is used as the open side, a pre-filtration effect can be exerted.

The porous membrane layer may include a thermoplastic polymer such as polyethersulfone (PESU), perfluoroalkoxyalkane (PFA, a copolymer of tetrafluoroethylene and perfluoroalkoxyalkane), polyamide, or a polyolefin, or may include polytetrafluoroethylene and the like.

Particularly, it is preferable that the porous membrane contains ultra-high-molecular-weight polyethylene as a material component. The ultra-high-molecular-weight polyethylene means thermoplastic polyethylene having a very long chain. The molecular weight thereof is equal to or greater than 1,000,000. Typically, the molecular weight thereof is preferably 2,000,000 to 6,000,000.

For example, in a case where the liquid to be purified contains, as impurities, particles containing an organic compound, such particles are negatively charged in many cases. For removing such particles, a filter made of polyamide functions as a non-sieving membrane. Typical non-sieving membranes include, but are not limited to, nylon membranes such as a nylon-6 membrane and a nylon-6,6 membrane.

"Non-sieving" retention mechanism used in the present specification refers to retention resulting from the mechanism such as blocking, diffusion, and adsorption irrelevant to the pressure reduction of the filter or the pore size of the filter.

The non-sieving retention includes a retention mechanism such as blocking, diffusion, and adsorption for removing particles supposed to be removed from the liquid to be purified irrespective of the pressure reduction of the filter or the pore size of the filter. The adsorption of particles onto the filter surface can be mediated, for example, by the intermolecular van der Waals force and electrostatic force. In a case where the particles moving in the non-sieving membrane layer having a serpiginous path cannot sufficiently rapidly change direction so as not to contact the non-sieving membrane, a blocking effect is exerted. The transport of particles by diffusion is mainly caused by the random motion or the Brownian motion of small particles that results in a certain probability that the particles may collide with the filter medium. In a case where there is no repulsive force between the particles and the filter, the non-sieving retention mechanism can be activated.

The material of the fiber membrane is not particularly limited as long as it is a polymer capable of forming the fiber membrane. Examples of the polymer include polyamide and the like. Examples of the polyamide include nylon 6, nylon 6,6, and the like. The polymer forming the fiber membrane may be poly(ethersulfone). In a case where the fiber membrane is on the primary side of the porous membrane, it is preferable that the surface energy of the fiber membrane is higher than the surface energy of the polymer which is the material of the porous membrane on a secondary side (downstream side of the flow path). For example, in some cases, nylon as a material of the fiber membrane and polyethylene (UPE) as the porous membrane are combined.

As the method for manufacturing the fiber membrane, known methods can be used without particular limitation. Examples of the method for manufacturing the fiber membrane include electrospinning, electroblowing, melt blowing, and the like.

Second Embodiment

Figure 2:
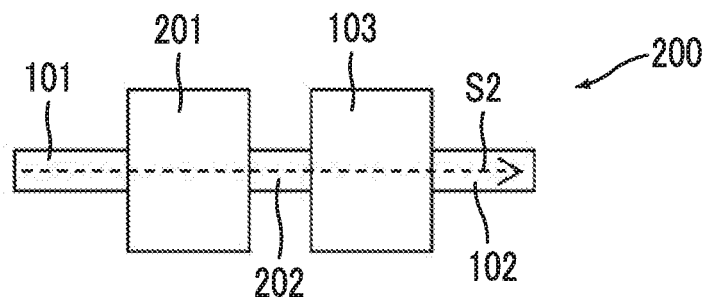
FIG. 2 is a schematic view illustrating a filtering device according to a second embodiment of the present invention.

FIG. 2 is a schematic view illustrating a filtering device according to a second embodiment of the present invention.

A filtering device 200 is a filtering device in which a filter 103 as a filter A and a filter 201 different from the filter 103 are arranged in series through a piping 202 between an inlet portion 101 and an outlet portion 102.

The inlet portion 101, the filter 201, the piping 202, the filter 103, and the outlet portion 102 are constituted such that a liquid to be purified can flow in the interior of each of these members. These members are connected to one another and form a flow path S2 (path through which the liquid to be purified flows).

In the filtering device 200, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

<Filter BU>

The filter BU is a filter different from the filter A at least in terms of pore size (the filter BU has a pore size larger than that of the filter A), and is arranged in series with the filter A on the upstream side of the filter A on the flow path. In view of obtaining a filtering device having further improved effects of the present invention, the filter BU is preferably different from the filter A in terms of pore size and material. "Upstream side" refers to the side of the inlet portion on the flow path.

The pore size of the filter BU is not particularly limited as long as the pore size of the filter BU is larger than that of the filter A. As the filter BU, it is possible to use a filter having a pore size generally used for filtering a liquid to be purified. Particularly, the pore size of the filter is preferably equal to or smaller than 200 nm and equal to or greater than 20 nm.

According to the examination of the inventors of the present invention, it has been found that in a case where a filtering device is used in which the filter BU having a pore size equal to or greater than 20 nm is disposed on the upstream side of the filter A on the flow path S2, it is more difficult for the filter A to be clogged, and the pot life of the filter A can be further extended. As a result, a filtering device capable of stably providing a chemical liquid having further improved defect inhibition performance can be obtained.

Although the filtering device in FIG. 2 has one filter BU, the filtering device according to the present embodiment may have a plurality of filters BU. In this case, the relationship between the pore sizes of the plurality of filters BU is not particularly limited. However, in view of easily obtaining a chemical liquid having further improved defect inhibition performance, it is preferable that a filter BU disposed in the uppermost stream on the flow path has the largest pore size. In a case where the filter BU having the largest pore size is positioned as described above, the pot life of the filters (including the filter A) disposed in the downstream of the filter BU in the uppermost stream can be further extended, and as a result, a filtering device capable of stably providing a chemical liquid having further improved defect inhibition performance is obtained.

The filter BU is not particularly limited. However, in view of obtaining a filtering device having further improved effects of the present invention, it is preferable that the filter BU contains a material component capable of removing ions. In other words, the filter BU is preferably an ion removing filter containing, for example, a resin having an ion exchange group. In view of obtaining a filtering device having further improved effects of the present invention, the ion exchange group is preferably at least one kind of group selected from the group consisting of an acid group (cation exchange group) and a base group (anion exchange group).

Examples of the ion exchange groups include cation exchange groups (acid groups) such as a sulfonic acid group, a carboxy group, and a phosphoric acid group and anion exchange groups (base groups) such as a quaternary ammonium group. The method for introducing ion exchange groups into the polymer is not particularly limited, and examples thereof include a method of reacting a compound, which has ion exchange groups and polymerizable groups, with the polymer such that the compound is grafted on the polymer typically, a method of mixing together polymers having different functional groups, and the like.

It is more preferable that the filter BU contains a material component which includes a base material such as polyfluorocarbon or polyolefin and an ion exchange group introduced into the base material.

Modification Example of Filtering Device According to Second Embodiment

Figure 3:
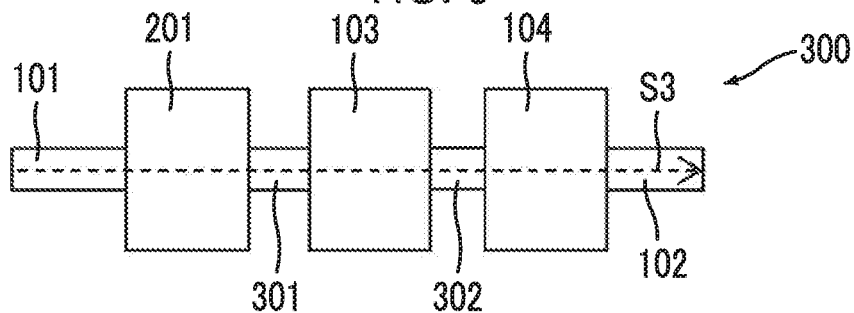
FIG. 3 is a schematic view illustrating a modification example of the filtering device according to the second embodiment of the present invention.

FIG. 3 is a schematic view of a filtering device illustrating a modification example of a filtering device according to a second embodiment of the present invention. A filtering device 300 includes a filter 103 as a filter A, a filter 201 as a filter BU, and a filter 104 as a filter BD between an inlet portion 101 and an outlet portion 102, in which the filter 201, the filter 103, and the filter 104 are arranged in series through a piping 301 and a piping 302.

In the filtering device 300, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The inlet portion 101, the filter 201, the piping 301, the filter 103, the piping 302, and the filter 104 are constituted such that a liquid to be purified can flow in the interior of each of these members. These members are connected to one another and form a flow path S3 (path through which the liquid to be purified flows). The constitutions of the piping and each filter are as described above.

The filtering device 300 has the filter BU on the upstream side of the filter A on the flow path. Therefore, the pot life of the filter A is further extended. Furthermore, the filtering device 300 has the filter BD on the downstream side of the filter A on the flow path. Therefore, the fine particles mixed into the liquid to be purified due to the filter A can be efficiently removed, and as a result, a chemical liquid having further improved defect inhibition performance can be easily obtained.

Third Embodiment

Figure 4:
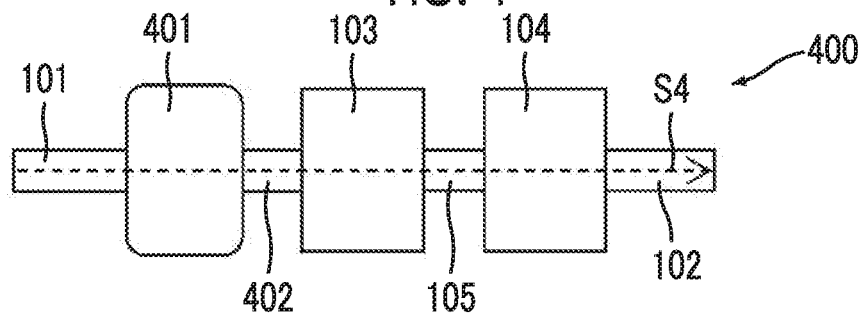
FIG. 4 is a schematic view illustrating a filtering device according to a third embodiment of the present invention.

FIG. 4 is a schematic view illustrating a filtering device according to a third embodiment of the present invention.

A filtering device 400 further includes a tank 401 disposed in series with a filter A on the upstream side of the filter 103 (filter A) on a flow path S4 between the inlet portion 101 and the outlet portion 102. The tank 401, the filter 103 (filter A), and the filter 104 (filter BD) are arranged in series through a piping 402 and the piping 105. The tank 401 constitutes the flow path S4 together with the filters, pipings, and the like described above.

In the filtering device 400, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device according to the present embodiment has a tank on the upstream side of the filter 103. Therefore, the liquid to be purified that will flow through the filter 103 can be retained in the tank and can be homogenized. As a result, a chemical liquid having further improved defect inhibition performance is obtained. Particularly, in a case where circulation filtration, which will be described later, is performed, and the liquid to be purified is returned to the upstream of the filter 103 in the flow path S4 from the downstream of the filter 103 (filter A) in the flow path S4, the tank 401 can be used to receive the returned liquid to be purified. In a case where the tank 401 is used as described above, the returned liquid to be purified can be retained in the tank, homogenized, and passed again through the filter 103. Therefore, a chemical liquid having further improved defect inhibition performance is obtained.

The material of the tank 401 is not particularly limited, and the same material as the material of the housing described above can be used. It is preferable that at least a portion of the liquid contact portion of the tank 401 (preferably 90% or more of the surface area of the liquid contact portion, and more preferably 99% or more of the surface area of the liquid contact portion) consists of the anticorrosive material which will be described later.

Modification Example of Filtering Device According to Third Embodiment

Figure 5:
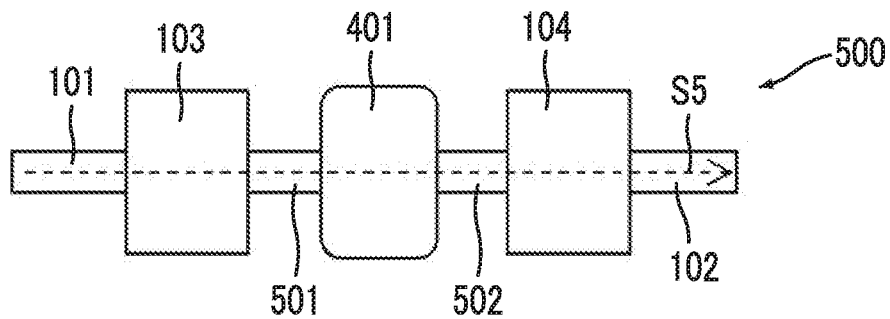
FIG. 5 is a schematic view illustrating a modification example of the filtering device according to the third embodiment of the present invention.

FIG. 5 is a schematic view illustrating a modification example of the filtering device according to the third embodiment of the present invention.

A filtering device 500 further includes a tank 401 arranged in series with a filter A on the downstream side of the filter 103 (filter A) on a flow path S5 between the inlet portion 101 and the outlet portion 102. The filter 103 (filter A), the tank 401, and the filter 104 (filter BD) are arranged in series through a piping 501 and the piping 502. The tank 401 constitutes a flow path S5 together with the filters, pipings, and the like described above.

In the filtering device 500, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device according to the present embodiment has a tank on the downstream side of the filter A. Therefore, the liquid to be purified filtered through the filter A can be retained in the tank. Particularly, in a case where circulation filtration, which will be described later, is performed, and the liquid to be purified is returned to the upstream side of the filter 103 in the flow path S5 from the downstream side of the filter 103 (filter A) in the flow path S5, the tank 401 can be used to retain the returned liquid to be purified. In a case where the tank 401 is used as described above, the returned liquid to be purified can be retained in the tank, homogenized, and passed again through the filter 103. Therefore, a chemical liquid having further improved defect inhibition performance is obtained.

In the filtering device 500 according to the present embodiment, the tank 401 is disposed on the upstream side of the filter 104 (filter BD) on the flow path S5. However, in the filtering device according to the present embodiment, the tank 401 may be disposed on the downstream side of the filter 104 on the flow path S5.

As described above, in a case where the filter BD is used, even though fine particles are mixed into the liquid to be purified because the liquid to be purified passes through the filter A, it is possible to efficiently remove the fine particles.

As described above, the tank 401 can be used to retain the returned liquid to be purified during circulation filtration. In other words, the tank 401 can be a starting point of the circulation filtration. In this case, either a filter on the upstream side of the tank 401 (filter 103 in the filtering device 500) or a filter on the downstream side of the tank 401 (filter 104 in the filtering device 500) on the flow path S5 is frequently used as a filter for circulation filtration. The starting point of the circulation filtration includes a starting point in a case where the tank constitutes a return flow path or a starting point in a case where a piping on the downstream side of the tank constitutes a return flow path.

In the filtering device 500, the tank 401 is disposed on the upstream side of the filter 104 (filter BD). In a case where the tank 401 is disposed on the upstream side of the filter 104 (filter BD), and circulation filtration is repeated in a portion to the tank 401 in the flow path S5, it is possible to adopt a flow in which the fine particles derived from the filter A are finally removed using the filter 104 from the liquid to be purified thoroughly filtered through the filter A. As a result, the pot life of the filter BD is further extended, and the manufacturing efficiency of the chemical liquid is further improved.

The filtering device according to the present embodiment may be in the form of a filtering device in which the filter BU and the filter A are arranged in series in this order (for example, the second embodiment), and in the form of a filtering device in which the filter BU, the filter A, and the filter BD are arranged in series in this order (for example, a modification example of the second embodiment), and the tank 401 is further provided on the upstream side of the filter A.

Fourth Embodiment

Figure 6:
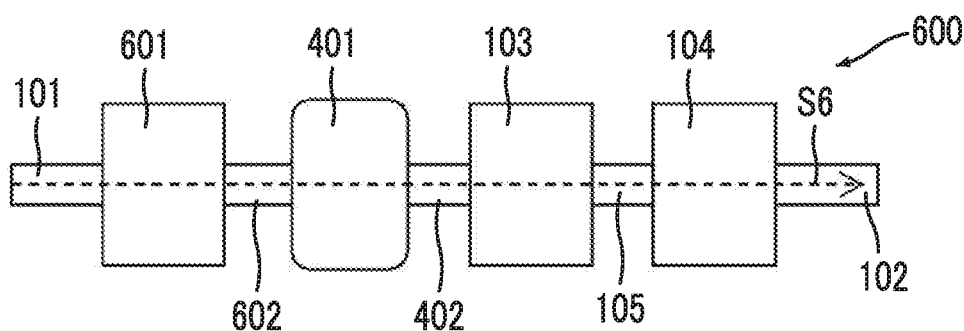
FIG. 6 is a schematic view illustrating a filtering device according to a fourth embodiment of the present invention.

FIG. 6 is a schematic view illustrating a filtering device according to a fourth embodiment of the present invention.

A filtering device 600 includes a filter 601 as a filter C, a tank 401, a filter 103 as a filter A, and a filter 104 as a filter BD that are connected in series through a piping 602, a piping 402, and a piping 105 between an inlet portion 101 and an outlet portion 102.

In the filtering device 600, the inlet portion 101, the filter 601, the piping 602, the tank 401, the piping 402, the filter 103, the piping 105, the filter 104, and the outlet portion 102 form a flow path S6.

In the filtering device 600, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filter 601 (filter C) is a filter which is disposed on the upstream side of the tank 401 in the flow path S6 and has a pore size equal to or greater than 20 nm. The filtering device according to the present embodiment includes a filter having a predetermined pore size that is disposed on the upstream side of the tank 401 in the flow path S6. Therefore, impurities and the like contained in the liquid to be purified that has flowed into the filtering device from the inlet portion 101 can be removed in advance by using the filter 601. As a result, it is possible to further reduce the amount of impurities mixed into the flow path after the piping 602, and thus the pot life of the subsequent filter A and filter BD can be further extended. Consequently, with the filtering device described above, it is possible to stably manufacture a chemical liquid having further improved defect inhibition performance.

The form of the filter C is not particularly limited, and the filter C may be the same filter as the filter A described above or a different filter (filter B). Particularly, in view of easily obtaining a chemical liquid having further improved defect inhibition performance, the filter C is preferably the filter B. Especially, as the material and pore structure of the filter C, those described as the material and pore structure of the filter BD are preferable. The pore size of the filter C may be equal to or greater than 20 nm, and is preferably equal to or greater than 50 nm. The upper limit thereof is not particularly limited, but is preferably equal to or smaller than 250 nm in general.

The filtering device according to the present embodiment may be in the form of a filtering device in which the filter A and the filter BD are arranged in series in this order on the flow path (for example, the second embodiment), and in the form of a filtering device in which the filter BU, the filter A, and the filter BD are arranged in series in this order on the flow path (for example, a modification example of the second embodiment), a tank is further provided on the downstream side of the filter A, and the filter C is provided on the upstream side of the tank.

Fifth Embodiment

Figure 7:
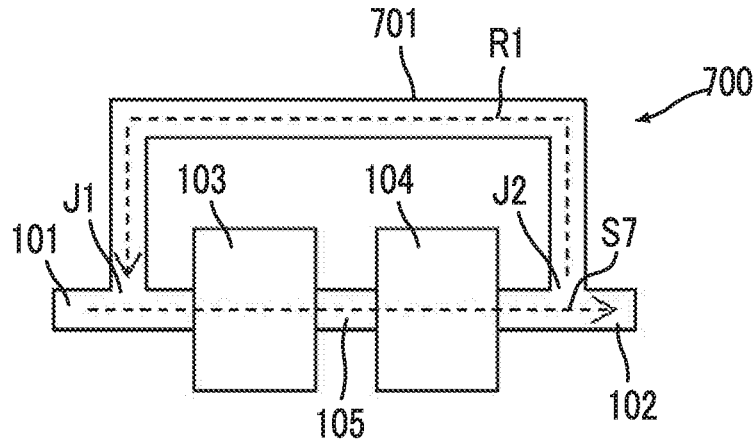
FIG. 7 is a schematic view illustrating a filtering device according to a fifth embodiment of the present invention.

FIG. 7 is a schematic view of a filtering device according to a fifth embodiment of the present invention. A filtering device 700 includes an inlet portion 101, an outlet portion 102, a filter 103 as a filter A, and a filter 104 as a filter BD, in which the filter 103 and the filter 104 are arranged in series between the inlet portion 101 and the outlet portion 102, and a flow path S7 extending from the inlet portion 101 to the outlet portion 102 is formed.

In the filtering device 700, the inlet portion 101, the filter 103, a piping 105, the filter 104, and the outlet portion 102 form the flow path S7.

In the filtering device 700, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 700, a return flow path R1 is formed which is capable of returning the liquid to be purified to the upstream side of the filter 103 in the flow path S7 from the downstream side of the filter 103 (and the filter 104) in the flow path S7. Specifically, the filtering device 700 has a piping 701 for return, and the piping 701 forms the return flow path R1. One end of the piping 701 is connected to the flow path S7 on the downstream side of the filter 103 (and the filter 104) and the other end thereof is connected to the flow path S7 on the upstream side of the filter 103. On the return flow path R1, a pump, a damper, a valve, and the like not shown in the drawing may be arranged. Particularly, it is preferable to dispose a valve in connection portions J1 and J2 shown in FIG. 7 so as to control the liquid to be purified such that the liquid does not unintentionally flow through the return flow path.

The liquid to be purified that has flowed through the return flow path R1 and has been returned to the upstream side of the filter 103 (in the flow path S7) is filtered through the filter 103 and the filter 104 in the process of flowing again through the flow path S7. This process is called circulation filtration. The filtering device 700 can perform the circulation filtration, and as a result, a chemical liquid having further improved defect inhibition performance is easily obtained.

In FIG. 7, the piping 701 is disposed on the flow path S7 such that the liquid to be purified can be returned to the upstream side of the filter A from the downstream side of the filter 104 (filter BD). However, the filtering device according to the present embodiment may be constituted such that the liquid to be purified can be returned to the upstream side of the filter A from the downstream side of the filter A on the flow path, and may have a return flow path formed of a piping connecting the piping 105 to the inlet portion 101.

Furthermore, in a case where the filter BU is disposed on the upstream side of the filter A on the flow path, a return flow path may be formed which is capable of returning the liquid to be purified to the upstream side of the filter BU from the downstream side of the filter A.

In FIG. 7, the return flow path R1 is formed only of piping. However, the return flow path R1 may be formed of one or plural tanks and pipings described above.

Modification Example of Filtering Device According to Fifth Embodiment

Figure 8:
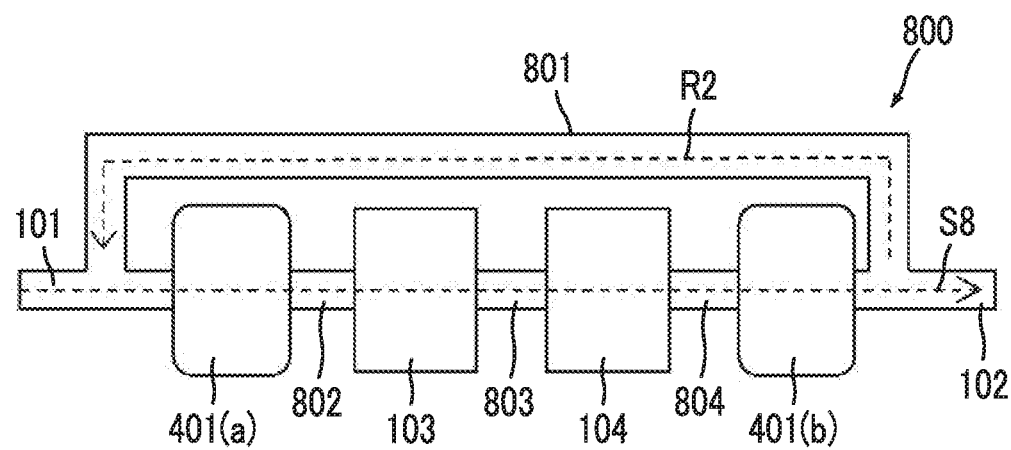
FIG. 8 is a schematic view illustrating a modification example of the filtering device according to the fifth embodiment of the present invention.

FIG. 8 is a schematic view illustrating a modification example of the filtering device according to the fifth embodiment of the present invention.

The filtering device 800 has an inlet portion 101, tanks 401(a) and 401(b), an outlet portion 102, a filter 103 as a filter A, and a filter 104 as a filter BD. The tank 401(a), filter 103, the filter 104, and the tank 401(b) are arranged in series between the inlet portion 101 and the outlet portion 102, and the inlet portion 101, the tank 401(a), a piping 802, the filter 103, a piping 803, the filter 104, a piping 804, the tank 401(b), and the outlet portion 102 form a flow path S8.

In the filtering device 800, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 800, a return flow path R2 is formed which is capable of returning the liquid to be purified to the upstream side of the tank 401(a) disposed on the upstream side of the filter 103 on the flow path S8 from the downstream side of the tank 401(b) disposed on the downstream side of the filter 104 on the flow path S8. One end of a piping 801 is connected to the flow path S8 on the downstream side of the tank 401(b), and the other end thereof is connected to the flow path S8 on the upstream side of the tank 401(a). On the return flow path R2, a pump, a damper, a valve, and the like not shown in the drawing may be arranged.

In the filtering device according to the present embodiment, the starting point of the return flow path R2 is disposed on the downstream side of the tank 401(b) on the flow path, and the end point of the return flow path R2 is disposed on the upstream side of the tank 401(a) on the flow path. In a case where the return flow path is constituted as described above, during circulation filtration, the liquid to be purified can be returned after being retained or can flow again after being retained even after the liquid is returned. As a result, a chemical liquid having further improved defect inhibition performance can be obtained. The filtering device according to the present embodiment may be in the form of a filtering device in which the tank 401(b) and the piping 801 are directly connected to each other, in the form of a filtering device in which the tank 401(a) and the piping 801 are directly connected to each other, or in the form of a filtering device as a combination of these.

The starting point of the return flow path R2 may be disposed at a position which is on the upstream side of the tank 401(b) and on the downstream side of the filter 104. In addition, the end point of the return flow path R2 may be disposed at a position which is on the downstream side of the tank 401(*a*) and on the upstream side of the filter 103.

Sixth Embodiment

Figure 9:
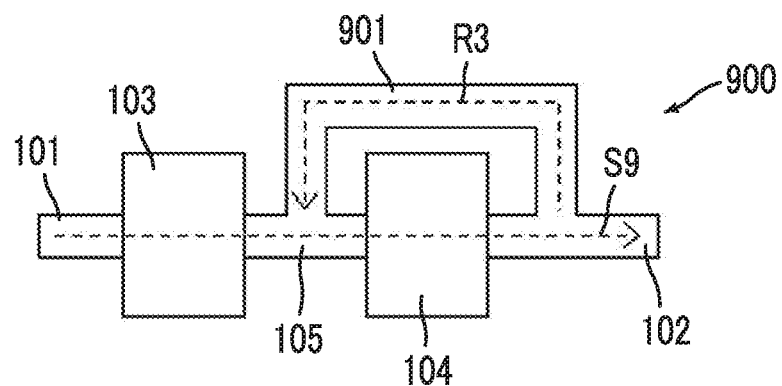
FIG. 9 is a schematic view illustrating a filtering device according to a sixth embodiment of the present invention.

FIG. 9 is a schematic view of a filtering device according to a sixth embodiment of the present invention. A filtering device 900 includes an inlet portion 101, an outlet portion 102, a filter 103 as a filter A, and a filter 104 as a filter BD, in which the filter 103 and the filter 104 are arranged in series between the inlet portion 101 and the outlet portion 102, and a flow path S9 extending from the inlet portion 101 to the outlet portion 102 is formed.

In the filtering device 900, the inlet portion 101, the filter 103, a piping 105, the filter 104, and the outlet portion 102 form the flow path S9.

In the filtering device 900, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 900, a return flow path R3 is formed which is capable of returning the liquid to be purified to a position that is on the downstream side of the filter 103 and on the upstream side of the filter 104 on the flow path S9 from the downstream side of the filter 104 on the flow path S9. One end of the piping 901 is connected to the flow path S9 on the downstream side of the filter 104, and the other end thereof is connected to the flow path S9 at a position which is on the upstream side of the filter 104 and on the downstream side of the filter 103. Specifically, the filtering device 900 has a piping 901 for return, and the piping 901 forms the return flow path R3. On the return flow path R3, a pump, a damper, a valve, and the like not shown in the drawing may be arranged.

The liquid to be purified that has flowed through the return flow path R3 and has been returned to a position, which is on the downstream side of the filter 103 and on the upstream side of the filter 104, is filtered through the filter 104 in the process of flowing again through the flow path S9. The filtering device 900 can perform circulation filtration. As a result, a chemical liquid having further improved defect inhibition performance can be easily obtained.

In FIG. 9, the piping 901 is disposed on the flow path S9 such that the liquid to be purified can be returned to a position, which is on the downstream side of the filter A and on the upstream side of the filter BD on the flow path S9, from the downstream side of the filter 104 (filter BD). However, the filtering device according to the present embodiment may be constituted such that the liquid to be purified can be returned to a position, which is on the downstream side of the filter A and on the upstream side of the filter B, from the downstream side of the filter B on the flow path.

That is, in the flow path S9, a return flow path may be formed which is capable of returning the liquid to be purified to the upstream side of the filter 103 from the downstream side of the filter 104.

Figure 10:
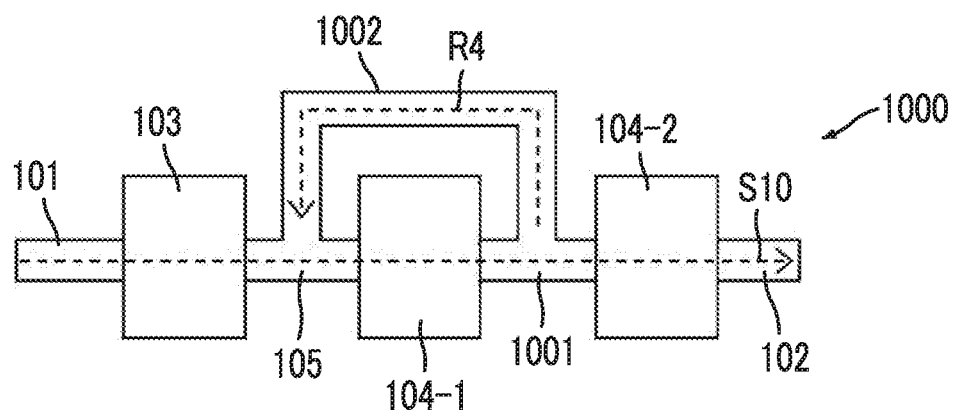
FIG. 10 is a schematic view illustrating a modification example of the filtering device according to the sixth embodiment of the present invention.

(Modification example of filtering device according to sixth embodiment) FIG. 10 is a schematic view illustrating a modification example of the filtering device according to the present embodiment. A filtering device 1000 includes an inlet portion 101, an outlet portion 102, a filter 103 as a filter A, a filter 104-1 (reference filter) as a filter BD, and a filter 104-2, in which the filter 103, the filter 104-1, and the filter 104-2 are arranged in series between the inlet portion 101 and the outlet portion 102, and a flow path S10 extending from the inlet portion 101 to the outlet portion 102 is formed.

In the filtering device 1000, the inlet portion 101, the filter 103, the piping 105, the filter 104-1, a piping 1001, the filter 104-2, and the outlet portion 102 form the flow path S10.

In the filtering device 1000, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 1000, a return flow path R4 is formed which is capable of returning the liquid to be purified to a position, which is the downstream of the filter 103 and the upstream of the filter 104-1 (reference filter) on the flow path S10, from the downstream of the filter 104-1 (reference filter) on the flow path S10. One end of the piping 1002 is connected to the flow path S10 at a position which is on the upstream side of the filter 104-2 and on the downstream side of the filter 104-1, and the other end thereof is connected to the flow path S10 at a position which is on the downstream side of the filter 103 and on the upstream side of the filter 104-1. Specifically, the filtering device 1000 has a piping 1002 for return, and the piping 1002 forms the return flow path R4. On the return flow path R4, a pump, a damper, a valve, and the like not shown in the drawing may be arranged.

The liquid to be purified that has been returned to a position, which is on the downstream side of the filter 103 and on the upstream side of the filter 104-1 on the flow path S10, through the return flow path R4 is filtered through the filter 104-1 in the process of flowing again through the flow path S10. The filtering device 1000 can perform circulation filtration. As a result, a chemical liquid having further improved defect inhibition performance can be easily obtained.

In the filtering device in FIG. 10, the return flow path R4 is formed which is capable of returning the liquid to be purified to the upstream side of the filter 104-1 from the downstream side of the filter 104-1 (reference filter), that is, the upstream side of the filter 104-2 on the flow path S10. However, the filtering device according to the present embodiment is not limited thereto, and may be a filtering device in which a return flow path capable of returning the liquid to be purified to the upstream side of the filter 104-2 from the downstream side of the filter 104-2 is formed, a filtering device in which a return flow path capable of returning the liquid to be purified to a position, which is on the downstream side of the filter A and on the upstream side of the filter 104-1, from the downstream side of the filter 104-2, is formed, or a filtering device in which a return flow path capable of returning the liquid to be purified to the upstream side of the filter 103 from the downstream side of the filter 104-1 or filter 104-2.

[Method for Manufacturing Chemical Liquid]

The method for manufacturing a chemical liquid according to an embodiment of the present invention is a chemical liquid manufacturing method for obtaining a chemical liquid by purifying a liquid to be purified. The method has a filtration step of filtering a liquid to be purified by using the filtering device described above so as to obtain a chemical liquid.

[Liquid to be Purified]

The liquid to be purified to which the method for manufacturing a chemical liquid according to the embodiment of the present invention can be applied is not particularly limited. However, it is preferable that the liquid to be purified contains a solvent. Examples of the solvent include an organic solvent, and water, and the like. It is preferable that the liquid to be purified contains an organic solvent. In the following description, the liquid to be purified will be divided into an organic liquid to be purified in which the content of an organic solvent (total content in a case where the liquid to be purified contains a plurality of organic solvents) with respect to the total mass of solvents contained in the liquid to be purified is greater than 50% by mass, and an aqueous liquid to be purified in which the content of water with respect to the total mass of solvents contained in the liquid to be purified is greater than 50% by mass.

<Organic Liquid to be Purified>

(Organic Solvent)

The organic liquid to be purified contains an organic solvent, in which the content of the organic solvent is greater than 50% by mass with respect to the total mass of solvents contained in the liquid to be purified.

The content of the organic solvent in the liquid to be purified is not particularly limited, but is preferably equal to or greater than 99.0% by mass with respect to the total mass of the liquid to be purified in general. The upper limit thereof is not particularly limited, but is preferably equal to or smaller than 99.99999% by mass in general.

One kind of organic solvent may be used singly, or two or more kinds of organic solvents may be used in combination. In a case where two or more kinds of organic solvents are used in combination, the total content thereof is preferably within the above range.

In the present specification, an organic solvent means one liquid organic compound which is contained in the liquid to be purified in an amount greater than 10,000 ppm by mass with respect to the total mass of the liquid to be purified. That is, in the present specification, a liquid organic compound contained in the liquid to be purified in an amount greater than 10,000 ppm by mass with respect to the total mass of the liquid to be purified corresponds to an organic solvent.

In the present specification, "liquid" means that the compound stays in liquid form at 25° C. under atmospheric pressure.

The type of the organic solvent is not particularly limited, and known organic solvents can be used. Examples of the organic solvent include alkylene glycol monoalkyl ether carboxylate, alkylene glycol monoalkyl ether, a lactic acid alkyl ester, alkyl alkoxypropionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvent, for example, those described in JP2016-057614A, JP2014-219664A, JP2016-138219A, and JP2015-135379A may also be used.

As the organic solvent, at least one kind of compound is preferable which is selected from the group consisting of propylene glycol monomethyl ether (PGMM), propylene glycol monoethyl ether (PGME), propylene glycol monopropyl ether (PGMP), propylene glycol monomethyl ether acetate (PGMEA), ethyl lactate (EL), methyl methoxypropionate (MPM), cyclopentanone (CyPn), cyclohexanone (CyHe), γ-butyrolactone (γBL), diisoamyl ether (DIAE), butyl acetate (nBA), isoamyl acetate (iAA), isopropanol (IPA), 4-methyl-2-pentanol (MIBC), dimethylsulfoxide (DMSO), n-methyl-2-pyrrolidone (NMP), diethylene glycol (DEG), ethylene glycol (EG), dipropylene glycol (DPG), propylene glycol (PG), ethylene carbonate (EC), propylene carbonate (PC), sulfolane, cycloheptanone, 1-hexanol, decane, and 2-heptanone (MAK).

The type and content of the organic solvent in the liquid to be purified can be measured using a gas chromatography mass spectrometer.

(Other Components)

The liquid to be purified may contain other components in addition to the above components. Examples of those other components include an inorganic substance (such as metal ions, metal particles, and metal oxide particles), a resin, an organic substance other than a resin, water, and the like.

Inorganic Substance

The liquid to be purified may contain an inorganic substance. The inorganic substance is not particularly limited, and examples thereof include metal ions, metal-containing particles, and the like.

The form of the metal-containing particles is not particularly limited as long as the particles contain metal atoms. For example, the metal-containing particles are in the form of simple metal atoms, compounds containing metal atoms (hereinafter, also referred to as "metal compound"), a complex of these, and the like. Furthermore, the metal-containing particles may contain a plurality of metal atoms.

The complex is not particularly limited, and examples thereof include a so-called core-shell type particle having a simple metal atom and a metal compound covering at least a portion of the simple metal atom, a solid solution particle including a metal atom and another atom, a eutectic particle including a metal atom and another atom, an aggregate particle of a simple metal atom and a metal compound, an aggregate particle of different kinds of metal compounds, a metal compound in which the composition thereof continuously or intermittently changes toward the center of the particle from the surface of the particle, and the like.

The atom other than the metal atom contained in the metal compound is not particularly limited, and examples thereof include a carbon atom, an oxygen atom, a nitrogen atom, a hydrogen atom, a sulfur atom, a phosphorus atom, and the like. Among these, an oxygen atom is preferable.

The metal atom is not particularly limited, and examples thereof include a Fe atom, an Al atom, a Cr atom, a Ni atom, a Pb atom, a Zn atom, a Ti atom, and the like. The metal-containing particles may contain one kind of each of the aforementioned metal atoms singly or may contain two or more kinds of the aforementioned metal atoms in combination.

The inorganic substance may be added to the liquid to be purified, or may be unintentionally mixed into the liquid to be purified in the manufacturing process. Examples of the case where the inorganic substance is unintentionally mixed into the liquid to be purified in the manufacturing process of the chemical liquid include, but are not limited to, a case where the inorganic substance is contained in a raw material (for example, an organic solvent) used for manufacturing the chemical liquid, a case where the inorganic substance is mixed into the liquid to be purified in the manufacturing process of the chemical liquid (for example, contamination), and the like.

(Resin)

The liquid to be purified may contain a resin.

As the resin, a resin P having a group which is decomposed by the action of an acid and generates a polar group is more preferable. As such a resin, a resin having a repeating unit represented by Formula (AI) that will be described later is more preferable, which is a resin whose solubility in a developer containing an organic solvent as a main component is reduced by the action of an acid. The resin having a repeating unit represented by Formula (AI), which will be described later, has a group that is decomposed by the action of an acid and generates an alkali-soluble group (hereinafter, also referred to as an "acid-decomposable group").

Examples of the polar group include an alkali-soluble group. Examples of the alkali-soluble group include a carboxy group, a fluorinated alcohol group (preferably a hexafluoroisopropanol group), a phenolic hydroxyl group, and a sulfo group.

In the acid-decomposable group, the polar group is protected by a group leaving by an acid (acid leaving group). Examples of the acid leaving group include —C($R_{36}$)($R_{37}$)($R_{38}$), —C($R_{36}$)($R_{37}$)(O$R_{39}$), —C($R_{01}$)($R_{02}$)(O$R_{39}$), and the like.

In the formulas, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P whose solubility in a developer containing an organic solvent as a main component is reduced by the action of an acid will be specifically described.

(Formula (AI): Repeating Unit Having Acid-Decomposable Group)

It is preferable that the resin P contains a repeating unit represented by Formula (AI).

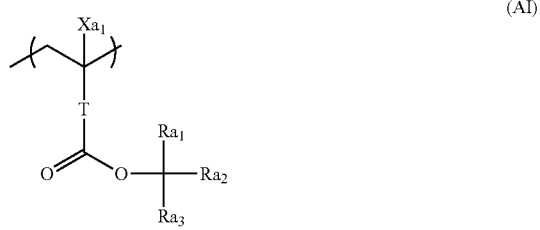

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may be bonded to each other to form a cycloalkyl group (monocyclic or polycyclic).

Examples of the alkyl group which is represented by $Xa_1$ and may have a substituent include a methyl group and a group represented by —$CH_2$—$R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formulas, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group represented by $Ra_1$ to $Ra_3$ preferably has 1 to 4 carbon atoms.

The cycloalkyl group represented by $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The cycloalkyl group formed by the bonding of two out of $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. Among these, a monocyclic cycloalkyl group having 5 or 6 carbon atoms is more preferable.

In the cycloalkyl group formed by the bonding of two out of $Ra_1$ to $Ra_3$, for example, one of the methylene groups constituting a ring may be substituted with a hetero atom such as an oxygen atom or with a group having a hetero atom such as a carbonyl group.

As the repeating unit represented by Formula (AI), for example, an embodiment is preferable in which $Ra_1$ is a methyl group or an ethyl group, and $Ra_2$ and $Ra_3$ are bonded to each other to form the cycloalkyl group described above.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The content of the repeating unit represented by Formula (AI) with respect to all the repeating units in the resin P is preferably from 20 to 90 mol %, more preferably from 25 to 85 mol %, and even more preferably from 30 to 80 mol %.

(Repeating Unit Having Lactone Structure)

Furthermore, it is preferable that the resin P contains a repeating unit Q having a lactone structure.

The repeating unit Q having a lactone structure preferably has a lactone structure on a side chain. The repeating unit Q is more preferably a repeating unit derived from a (meth) acrylic acid derivative monomer.

One kind of repeating unit Q having a lactone structure may be used singly, or two or more kinds of repeating units Q may be used in combination. However, it is preferable to use one kind of repeating unit Q singly.

The content of the repeating unit Q having a lactone structure with respect to all the repeating units in the resin P is preferably 3 to 80 mol %, and more preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulas (LC1-1) to (LC1-17). The lactone structure is more preferably a lactone structure represented by Formula (LC1-1), Formula (LC1-4), Formula (LC1-5), or Formula (LC1-8), and even more preferably a lactone structure represented by Formula (LC1-4).
LC1-1
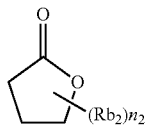
LC1-2
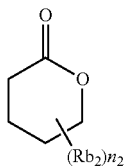
LC1-3
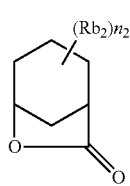
LC1-4
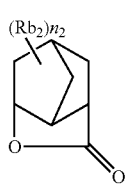
LC1-5
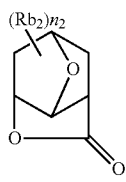
LC1-6
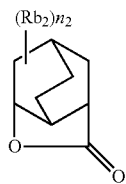
LC1-7
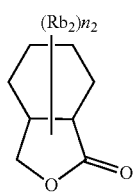
LC1-8
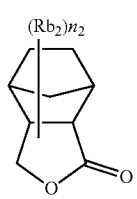
LC1-9
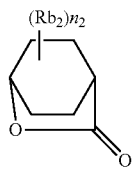
LC1-10
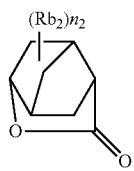
LC1-11
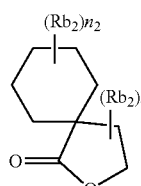
LC1-12
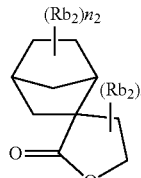
LC1-13
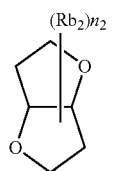
LC1-14
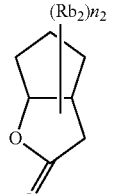
LC-15
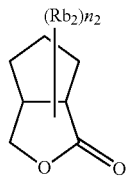
LC1-16
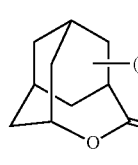

-continued

LC1-17

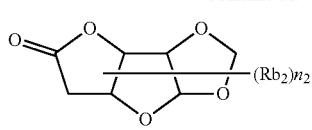

The lactone structure portion may have a substituent (Rb$_2$). As the substituent (Rb$_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. n$_2$ represents an integer of 0 to 4. In a case where n$_2$ is equal to or greater than 2, a plurality of substituents (Rb$_2$) may be the same as or different from each other, and the plurality of substituents (Rb$_2$) may be bonded to each other to form a ring.

(Repeating Unit Having Phenolic Hydroxyl Group)

The resin P may also contain a repeating unit having a phenolic hydroxyl group.

Examples of the repeating unit having a phenolic hydroxyl group include a repeating unit represented by General Formula (I).

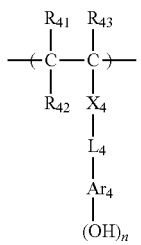

(I)

In the formula,

R$_{41}$, R$_{42}$ and R$_{43}$ each independently represent a hydrogen atom, an alkyl group, a halogen atom, a cyano group, or an alkoxycarbonyl group. Here, R$_{42}$ may be bonded to Ar$_4$ to form a ring, and in this case, R$_{42}$ represents a single bond or an alkylene group.

X$_4$ represents a single bond, —COO—, or —CONR$_{64}$—, and R$_{64}$ represents a hydrogen atom or an alkyl group.

L$_4$ represents a single bond or an alkylene group.

Ar$_4$ represents an (n+1)-valent aromatic ring group. In a case where Ar$_4$ is bonded to R$_{42}$ to form a ring, Ar$_4$ represents an (n+2)-valent aromatic ring group.

n represents an integer of 1 to 5.

As the alkyl group represented by R$_{41}$, R$_{42}$, and R$_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, or a dodecyl group which may have a substituent, is preferable, an alkyl group having 8 or less carbon atoms is more preferable, and an alkyl group having 3 or less carbon atoms is even more preferable.

The cycloalkyl group represented by R$_{41}$, R$_{42}$, and R$_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may have a substituent.

Examples of the halogen atom represented by R$_{41}$, R$_{42}$, and R$_{43}$ in General Formula (I) include a fluorine atom, a chlorine atom, a bromine atom, and an iodine atom. Among these, a fluorine atom is preferable.

As the alkyl group included in the alkoxycarbonyl group represented by R$_{41}$, R$_{42}$, and R$_{43}$ in General Formula (I), the same alkyl group as the alkyl group represented by R$_{41}$, R$_{42}$, and R$_{43}$ described above is preferable.

Examples of the substituent in each of the above groups include an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

Ar$_4$ represents an (n+1)-valent aromatic ring group. In a case where n is 1, the divalent aromatic ring group may have a substituent, and examples thereof include arylene groups having 6 to 18 carbon atoms, such as a phenylene group, a tolylene group, a naphthylene group, and an anthracenylene group, and aromatic ring groups having a hetero ring such as thiophene, furan, pyrrole, benzothiophene, benzofuran, benzopyrrole, triazine, imidazole, benzimidazole, triazole, thiadiazole, and thiazole.

In a case where n is an integer equal to or greater than 2, specific examples of the (n+1)-valent aromatic ring group include groups obtained by removing (n−1) pieces of any hydrogen atom from the aforementioned specific examples of the divalent aromatic ring group.

The (n+1)-valent aromatic ring group may further have a substituent.

Examples of the substituent that the aforementioned alkyl group, cycloalkyl group, alkoxycarbonyl group, alkylene group, and (n+1)-valent aromatic ring group can have include the alkyl group exemplified above as R$_{41}$, R$_{42}$, and R$_{43}$ in General Formula (I); an alkoxy group such as a methoxy group, an ethoxy group, a hydroxyethoxy group, a propoxy group, a hydroxypropoxy group, and a butoxy group; and an aryl group such as a phenyl group.

Examples of the alkyl group represented by R$_{64}$ in —CONR$_{64}$— (R$_{64}$ represents a hydrogen atom or an alkyl group) represented by X$_4$ include an alkyl group having 20 to or less carbon atoms, such as a methyl group, an ethyl group, a propyl group, an isopropyl group, a n-butyl group, a sec-butyl group, a hexyl group, a 2-ethylhexyl group, an octyl group, and a dodecyl group which may have a substituent. Among these, an alkyl group having 8 or less carbon atoms is more preferable.

X$_4$ is preferably a single bond, —COO— or —CONH—, and more preferably a single bond or —COO—.

The alkylene group represented by L$_4$ is preferably an alkylene group having 1 to 8 carbon atoms such as a methylene group, an ethylene group, a propylene group, a butylene group, a hexylene group, and an octylene group which may have a substituent.

Ar$_4$ is preferably an aromatic ring group having 6 to 18 carbon atoms that may have a substituent, and more preferably a benzene ring group, a naphthalene ring group, or a biphenylene ring group.

It is preferable that the repeating unit represented by General Formula (I) comprises a hydroxystyrene structure. That is, Ar$_4$ is preferably a benzene ring group.

The content of the repeating unit having a phenolic hydroxyl group with respect to all the repeating units in the resin P is preferably 0 to 50 mol %, more preferably 0 to 45 mol %, and even more preferably 0 to 40 mol %.

(Repeating Unit Containing Organic Group Having Polar Group)

The resin P may further contain a repeating unit containing an organic group having a polar group, particularly, a repeating unit having an alicyclic hydrocarbon structure substituted with a polar group. In a case where the resin P further contains such a repeating unit, the substrate adhesion and the affinity with a developer are improved.

The alicyclic hydrocarbon structure substituted with a polar group is preferably an adamantyl group, a diadamantyl group, or a norbornane group. As the polar group, a hydroxyl group or a cyano group is preferable.

In a case where the resin P contains a repeating unit containing an organic group having a polar group, the content of such a repeating unit with respect to all the repeating units in the resin P is preferably 1 to 50 mol %, more preferably 1 to 30 mol %, even more preferably 5 to 25 mol %, and particularly preferably 5 to 20 mol %.

(Repeating Unit Represented by General Formula (VI))

The resin P may also contain a repeating unit represented by General Formula (VI).

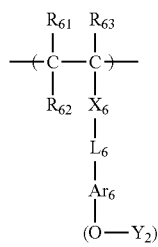

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and in this case, $R_{62}$ represents a single bond or an alkylene group.

$X_6$ represents a single bond, —COO—, or —CONR$_{64}$—, $R_{64}$ represents a hydrogen atom or an alkyl group.

$L_6$ represents a single bond or an alkylene group.

$Ar_6$ represents an (n+1)-valent aromatic ring group. In a case where $Ar_6$ is bonded to $R_{62}$ to form a ring, $Ar_6$ represents an (n+2)-valent aromatic ring group.

In a case where n≥2, $Y_2$ each independently represents a hydrogen atom or a group which leaves by the action of an acid. Here, at least one of $Y_2$'s represents a group which leaves by the action of an acid.

n represents an integer of 1 to 4.

As the group $Y_2$ which leaves by the action of an acid, a structure represented by General Formula (VI-A) is preferable.

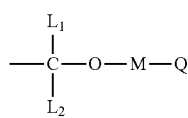

$L_1$ and $L_2$ each independently represent a hydrogen atom, an alkyl group, a cycloalkyl group, an aryl group, or a group obtained by combining an alkylene group with an aryl group.

M represents a single bond or a divalent linking group.

Q represents an alkyl group, a cycloalkyl group which may have a hetero atom, an aryl group which may have a hetero atom, an amino group, an ammonium group, a mercapto group, a cyano group, or an aldehyde group.

At least two out of Q, M and $L_1$ may be bonded to each other to form a ring (preferably a 5- or 6-membered ring).

The repeating unit represented by General Formula (VI) is preferably a repeating unit represented by General Formula (3).

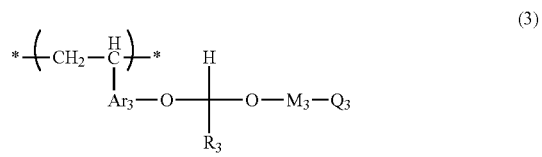

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two out of $Q_3$, $M_3$, and $R_3$ may be bonded to each other to form a ring.

The aromatic ring group represented by $Ar_3$ is the same as $Ar_6$ in General Formula (VI) in which n is 1. The aromatic ring group is preferably a phenylene group or a naphthylene group, and more preferably a phenylene group.

(Repeating Unit Having Silicon Atom on Side Chain)

The resin P may further contain a repeating unit having a silicon atom on a side chain. Examples of the repeating unit having a silicon atom on a side chain include a (meth)acrylate-based repeating unit having a silicon atom, a vinyl-based repeating unit having a silicon atom, and the like. The repeating unit having a silicon atom on a side chain is typically a repeating unit having a group, which has a silicon atom, on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formula, R and $R^1$ each independently represent a monovalent substituent. * represents a bond.

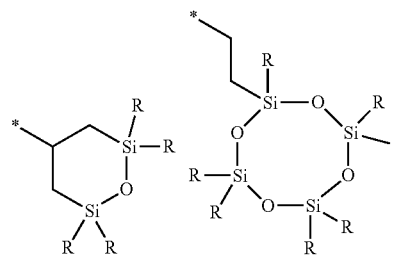

-continued

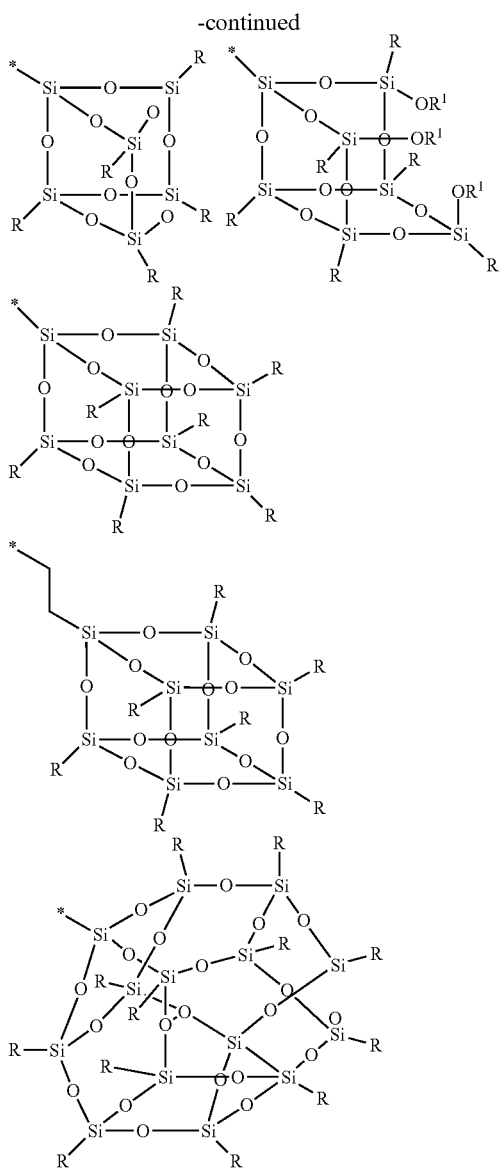

As the repeating unit having the aforementioned group, for example, a repeating unit derived from an acrylate or methacrylate compound having the aforementioned group or a repeating unit derived from a compound having the aforementioned group and a vinyl group is preferable.

In a case where the resin P has the repeating unit having a silicon atom on a side chain, the content of such a repeating unit with respect to all the repeating units in the resin P is preferably 1 to 30 mol %, more preferably 5 to 25 mol %, and even more preferably 5 to 20 mol %.

The weight-average molecular weight of the resin P that is measured by a gel permeation chromatography (GPC) method and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, and to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

As other components (for example, an acid generator, a basic compound, a quencher, a hydrophobic resin, a surfactant, a solvent, and the like) to be contained in the chemical liquid, any known components can be used.

<Aqueous Liquid to be Purified>

The aqueous liquid to be purified means a liquid in which the content of water is higher than 50% by mass with respect to the total mass of solvents contained in the liquid to be purified. The content of water with respect to the total mass of solvents contained in the liquid to be purified is preferably 51% to 95% by mass.

The water is not particularly limited, but it is preferable to use ultrapure water used for manufacturing semiconductors. The ultrapure water is more preferably used after being further purified such that the inorganic anions, metal ions, and the like are reduced. The purification method is not particularly limited, but is preferably purification using a filtration membrane or an ion-exchange membrane and purification by distillation. Furthermore, for example, it is preferable to perform purification by the method described in JP2007-254168A.

(Oxidant) The aqueous liquid to be purified may contain an oxidant. As the oxidant, known oxidants can be used without particular limitation. Examples of the oxidant include hydrogen peroxide, a peroxide, nitric acid, nitrate, iodate, periodate, hypochlorite, chlorite, chlorate, perchlorate, persulfate, dichromate, permanganate, aqueous ozone, a silver (II) salt, an iron (III) salt, and the like.

The content of the oxidant is not particularly limited, and the amount of the oxidant contained in the liquid to be purified may be optionally set according to the purpose. For example, the content of the oxidant with respect to the total mass of the aqueous liquid to be purified is preferably equal to or greater than 0.1% by mass and equal to or smaller than 99% by mass. One kind of oxidant may be used singly, or two or more kinds of oxidants may be used in combination. In a case where two or more kinds of oxidants are used in combination, the total content thereof is preferably within the above range.

(Inorganic Acid)

The aqueous liquid to be purified may contain an inorganic acid. As the inorganic acid, known inorganic acids can be used without particular limitation. Examples of the inorganic acid include sulfuric acid, phosphoric acid, hydrochloric acid, and the like. The inorganic acid is not included in the oxidant described above.

The content of the inorganic acid in the liquid to be purified is not particularly limited, but is preferably equal to or greater than 0.01% by mass and equal to or smaller than 99% by mass with respect to the total mass of the liquid to be purified.

One kind of inorganic acid may be used singly, or two or more kinds of inorganic acids may be used in combination. In a case where two or more kinds of inorganic acids are used in combination, the total content thereof is preferably within the above range.

(Anticorrosive)

The aqueous liquid to be purified may contain an anticorrosive. As the anticorrosive, known anticorrosives can be used without particular limitation. Examples of the anticorrosive include 1,2,4-triazole (TAZ), 5-aminotetrazole (ATA), 5-amino-1,3,4-thiadiazole-2-thiol,3-amino-1H-1,2,4-triazole,3,5-diamino-1,2,4-triazole, tolyl triazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyl tetrazole, bismuthiol I, 1,3-dimethyl-2-imidazolidinone,1,5-pentamethylenetetrazole,1-phenyl-5-mercaptotetrazole, diaminomethyltriazine, imidazolinethion, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, a heterocyclic nitrogen inhibitor, thiourea, 1,1,3,3-tetramethylurea, urea, urea derivatives, uric acid, potassium ethylxanthate, glycine, dodecyl phosphate, iminodiacetic acid, boric acid, malonic acid, succinic acid, nitrilotriacetic acid, sulfolane, 2,3,5-trimethylpyrazine, 2-ethyl-3,5-dimethylpyrazine, quinoxaline, acetylpyrrole, pyridazine, histadine, pyrazine, glutathione (reduced), cysteine, cystine, thiophene, mercaptopyridine N-oxide, thiamine HCl, tetraethylthiuram disulfide, 2,5-dimercapto-1,3-thiadiazole ascorbic acid, catechol, t-butyl catechol, phenol, and pyrogallol.

As the anticorrosive, it is also possible to use aliphatic carboxylic acids such as dodecanoic acid, palmitic acid, 2-ethylhexanoic acid, and cyclohexanoic acid; carboxylic acids having a chelating ability such as citric acid, malic acid, oxalic acid, malonic acid, succinic acid, itaconic acid, maleic acid, glycolic acid, mercaptoacetic acid, thioglycolic acid, salicylic acid, sulfosalicylic acid, anthranilic acid, N-methylanthranilic acid, 3-amino-2-naphthoic acid, 1-amino-2-naphthoic acid, 2-amino-1-naphthoic acid, 1-aminoanthraquinone-2-carboxylic acid, tannic acid, and gallic acid; and the like.

Examples of the anticorrosive also include anionic surfactants such as a palm fatty acid salt, a sulfonated castor oil salt, a lauryl sulfate salt, a polyoxyalkylene allyl phenyl ether sulfate salt, alkylbenzene sulfonic acid, alkylbenzene sulfonate, alkyl diphenyl ether disulfonate, alkyl naphthalene sulfonate, a dialkylsulfosuccinate salt, isopropyl phosphate, a polyoxyethylene alkyl ether phosphate salt, and a polyoxyethylene allyl phenyl ether phosphate salt; cationic surfactants such as oleylamine acetate, laurylpyridinium chloride, cetylpyridinium chloride, lauryltrimethylammonium chloride, stearyltrimethylammonium chloride, behenyltrimethylammonium chloride, and didecyldimethylammonium chloride; amphoteric surfactants such as palm alkyldimethylamine oxide, fatty acid amidopropyldimethylamine oxide, alkylpolyaminoethyl glycine hydrochloride, an amidobetaine-type activator, an alanine-type activator, and lauryl iminodipropionic acid; nonionic surfactants of a polyoxyalkylene primary alkyl ether or a polyoxyalkylene secondary alkyl ether, such as polyoxyethylene octyl ether, polyoxyethylene decyl ether, polyoxyethylene lauryl ether, polyoxyethylene lauryl amine, polyoxyethylene oleyl amine, polyoxyethylene polystyryl phenyl ether, and polyoxyalkylene polystyryl phenyl ether and other polyoxyalkylene-based nonionic surfactants such as polyoxyethylene dilaurate, polyoxyethylene laurate, polyoxyethylated castor oil, polyoxyethylated hydrogenated castor oil, a sorbitan lauric acid ester, a polyoxyethylene sorbitan lauric acid ester, and fatty acid diethanolamide; fatty acid alkyl esters such as octyl stearate and trimethylolpropane tridecanoate; and polyether polyols such as polyoxyalkylene butyl ether, polyoxyalkylene oleyl ether, and trimethylolpropane tris (polyoxyalkylene) ether.

Examples of commercial products of the above anticorrosives include NEWCALGEN FS-3PG (manufactured by TAKEMOTO OIL & FAT Co., Ltd.), PHOSTEN HLP-1 (manufactured by Nikko Chemicals Co., Ltd.), and the like.

As the anticorrosive, a hydrophilic polymer can also be used.

Examples of the hydrophilic polymer include polyglycols such as polyethylene glycol, an alkyl ether of polyglycols, polyvinyl alcohol, polyvinyl pyrrolidone, polysaccharides such as alginic acid, carboxylic acid-containing polymers such as polymethacrylic acid and polyacrylic acid, polyacrylamide, polymethacrylamide, polyethyleneimine, and the like. Specific examples of these hydrophilic polymers include the water-soluble polymers described in paragraphs "0042" to "0044" in JP2009-088243A and paragraph "0026" in JP2007-194261A.

As the anticorrosive, a cerium salt can also be used.

As the cerium salt, known cerium salts can be used without particular limitation.

Examples of the cerium salt include trivalent cerium salts such as cerium acetate, cerium nitrate, cerium chloride, cerium carbonate, cerium oxalate, and cerium sulfate and tetravalent cerium salts such as cerium sulfate, cerium ammonium sulfate, cerium ammonium nitrate, diammonium cerium nitrate, cerium hydroxide, and the like.

The anticorrosive may include substituted or unsubstituted benzotriazole. Suitable substituted benzotriazole includes, but is not limited to, benzotriazole substituted with an alkyl group, an aryl group, a halogen group, an amino group, a nitro group, an alkoxy group, or a hydroxyl group. The substituted benzotriazole also includes compounds fused by one or more aryl (for example, phenyl) or heteroaryl groups.

The content of the anticorrosive in the liquid to be purified with respect to the total mass of the chemical liquid is preferably adjusted to 0.01% to 5% by mass, more preferably adjusted to 0.05% to 5% by mass, and even more preferably adjusted to 0.1% to 3% by mass.

One kind of anticorrosive may be used singly, or two or more kinds of anticorrosives may be used in combination. In a case where two or more kinds of anticorrosives are used in combination, the total content thereof is preferably within the above range.

(Organic Solvent)

The aqueous liquid to be purified may contain an organic solvent. The organic solvent is not particularly limited, and is the same as the aforementioned liquid to be purified contained in the organic solvent-based liquid to be purified. In a case where the aqueous liquid to be purified contains an organic solvent, the content of the organic solvent is preferably 5% to 35% by mass with respect to the total mass of solvents contained in the liquid to be purified.

<Relationship Between Liquid to be Purified and Filtering Device>

The relationship between the liquid to be purified and the filtering device (physical properties of the filter) is not particularly limited. However, in the relationship with the solubility parameter (SP value) of the liquid to be purified, in a case where the SP value is less than 20 $(MPa)^{1/2}$, the imidization ratio of the filter A is preferably 1.0 to 1.5. The lower limit of the SP value is not particularly limited, but is preferably equal to or higher than 14 $(MPa)^{1/2}$.

In a case where the SP value is equal to or greater than 20 $(MPa)^{1/2}$ (the upper limit thereof is not particularly limited, but is preferably equal to or smaller than 30 $(MPa)^{1/2}$), the imidization ratio is preferably higher than 1.5. The upper limit of the imidization ratio is not particularly limited, but is preferably equal to or lower than 2.0 in general.

Furthermore, according to the examination of the inventors of the present invention, it has been found that in a case where the SP value of the liquid to be purified is equal to or greater than 20 $(MPa)^{1/2}$, the liquid to be purified contains solid impurities (particularly, microgel-like components) having high polarity in many cases. In a case where the SP value of the liquid to be purified is equal to or greater than 20 $(MPa)^{1/2}$, it is preferable to use a filter A having an imidization ratio higher than 1.5 because such a filter has a stronger interaction with the gel-like impurities (such a filter has a higher ability to trap the gel-like impurities).

On the other hand, in a case where the SP value is less than 20 $(MPa)^{1/2}$, because the content of the gel-like impurities in the liquid to be purified is relatively small, as long as the imidization ratio of the filter A is equal to or higher than 1.0, the filter can sufficiently trap the gel-like impurities. In contrast, in a case where the imidization ratio is equal to or lower than 1.5, the filter A demonstrates sufficient ionic impurity removal performance. As a result, a chemical liquid having better defect inhibition performance is obtained.

In the present specification, the SP value means "value of the solubility parameter". The SP value mentioned in the present invention is a Hansen solubility parameter determined by the equation explained in "Hansen Solubility Parameters: A User's Handbook, Second Edition, C. M. Hansen (2007), Taylor and Francis Group, LLC (HSPiP manual). As the SP value, a value calculated by the following equation by using "Hansen Solubility Parameters in Practice HSPiP, 3rd Edition" (software version 4. 0. 05) is used.

$$(SP\ value)^2 = (\delta Hd)^2 + (\delta Hp)^2 + (\delta Hh)^2$$

Hd: dispersion element
Hp: polarity element
Hh: hydrogen bond element

In the case where the liquid to be purified is a mixture of two or more kinds of solvents, the SP value of the liquid to be purified is determined by the sum of the products of the SP value of each of the solvents and the volume fraction of each of the solvents. That is, the SP value of the liquid to be purified it is represented by the following equation.

$$(SP\ value\ of\ liquid\ to\ be\ purified) = \Sigma\{(SP\ value\ of\ each\ solvent) \times (volume\ fraction\ of\ each\ solvent)\}$$

For example, in a case where the solvent contained in the liquid to be purified is a 7:3 (based on volume) mixture of PGMEA and PGME, the SP value thereof is calculated by 17.8×0.7+23.05×0.3, which equals 19.375 $(MPa)^{1/2}$. In the present specification, in a case where the SP value is expressed by the unit of $(MPa)^{1/2}$, the SP value is determined by rounding off the numbers to two decimal points. In the case described above, the SP value of the liquid to be purified is 19.4 $(MPa)^{1/2}$ as described in the tables in the following examples.

[Filtration Step]

The method for manufacturing a chemical liquid according to the present embodiment includes a filtration step of filtering the liquid to be purified by using the filtering device described above so as to obtain a chemical liquid.

The filtering device has a flow path formed by arranging the filter A and the filter B in series. The feed pressure of the liquid to be purified supplied to each filter is not particularly limited, but is preferably 0.00010 to 1.0 MPa in general.

Particularly, in view of obtaining a chemical liquid having further improved defect inhibition performance, a feed pressure $P_2$ is preferably 0.00050 to 0.090 MPa, more preferably 0.0010 to 0.050 MPa, and even more preferably 0.0050 to 0.040 MPa.

The filtration pressure affects the filtration accuracy. Therefore, it is preferable that the pulsation of pressure during filtration is as low as possible.

The filtration speed is not particularly limited. However, in view of easily obtaining a chemical liquid having further improved defect inhibition performance, the filtration speed is preferably equal to or higher than 1.0 $L/min/m^2$, more preferably equal to or higher than 0.75 $L/min/m^2$, and even more preferably equal to or higher than 0.6 $L/min/m^2$. For the filter, an endurable differential pressure for assuring the filter performance (assuring that the filter will not be broken) is set. In a case where the endurable differential pressure is high, by increasing the filtration pressure, the filtration speed can be increased. That is, it is preferable that the upper limit of the filtration speed is generally equal to or lower than 10.0 $L/min/m^2$ although the upper limit usually depends on the endurable differential pressure of the filter.

The temperature at which the liquid to be purified passes through the filter is not particularly limited, but is preferably less than room temperature in general.

The filtration step is preferably performed in a clean environment. Specifically, the filtration step is preferably performed in a clean room that satisfies Class 1000 (Class 6 in ISO14644-1:2015) of Federal Standard (Fed. Std. 209E), more preferably performed in a clean room that satisfies Class 100 (Class 5 in ISO14644-1:2015), even more preferably performed in a clean room that satisfies Class 10 (Class 4 in ISO14644-1: 2015), and particularly preferably performed in a clean room that has a cleanliness (Class 2 or Class 1) equal to or higher than Class 1 (Class 3 in ISO14644-1: 2015).

It is preferable that each step which will be described later is also performed in the clean environment described above.

In a case where the filtering device has a return flow path, the filtration step may be a circulation filtration step. The circulation filtration step is a step of filtering the liquid to be purified by at least the filter A, returning the liquid to be purified having been filtered through the filter A to the upstream of the filter A in the flow path, and filtering again the liquid to be purified through the filter A.

The number of times of the circulation filtration is not particularly limited, but is preferably 1 to 10 in general. During the circulation filtration, the liquid to be purified may be returned to the upstream of the filter A such that the filtration by the filter A is repeated. At this time, the return flow path may be adjusted such that the filtration by at least one filter B is also repeated in addition to the filtration by the filter A.

[Other Steps]

The method for manufacturing a chemical liquid according to the present embodiment may include steps other than the above step. Examples of the steps other than the above step include a filter washing step, a device washing step, an electricity removing step, a step of preparing a liquid to be purified, and the like. Hereinafter, each of the steps will be specifically described.

<Filter Washing Step>

The filter washing step is a step of washing the filter A and the filter B by using a washing solution before the filtration step. The method of washing the filter is not particularly limited, and examples thereof include a method of immersing the filter in a washing solution, a method of washing the filter by passing a washing solution through the filter, a combination of these, and the like.

(Method of Immersing Filter in Washing Solution)

Examples of the method of immersing the filter in the washing solution include a method of filling a container for immersion with the washing solution and immersing the filter in the washing solution.

Washing Solution

As the washing solution, known washing solutions can be used without particular limitation.

Particularly, in view of obtaining further improved effects of the present invention, it is preferable that the washing solution contains at least one kind of compound selected from the group consisting of a hydroxyaliphatic carboxylic acid ester, an aliphatic carboxylic acid ester, chain-like or cyclic ketone, alkylene glycol monoalkyl ether, alkylene glycol monoalkyl ether acetate, and an aprotic polar solvent. Hereinafter, the washing solution satisfying the above condition will be described as "specific washing solution".

The specific washing solution contains at least one kind of compound selected from the group consisting of a hydroxyaliphatic carboxylic acid ester, an aliphatic carboxylic acid ester, chain-like or cyclic ketone, alkylene glycol monoalkyl ether, alkylene glycol monoalkyl ether acetate, and an aprotic polar solvent other than these solvents. "Aprotic polar solvent other than these solvents" is the same "aprotic polar solvent other than the following solvents (A) and (B)".

It is preferable that the specific washing solution contains
(A) aprotic polar solvent other than the following solvent (B), and
(B) at least one solvent selected from the group consisting of a hydroxyaliphatic carboxylic acid ester, an aliphatic carboxylic acid ester, chain-like or cyclic ketone, alkylene glycol monoalkyl ether, and alkylene glycol monoalkyl ether acetate (hereinafter, also referred to as "solvent (B)").

The aprotic polar solvent is preferably at least one solvent selected from the group consisting of a solvent having an amide structure represented by the following General Formula (s) and alkylsulfinyl alkane (another name: dialkyl sulfoxide).

One kind of aprotic polar solvent may be used singly, or two or more kinds of aprotic polar solvents may be used in combination.

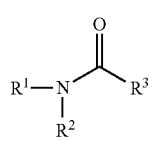
(s)

In the formula, $R^1$ and $R^2$ each independently represent a hydrogen atom or an alkyl group, and may be the same as or different from each other. $R^3$ represents a hydrogen atom, an alkyl group, or a group represented by —$NR^4R^5$. $R^4$ and $R^5$ each independently represent a hydrogen atom or an alkyl group, and may be the same as or different from each other. $R^2$ and $R^3$ may be bonded to each other to form a ring.

The alkyl group represented by $R^1$ to $R^5$ is not particularly limited, but is preferably an alkyl group having 1 to 3 carbon atoms.

Examples of the ring formed by the bonding of $R^2$ and $R^3$ include a 2-imidazolidone ring, a 2-pyrrolidone ring, a 3,4,5,6-tetrahydro-2(1H)-pyrimidinone ring, and the like.

Examples of the solvent having an amide structure represented by General Formula (s) include 1,1,3,3-tetramethylurea, 1,1,3,3-tetraethylurea, dimethylformamide, diethylformamide, dimethylacetamide, 1,3-dimethyl-2-imidazolidone, N-methylpyrrolidone, 1,3-dimethyl-3,4,5,6-tetrahydro-2(1H)-pyrimidinone, N,N-dimethylpropionamide, N-methylacetamide, N-methylformamide, and the like.

Examples of the alkylsulfinyl alkane (another name: dialkyl sulfoxide) include dimethyl sulfoxide, methyl ethyl sulfoxide, and the like.

The aprotic polar solvent is more preferably at least one solvent selected from the group consisting of dimethylformamide, dimethylacetamide, N-methylpyrrolidone, 1,1,3,3-tetramethylurea, and dimethyl sulfoxide.

The solvent (B) is at least one kind of solvent selected from the group consisting of a hydroxyaliphatic carboxylic acid ester, an aliphatic carboxylic acid ester, chain-like or cyclic ketone, alkylene glycol monoalkyl ether, and alkylene glycol monoalkyl ether acetate.

The aliphatic carboxylic acid ester does not include a hydroxy aliphatic carboxylic acid ester.

Examples of the hydroxy aliphatic carboxylic acid ester include methyl lactate, ethyl lactate, and the like.

Examples of the aliphatic carboxylic acid ester include n-butyl acetate, iso-butyl acetate, n-propyl acetate, and the like.

Examples of the chain-like or cyclic ketone include 2-heptanone (another name: methyl amyl ketone), cyclohexanone, and the like.

Examples of the alkylene glycol monoalkyl ether include propylene glycol monoalkyl ether, butylene glycol monoalkyl ether, pentane glycol monoalkyl ether, and the like. Among these, propylene glycol monomethyl ether is preferable.

Examples of the alkylene glycol monoalkyl ether acetate include propylene glycol monoalkyl ether acetate, butylene glycol monoalkyl ether acetate, pentane glycol monoalkyl ether acetate, and the like. Among these, propylene glycol monomethyl ether acetate is preferable.

The solvent (B) is preferably a compound having 4 to 7 carbon atoms, and more preferably a compound having 5 to 7 carbon atoms.

The solvent (B) is preferably at least one solvent selected from the group consisting of ethyl lactate, butyl acetate, 2-heptanone, cyclohexanone, and propylene glycol monomethyl ether acetate.

The aprotic polar solvent may be used singly, or the solvent (B) may be used singly.

In a case where the aprotic polar solvent and the solvent (B) are used by being mixed together, the mixing ratio is not particularly limited. However, the mass ratio of the content of the solvent (B) to the total content of the aprotic polar solvent and the solvent (B) [B/(A+B)] is preferably equal to or lower than 0.8, more preferably equal to or lower than 0.7, even more preferably equal to or lower than 0.5, and particularly preferably equal to or lower than 0.4.

The mass ratio of the content of the solvent (B) [B/(A+B)] is preferably equal to or higher than 0.1, more preferably equal to or higher than 0.2, and even more preferably equal to or higher than 0.3.

The time for which the filter is immersed in the washing solution is not particularly limited. However, in view of obtaining further improved effects of the present invention, it is preferable that the filter is immersed in the immersion solution for 7 days to 1 year.

The temperature of the immersion solution is not particularly limited. However, in view of obtaining further improved effects of the present invention, the temperature of the immersion solution is preferably equal to or higher than 20° C.

As the container for immersion, it is possible to use the housing that the filter unit in the aforementioned filtering device has. That is, for example, it is possible to use a method of filling the housing with the washing solution in a state where the filter (typically, a filter cartridge) is stored in the housing that the filtering device has and leaving the filter to stand still as it is.

In addition to the above method, for example, it is possible to use a method of preparing a container for immersion in addition to the housing that the filtering device has (that is, preparing a container for immersion on the outside of the filtering device), filling the additionally prepared container for immersion with the washing solution, and immersing the filter in the washing solution.

Particularly, it is preferable to use a method of filling the container for immersion prepared on the outside of the filtering device with the washing solution and immersing the filter in the washing solution, because then the impurities eluted from the filter are not mixed into the filtering device.

The shape and size of the container for immersion are not particularly limited and can be appropriately selected according to the number and size of the filters to be immersed, and the like.

The container for immersion is not particularly limited, and it is preferable that at least a liquid contact portion of the container is formed of the anticorrosive material described above.

The material component of the container for immersion preferably contains at least one kind of material selected from the group consisting of polyfluorocarbon (such as PTFE, PFA: perfluoroalkoxyalkane and PCTFE: polychlorotrifluoroethylene), PPS (polyphenylene sulfide), POM (polyoxymethylene), and polyolefin (PP and PE, etc.), more preferably contains at least one kind of material selected from the group consisting of polyfluorocarbon, PPS, and POM, even more preferably contains polyfluorocarbon, particularly preferably contains at least one kind of material selected from the group consisting of PTFE, PFA, and PCTFE, and most preferably contains PTFE.

Furthermore, it is preferable that the container for immersion is washed before use. During washing, it is preferable to perform washing (so-called pre-washing) by using the washing solution.

(Method of Washing by Passing Washing Solution Through Filter)

The method of washing the filter by passing the washing solution through the filter is not particularly limited. For example, by storing the filter (typically, a filter cartridge) in the filter housing of the filter unit of the filtering device described above and introducing the washing solution into the filter housing, the washing solution is passed through the filter.

During washing, the impurities having adhered to the filter migrate to (typically, dissolve in) the washing solution, and thus the content of impurities in the washing solution increases. Therefore, it is preferable that the washing solution once passed through the filter is discharged out of the filtering device without being reused for washing. In other words, it is preferable not to perform circulation washing.

As another form of the method of washing the filter by passing the washing solution through the filter, for example, there is a method of washing the filter by using a washing device. In the present specification, the washing device means a device different from the filtering device that is provided on the outside of the filtering device. Although the form of the washing device is not particularly limited, it is possible to use a device having the same constitution as that of the filtering device.

As the washing solution which is used in a case where the filter is washed by passing the washing solution through the filter, known washing solutions can be used without particular limitation. Particularly, in view of obtaining further improved effects of the present invention, the form of the washing solution is preferably the same as that of the washing solution used for immersion described above.

<Device Washing Step>

The device washing step is a step of washing the liquid contact portion of the filtering device by using a washing solution before the filtration step. There is no particular limitation on the method of washing the liquid contact portion of the filtering device before the filtration step. Hereinafter, a filtering device will be described for example in which a cartridge filter is used as a filter and stored in a housing disposed on a flow path.

It is preferable that the device washing step includes a step A of washing the liquid contact portion of the filtering device by using a washing solution in a state where the cartridge filter is detached from the housing, and a step B of storing the cartridge filter in the housing after the step A and washing the liquid contact portion of the filtering device by using a washing solution.

Step A

The step A is a step of washing the liquid contact portion of the filtering device by using a washing solution in a state where the cartridge filter is detached from the housing. "In a state where the filter is detached from the housing" means that the liquid contact portion of the filtering device is washed using a washing solution after the filter cartridge is detached from the housing or before the filter cartridge is stored in the housing.

There is no particular limitation on the method of washing the liquid contact portion of the filtering device by using a washing solution in a state where the filter is detached from the housing (hereinafter, also described as "filtering device not storing the filter"). Examples thereof include a method of introducing the washing solution from the inlet portion and collecting the washing solution from the outlet portion.

Particularly, in view of obtaining further improved effects of the present invention, examples of the method of washing the liquid contact portion of the filtering device not storing the filter by using a washing solution include a method of filling the filtering device not storing the filter with a washing solution. In a case where the filtering device not storing the filter is filled with a washing solution, the liquid contact portion of the filtering device not storing a filter contacts the washing solution. As a result, impurities having adhered to the liquid contact portion of the filtering device migrate to (typically, eluted in) the washing solution. After washing, the washing solution may be discharged out of the filtering device (typically, the washing solution may be discharged from the outlet portion).

Washing Solution

As the washing solution, known washing solutions can be used without particular limitation. Particularly, in view of obtaining further improved effects of the present invention, as the washing solution, it is preferable to use the washing solution for immersion of the filter described above.

Step B

The step B is a method of washing the filtering device by using a washing solution in a state where a filter is stored in the housing.

As the method of washing the filtering device by using a washing solution, in addition to the washing method in the step A described above, a method of passing a washing solution through the filtering device can also be used. The method of passing the washing solution through the filtering device is not particularly limited. The washing solution may be introduced from the inlet portion and discharged from the outlet portion. As the washing solution usable in this step, the washing solution used in the step A can be used without particular limitation.

<Electricity Removing Step>

The electricity removing step is a step of removing electricity from the liquid to be purified such that the charge potential of the liquid to be purified is reduced. As the electricity removing method, known electricity removing methods can be used without particular limitation. Examples of the electricity removing method include a method of bringing the liquid to be purified into contact with a conductive material.

The contact time for which the liquid to be purified is brought into contact with a conductive material component is preferably 0.001 to 60 seconds, more preferably 0.001 to 1 second, and even more preferably 0.01 to 0.1 seconds. Examples of the conductive material component include stainless steel, gold, platinum, diamond, glassy carbon, and the like.

Examples of the method of bringing the liquid to be purified into contact with a conductive material include a method of disposing a grounded mesh consisting of a conductive material such that the mesh crosses the flow path and passing the liquid to be purified through the mesh.

<Step of Preparing Liquid to be Purified>

The step of preparing a liquid to be purified is a step of preparing a liquid to be purified that will be caused to flow into the filtering device from the inlet portion of the filtering device. The method of preparing the liquid to be purified is not particularly limited. Typically, examples thereof include a method of purchasing commercial products (for example, those called "high-purity grade products"), a method of reacting one kind or two or more kinds of raw materials so as to obtain a liquid to be purified, a method of dissolving components in a solvent, and the like.

As the method of obtaining a liquid to be purified (typically, a liquid to be purified containing an organic solvent) by reacting the raw materials, known methods can be used without particular limitation. For example, it is possible to use a method of reacting one or two or more raw materials in the presence of a catalyst so as to obtain a liquid to be purified containing an organic solvent.

More specifically, examples thereof include a method of obtaining butyl acetate by reacting acetic acid and n-butanol in the presence of sulfuric acid; a method of obtaining 1-hexanol by reacting ethylene, oxygen, and water in the presence of $Al(C_2H_5)_3$; a method of obtaining 4-methyl-2-pentanol by reacting cis-4-methyl-2-pentene in the presence of Diisopinocampheyl borane ($Ipc_2BH$); a method for obtaining propylene glycol 1-monomethyl ether 2-acetate (PGMEA) by reacting propylene oxide, methanol and acetic acid in the presence of sulfuric acid; a method of obtaining isopropyl alcohol (IPA) by reacting acetone and hydrogen in the presence of copper oxide-zinc oxide-aluminum oxide; a method of obtaining ethyl lactate by reacting lactic acid and ethanol; and the like.

In addition, this step may have a pre-purification step of purifying the liquid to be purified in advance before the liquid is caused to flow into the filtering device. The pre-purification step is not particularly limited, and examples thereof include a method of purifying the liquid to be purified by using a distillation device.

In the pre-purification step, the method of purifying the liquid to be purified by using a distillation device is not particularly limited. Examples thereof include a method of purifying the liquid to be purified in advance by using a distillation device prepared separately from the filtering device so as to obtain a distilled liquid to be purified, storing the liquid in a portable tank, and transporting the tank to the filtering device so as to introduce the liquid into the filtering device, and a method of using a purification device which will be described later.

First, by using FIG. 11, a method (pre-purification step) of purifying the liquid to be purified in advance by using a distillation device prepared separately from the filtering device will be described.

Figure 11:
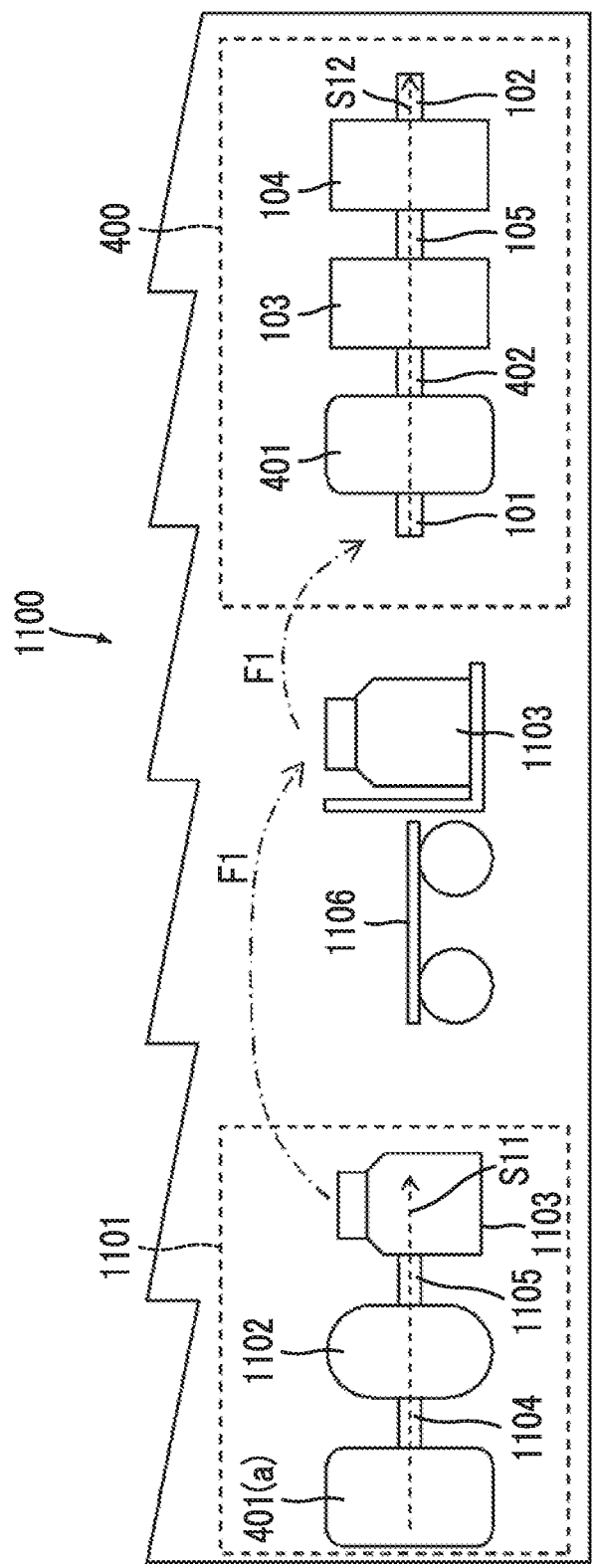
FIG. 11 is a schematic view showing the relationship between the devices in a case where a chemical liquid is manufactured using a distilled liquid to be purified that is purified in advance by a distiller.

FIG. 11 is a schematic view showing the relationship between the devices in a case where a chemical liquid is manufactured using a distilled liquid to be purified that is purified in advance by a distiller.

In FIG. 11, the form of a filtering device 400 is the same as that of the filtering device according to the third embodiment of the present invention described above. Therefore, the filtering device 400 will not be described.

In a chemical liquid manufacturing plant 1100, a filtering device 400 and a distillation device 1101 are arranged. The distillation device 1101 has a tank 401(*a*), a distiller 1102, and a portable tank 1103, which are connected to one another through a piping 1104 and a piping 1105. The tank 401(*a*), the piping 1104, the distiller 1102, the piping 1105, and the portable tank 1103 form a flow path S11.

The form of the tank 401(*a*) and each piping is not particularly limited, and it is possible to use the tank and piping of the same form as described above as the tank and the piping included in the filtering device according to an embodiment of the present invention. As the distiller 1102, it is possible to use the same distiller as the distiller included in the purification device according to an embodiment of the present invention. The form of the distiller 1102 will be described later.

In the distillation device 1101, a liquid to be purified introduced into the tank 401(*a*) is distilled by the distiller 1102, and the obtained distilled liquid to be purified is stored in the portable tank 1103. Although the form of the portable tank is not particularly limited, it is preferable that at least a portion of the liquid contact portion of the tank (preferably 90% or more of the surface area of the liquid contact portion and more preferably 99% or more of the surface area of the liquid contact portion) consists of the anticorrosive material which will be described later.

The distilled liquid to be purified stored in the portable tank 1103 is transported by a transporting unit 1106 (the flow of F1 in FIG. 9). Then, the distilled liquid to be purified is introduced into the filtering device 400 from the inlet portion 101 of the filtering device.

In FIG. 11, an embodiment is described in which a distillation device and a filtering device are arranged in the same manufacturing plant. However, the distillation device and the filtering device may be arranged in different manufacturing plants.

Next, a pre-purification step using a purification device having a distiller and a filtering device will be described. First, the purification device used in this step will be described.

(Purification Device)

The purification device used in this step has the filtering device described above. The purification device according to an embodiment of the present invention has the filtering device described above, a second inlet portion, a second outlet portion, and at least one distiller disposed between the second inlet portion and the second outlet portion, in which the second outlet portion is connected to an inlet portion of the filtering device described above, and a flow path extending from the second inlet portion to the outlet portion of the filtering device is formed. Hereinafter, the purification device will be described with reference to drawings.

In the following section, the details relating to the constitution of the filtering device will not be described because they are the same as those described above.

First Embodiment of Purification Device

Figure 12:
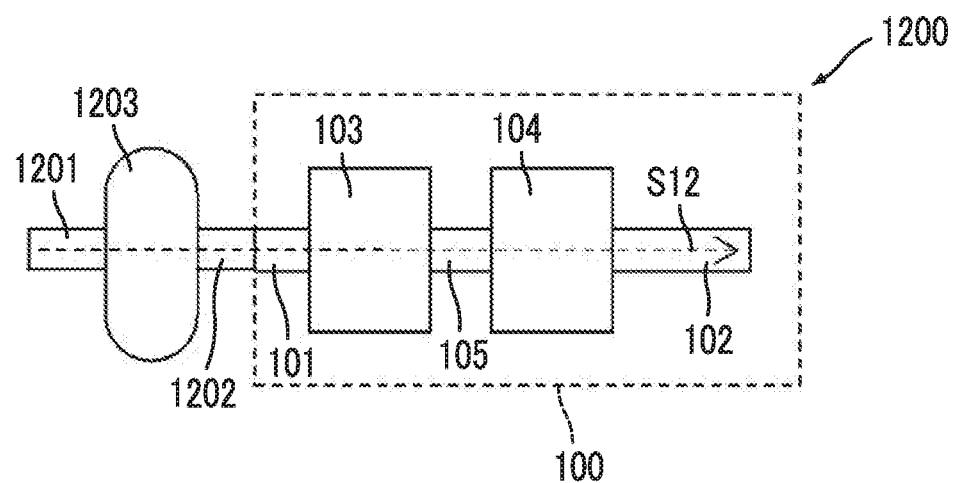
FIG. 12 is a schematic view illustrating a purification device according to the first embodiment of the present invention.

FIG. 12 is a schematic view illustrating a first embodiment of the purification device of the present invention. A purification device 1200 has a second inlet portion 1201, a second outlet portion 1202, and a distiller 1203 disposed between the second inlet portion 1201 and the second outlet portion 1202, in which the second outlet portion 1202 is connected to an inlet portion 101 of the filtering device. Therefore, in the purification device 1200, by the second inlet portion 1201, the distiller 1203, the second outlet portion 1202, the inlet portion 101, the filter 103 (filter A), a piping 105, the filter 104 (filter BD), and the outlet portion 102, a flow path S12 is formed.

That is, the distiller 1203 is connected to the inlet portion 101 of the filtering device 100.

The liquid to be purified having flowed into the purification device 1200 from the second inlet portion 1201 is distilled in the distiller 1203, and then is introduced into the filtering device 100 from the inlet portion 101 through the second outlet portion 1202. In a case where the pre-purification step is performed using the present purification device, the next step (filtration step) can be performed without discharging the distilled liquid to be purified outside the device. Therefore, a chemical liquid having further improved defect inhibition performance can be obtained.

The form of the distiller 1203 is not particularly limited, and known distillers (for example, a distillation column) can be used. As the material of the distiller 1203, it is possible to use the same material as that of the housing described above. Particularly, it is preferable that at least a portion of the liquid contact portion of the distiller 1203 consists of the anticorrosive material which will be described later. It is preferable that 90% or more of the area of the liquid contact portion consists of the anticorrosive material. It is more preferable that 99% of the area of the liquid contact portion consists of the anticorrosive material.

As the distiller, known distillers can be used without particular limitation. The distiller may be a batch type or a continuous type, but is preferably a continuous type. Furthermore, the distiller may be filled with a filler. Although the form of the filler is not particularly limited, it is preferable that at least a part of the liquid contact portion of the distiller consists of the anticorrosive material which will be described later. It is preferable that 90% or more of the area of the liquid contact portion consists of the anticorrosive material. It is more preferable that 99% of the area of the liquid contact portion consists of the anticorrosive material.

In FIG. 12, the purification device 1200 has a filtering device of an embodiment (for example, the first embodiment of the filtering device) in which the filter BU and the filter A are arranged in series in this order between the inlet portion and the outlet portion. However, instead of this, the purification device may have a filtering device of an embodiment (for example, the second embodiment) in which the filter A and the filter BD are arranged in series in this order between the inlet portion and the outlet portion, and a filtering device of an embodiment (for example, a modification example of the second embodiment) in which the filter BU, the filter A, and the filter BD are arranged in series in this order between the inlet portion and the outlet portion.

Furthermore, in the purification device, on the flow path S12 formed of the second inlet portion 1201, the distiller 1203, the second outlet portion 1202, the inlet portion 101, the filter 103, the piping 105, the filter 104, and the outlet portion 102, a return flow path may be formed which is capable of returning the liquid to be purified to the upstream of the filter 103 (filter A) on the flow path S12 from the downstream side of the filter 103 (filter A). The form of the return flow path is not particularly limited, but is the same as that described in the fifth embodiment of the filtering device. In addition, the form of the return flow path may be the same as that described in the sixth embodiment of the filtering device.

Furthermore, the purification device according to the present embodiment may have a tank on the upstream side and/or the downstream side of the filter 103 on the flow path S12. The form of the tank is not particularly limited, and the same tank as that described above can be used.

Second Embodiment of Purification Device

Figure 13:
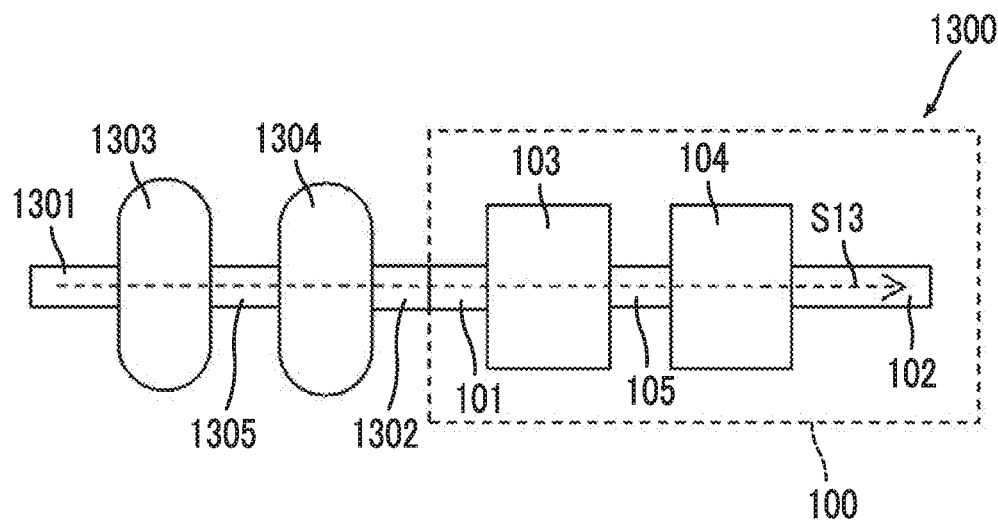
FIG. 13 is a schematic view illustrating a purification device according to the second embodiment of the present invention.

FIG. 13 is a schematic view illustrating a second embodiment of the purification device. A purification device 1300 has a second inlet portion 1301, a second outlet portion 1302, and a distiller 1303 and a distiller 1304 arranged in series between the second inlet portion 1301 and the second outlet portion 1302, in which the second outlet portion 1302 is connected to an inlet portion 101 of the filtering device. Therefore, in the purification device 1300, by the second inlet portion 1301, the distiller 1303, a piping 1305, the distiller 1304, the second outlet portion 1302, the inlet portion 101, the filter 103 (filter A), the piping 105, the filter 104 (filter BD), and the outlet portion 102, a flow path S13 is formed.

That is, in the purification device according to the present embodiment, the distiller includes a plurality of distillers connected in series. In a case where the purification device includes three or more distillers connected in series, the last distiller is connected to the filtering device.

In the purification device 1300, the liquid to be purified flowing from the second inlet portion 1301 is distilled by the distiller 1303, flows through the piping 1305, and is introduced into the distiller 1304. FIG. 13 shows an embodiment in which the distiller 1303 and the distiller 1304 are connected to each other through the piping 1305. However, the purification device according to the present embodiment is not limited thereto, and may additionally have a piping capable of returning the condensate of the distiller 1304 to the distiller 1303.

The purification device according to the present embodiment has two distillers. Therefore, in a case where the operating conditions of the two distillers and the like are appropriately controlled, even though the liquid to be purified contains two or more kinds of compounds having different boiling points, the target compound (chemical liquid) can be purified to higher purity.

In the purification device 1300, between the two distillers connected in series, the latter distiller is connected to one inlet port of the filtering device. However, the purification device according to an embodiment of the present invention is not limited thereto, and in a case where the filtering device has a plurality of inlet ports, different distillation devices may be connected to the inlet ports. In a case where two or more distillers connected in series are regarded as one group, it is possible to adopt an aspect in which the groups are arranged in a line in the flow path of the entire purification device.

[Anticorrosive Material]

Next, an anticorrosive material will be described. In the filtering device and the purification device according to the embodiment of the present invention described so far, it is preferable that at least a portion of the liquid contact portion of the devices is formed of an anticorrosive material. It is preferable that 90% or more of the liquid contact portion is formed of an anticorrosive material. It is more preferable that 99% or more of the liquid contact portion is formed of an anticorrosive material.

The state where the liquid contact portion is formed of an anticorrosive material is not particularly limited. Typically, for example, each member (for example, the tank described so far or the like) is formed of an anticorrosive material, or each member has a base material and a coating layer which is disposed on the base material and formed of an anticorrosive material.

The anticorrosive material is a nonmetallic material or an electropolished metallic material. Examples of the nonmetallic material include, but are not particularly limited to, a polyethylene resin, a polypropylene resin, a polyethylene-polypropylene resin, a tetrafluoroethylene resin, a tetrafluoroethylene-perfluoroalkyl vinyl ether copolymer resin, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, a vinyl fluoride resin, and the like.

The metallic material is not particularly limited, and examples thereof include a metallic material in which the total content of Cr and Ni is greater than 25% by mass with respect to the total mass of the metallic material component. The total content of Cr and Ni is particularly preferably equal to or greater than 30% by mass. The upper limit of the total content of Cr and Ni in the metallic material is not particularly limited, but is preferably equal to or smaller than 90% by mass in general.

Examples of the metallic material include stainless steel, a Ni—Cr alloy, and the like.

As the stainless steel, known stainless steel can be used without particular limitation. Particularly, an alloy with a nickel content equal to or greater than 8% by mass is preferable, and austenite-based stainless steel with a nickel content equal to or greater than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the Ni—Cr alloy, known Ni—Cr alloys can be used without particular limitation. Particularly, a Ni—Cr alloy with a Ni content of 40% to 75% by mass and a Cr content of 1% to 30% by mass is preferable.

Examples of the Ni—Cr alloy include HASTELLOY (trade name, the same will be applied hereinafter), MONEL (trade name, the same will be applied hereinafter), INCONEL (trade name, the same will be applied hereinafter), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, optionally, the Ni—Cr alloy may further contain B, Si, W, Mo, Cu, Co, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the Cr content in a passive layer on the surface thereof may become higher than the Cr content in the parent phase. Therefore, presumably, in a case where a purification device having a liquid contact portion formed of the electropolished metallic material is used, metal impurities containing metal atoms may be hardly eluted into the liquid to be purified.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

[Chemical Liquid]

It is preferable that the chemical liquid manufactured using the aforementioned filtering device is used for manufacturing a semiconductor substrate. Particularly, it is more preferable to use the chemical liquid for forming a fine pattern at a node equal to or smaller than 10 nm (for example, a step including pattern formation using EUV).

In other words, the filtering device is preferably used for manufacturing a chemical liquid for manufacturing a semiconductor substrate. Specifically, the filtering device is preferably used for manufacturing a chemical liquid used for treating an inorganic substance and/or an organic substance after each step is finished or before the next step is started in a semiconductor device manufacturing process including a lithography step, an etching step, an ion implantation step, a peeling step, and the like.

Specifically, the filtering device is preferably used for manufacturing at least one kind of chemical liquid (chemical liquid obtained by purifying an organic liquid to be purified) selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat. In another embodiment, the filtering device is preferably used for manufacturing at least one kind of chemical liquid (chemical liquid obtained by purifying an aqueous liquid to be purified) selected from the group consisting of an aqueous developer, an aqueous rinsing solution, a peeling solution, a remover, an etching solution, an acidic washing solution, phosphoric acid, and a phosphoric acid-aqueous hydrogen peroxide mixture (Sulfuric acid-Hydrogen Peroxide Mixture (SPM)).

In addition, the aforementioned filtering device can also be used for manufacturing a chemical liquid used for rinsing the edge line of a semiconductor substrate before and after the coating with resist.

Furthermore, the aforementioned filtering device can also be used for manufacturing a diluted solution of a resin contained in a resist solution and for manufacturing a solvent contained in a resist solution.

In addition, the aforementioned filtering device can be used for manufacturing a chemical liquid used for purposes other than the manufacturing of a semiconductor substrate. The filtering device can also be used for manufacturing a developer for polyimide, a resist for sensor, and a resist for lens, a rinsing solution, and the like.

Moreover, the filtering device can be used for manufacturing a solvent for medical uses or for washing. Particularly, the filtering device can be used for manufacturing a chemical liquid used for washing containers, piping, base substrates (for example, a wafer and glass), and the like.

Especially, the filtering device is preferably used for manufacturing at least one kind of chemical liquid selected from the group consisting of a prewet solution, a developer, and a rinsing solution for forming a pattern by using extreme (EUV).

[Chemical Liquid Storage Body]

The chemical liquid manufactured by the filtering device may be stored in a container and preserved until the chemical liquid is used. The container and the chemical liquid stored in the container are collectively referred to as chemical liquid storage body. The preserved chemical liquid is used after being taken out of the chemical liquid storage body.

As a container for preserving the chemical liquid, it is preferable to use a container for semiconductor substrate manufacturing, which has a high internal cleanliness and hardly causes the eluate of impurities into the chemical liquid during the preservation of the chemical liquid.

Examples of usable containers include, but are not limited to, a "CLEAN BOTTLE" series manufactured by AICELLO CORPORATION, "PURE BOTTLE" manufactured by KODAMA PLASTICS Co., Ltd., and the like.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

It is preferable that at least a portion of the liquid contact portion of the container consists of the anticorrosive material described above. In view of obtaining further improved effects of the present invention, it is preferable that 90% or more of the area of the liquid contact portion consists of the material described above.

EXAMPLES

Hereinafter, the present invention will be more specifically described based on examples. The material components, the amount and proportion thereof used, the details of treatments, the procedure of treatments, and the like shown in the following examples can be appropriately modified as long as the gist of the present invention is maintained. Accordingly, the scope of the present invention is not limited to the following examples.

For preparing chemical liquids of examples and comparative examples, the handling of containers, the preparation of chemical liquids, filling, preservation, and analytical measurement were all performed in a clean room of a level satisfying ISO class 2 or 1. In order to improve the measurement accuracy, in the process of measuring the content of the organic impurities and the content of metal atoms, in a case where the content of the organic impurities or metal atoms was found to be equal to or smaller than a detection limit by general measurement, the chemical liquid was concentrated by 1/100 in terms of volume for performing the measurement, and the content was calculated by converting the concentration into the concentration of the chemical liquid not yet being concentrated. The tools such as a device or a filter used for purification and a container were used after the surface contacting the chemical liquid was thoroughly washed with a chemical liquid purified in advance by the same method.

Test Example 1: Purification of Organic Liquid to be Purified and Performance Evaluation of Chemical Liquid A chemical liquid 1 was manufactured using the purification device shown in FIG. 14. The purification device in FIG. 14 has, between an inlet portion and an outlet portion, a filtering device including a filter BU-1, a tank TU-1, a filter BU-2, a filter F-A, a filter BD-1, a tank TD-1, and a filter BD-2 that are connected in series and a distiller connected to the front portion of the filtering device (duplex distiller consisting of D1 and D2, described as "duplex" in the following tables). Each of the units forms a flow path S-14 together with the piping. In the flow path S-14, a return flow path R-14 is formed which is capable of returning the liquid to be purified to the upstream side of the filter F-A from the downstream side (tank TD-1) of the filter F-A in the flow path S-14 (the filter F-A corresponds to the filter A described above).

The tables show the material components contained in the filters used for manufacturing the chemical liquid 1 and the pore size of the filters. The filters were used after being immersed in PGMEA for one day.

Abbreviations for the material components of each filter in the tables are as follows.

Filter X1

With reference to the description in paragraphs "0133" to "0139" of JP2016-155121A, a porous membrane containing polyimide-based resins having different imidization ratios was prepared. Specifically, by adjusting the particle size of the fine particles to be used and the like, the pore size was controlled, and by adjusting the treatment temperature, treatment time, pH, baking temperature and/or rebaking temperature, and the like in the chemical etching step, the imidization ratio was controlled. The pore size and imidization ratio of the filter X1 are shown in the table.

Filter X2 to Filter X8 and Filter 2

A filter X2 to a filter X8 and a filter 2 were prepared by the same method as that used for preparing the filter 1, except that the particle size of fine particles and the chemical etching conditions were adjusted to obtain the pore size and imidization ratio described in the table. The pore size and imidization ratio of each filter are as described in the table.

Filter Y1

With reference to the description in paragraphs "0223" and "0234" to "0239" of JP2017-068262A, a porous membrane containing a polyimide-based resin was prepared. The pore size and imidization ratio thereof are shown in the table. By adjusting the particle size of the fine particles used and the like, the pore size was controlled. Furthermore, by adjusting the baking temperature and/or rebaking temperature and the like, the imidization ratio was controlled. The pore size and imidization ratio of the filter Y1 are shown in the table.

Filter Y2 to Filter Y6

A filter Y2 to a filter Y6 were prepared by the same method as that used for preparing the filter 1, except that the particle size of fine particles used, the baking temperature and/or rebaking temperature, and the like were adjusted to obtain the pore size and imidization ratio described in the table. The pore size and imidization ratio of each filter are as described in the table.

Filter R

With reference to the description in paragraphs "0019" to "0027" of JP2016-538122A, a filter R as a porous membrane containing a polyimide-based resin was manufactured. The manufactured porous membrane was described as "Example 2d" in the table in paragraph "0019" of JP2016-538122A. Because the porous membrane had a structure in which the imidization ratio changes in the film thickness direction, the average of all the imidization ratios in the porous membrane was calculated. The pore size and imidization ratio thereof are shown in the table.

Filter S

With reference to the description in paragraphs "202" and "203" of JP2018-020301A, a filter S as a porous membrane containing a polyimide-based resin was manufactured. The manufactured porous membrane was described as Example 1 in JP2018-020301A. The pore size, B value, and imidization ratio thereof are shown in the following table.

Filter T

With reference to the description in paragraphs "202" and "203" of JP2018-020301A, a filter T as a porous membrane containing a polyimide-based resin was manufactured. The manufactured porous membrane was described as Example 2 in JP2018-020301A. The pore size, B value, and imidization ratio thereof are shown in the table.

PP: polypropylene

IEX: a filter obtained by introducing an ion exchange group consisting of a sulfonic acid group into a base material made of polyethylene.

Nylon: nylon

UPE: ultra-high-molecular-weight polyethylene

PTFE: polytetrafluoroethylene

Abbreviations relating to the liquid to be purified in the tables are as follows.

PGMEA: propylene glycol monomethyl ether acetate

PGMEA/PGME (7:3): a mixture of PGMEA and PGME at a ratio of 7:3 (based on volume)

nBA: butyl acetate

PC/PGMEA (1:9): a mixture of PC and PGMEA at a ratio of 1:9 (based on volume)

PGME: propylene glycol monoethyl ether

MIBC: 4-methyl-2-pentanol

CHN: cyclohexanone iAA: isoamyl acetate

A commercial high-purity grade "PGMEA" was purchased as the liquid to be purified, and purified using the purification device described above. During the purification, by using the return flow path R-14, circulation filtration was performed three times through each return flow path, thereby obtaining the chemical liquid 1.

[Manufacturing of Chemical Liquids 2 to 92]

Each of the liquids to be purified described in the table was purified using a purification device (or a filtering device) described in the table, thereby obtaining chemical liquids. The purification devices (or filtering devices) are shown in FIGS. 15 to 30. The material components contained in the filter F-A, the filters BU-1 and BU-4, and the filters BD-1 and BD-2, and the pore sizes of the filters are as shown in the table. During the purification of the liquid to be purified, a liquid that was filtered using a filtering device, in which a return flow path represented by R-(number) was formed, and described as "performed" in the column of "Circulation" in the table was subjected to circulation filtration three times through each return flow path.

In addition, the SP value of each of the liquids to be purified is also described in the table. In the table, "-" means that the filter was not used. The same is true of other tables in the present specification.

<Pre-Washing of Filter>

In the column of "Pre-washing of filter" in the table, the conditions of pre-washing for each filter are described. "PGMEA 1 day immersion" means that the filter was used after being immersed for 1 day in high-purity grade PGMEA. In addition, "-" in the same column shows that the filter was not pre-washed.

Furthermore, "specific washing solution 1 (10 h immersion)" means that the filter was used after being immersed in the following specific washing solution 1 for 10 hours. "Specific washing solution 2 (20 h immersion)" means that the filter was used after being immersed in the following specific washing solution 2 for 20 hours. "Specific washing solution 3 (10 h immersion)" means that the filter was used after being immersed in the following specific washing solution 3 for 10 hours. "Specific washing solution 4 (20 h immersion)" means that the filter was used after being immersed in the following specific washing solution 4 for 20 hours. "Specific washing solution 5 (10 h immersion)" means that the filter was used after being immersed in the following specific washing solution 5 for 10 hours.

(Specific Washing Solution)

Specific washing solution 1: dimethylacetamide/butyl acetate (mixing ratio based on volume) 60/40

Specific washing solution 2: dimethylacetamide/cyclohexanone/propylene glycol monomethyl ether (mixing ratio based on volume) 60/30/10

Specific washing solution 3: dimethylformamide/ethyl lactate (mixing ratio based on volume) 60/40

Specific washing solution 4: N-methylpyrrolidone/cyclohexanone (mixing ratio based on volume) 70/30

Specific washing solution 5: dimethylacetamide/2-heptanone (mixing ratio based on volume) 70/30

Evaluation 1: Evaluation of Residue Defect Inhibition Performance and Stain-Like Defect Inhibition Performance of Chemical Liquid A silicon wafer (Bare-Si) having a diameter of about 300 mm was coated with the chemical liquid 1, thereby obtaining a wafer coated with a chemical liquid. The used device was Lithius ProZ, and the coating conditions were as follows.

Amount of chemical liquid used for coating: 2 ml

Rotation speed of silicon wafer during coating: 2,200 rpm, 60 sec

Then, by using a wafer inspection device "SP-5" manufactured by KLA-Tencor Corporation. and a fully automatic defect review/classification device "SEMVision G6" manufactured by Applied Materials, Inc, the number of defects having a size equal to or greater than 19 nm existing on the entire surface of the wafer and the composition of the defects were investigated.

The total number of defects measured using SP-5 was counted as the number of residue defects, and the shape of the defects was observed using G6. The (stain-like) defects that were not in the form of particles were counted as stain-like defects. The results were evaluated based on the following standard. The evaluation results are shown in the table.

The smaller the number of defects present on the wafer, the better the defect inhibition performance of the chemical liquid. In the following evaluation, "number of defects" means the total number of residue defects and stain-like defects. The chemical liquids 2 to 92 were evaluated by the same method as the above method. The results are shown in the table.

AA The number of defects was equal to or smaller than 30/wafer.
A The number of defects was greater than 30/wafer and equal to or smaller than 50/wafer.
B The number of defects was greater than 50/wafer and equal to or smaller than 100/wafer.
C The number of defects was greater than 100/wafer and equal to or smaller than 200/wafer.
D The number of defects was greater than 200/wafer and equal to or smaller than 500/wafer.
E The number of defects was greater than 500/wafer.

[Evaluation 2: Bridge Defect Inhibition Performance]

By using the chemical liquid 1 as a prewet solution, the bridge defect inhibition performance of the chemical liquid was evaluated. First, a resist resin composition used will be described.

Resist Resin Composition 1

The resist resin composition 1 was obtained by mixing together the following components.

Acid-decomposable resin (resin represented by the following formula (weight-average molecular weight (Mw) 7500): the numerical value described in each repeating unit means mol %): 100 parts by mass

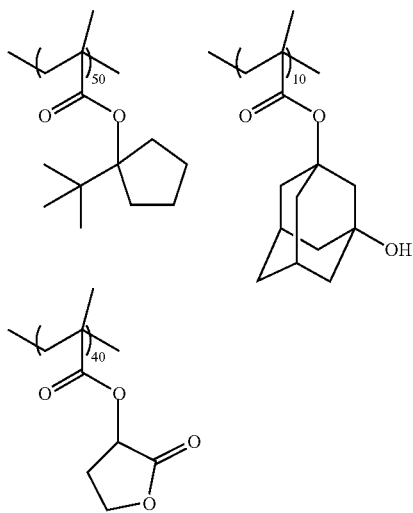

The following photoacid generator: 8 parts by mass

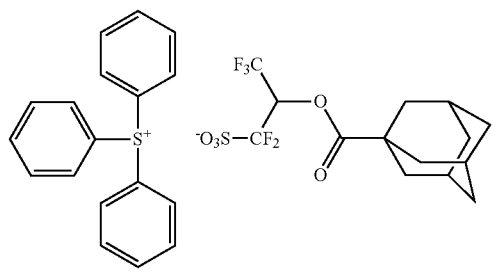

The following quencher: 5 parts by mass (the mass ratio was 0.1:0.3:0.3:0.2 in this order from the left).

Among the following quenchers, a polymer-type quencher has a weight-average molecular weight (Mw) of 5,000. The numerical value described in each repeating unit means molar ratio.

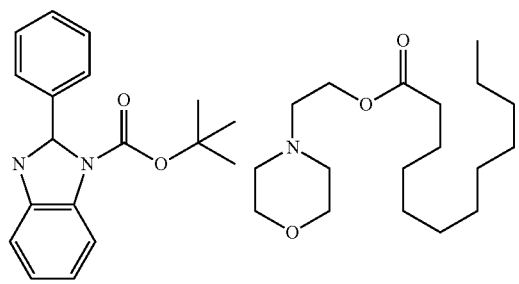

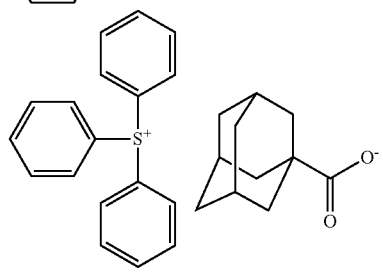

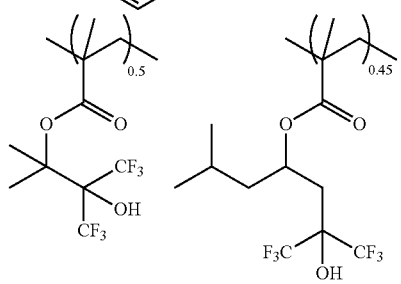

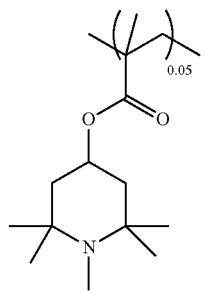

Hydrophobic resins shown below: 4 parts by mass (mass ratio: (1):(2)=0.5:0.5)

Among the following hydrophobic resins, the hydrophobic resin represented by Formula (1) has a weight-average molecular weight (Mw) of 7,000, and the hydrophobic resin represented by Formula (2) has a weight-average molecular weight (Mw) of 8,000. In each of the hydrophobic resins, the numerical value described in each repeating unit means molar ratio.

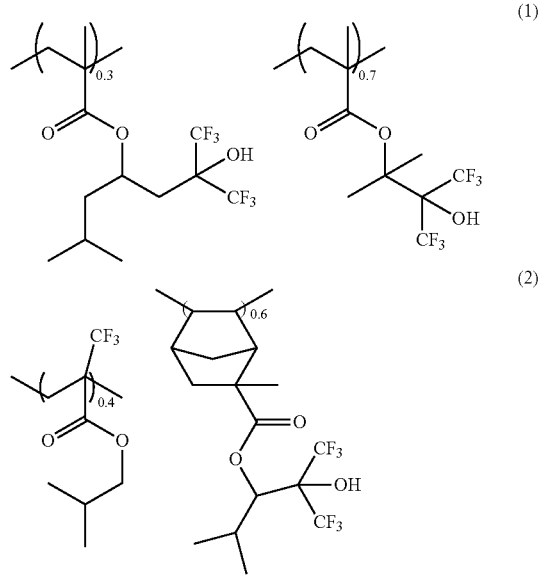

Solvent:
PGMEA (propylene glycol monomethyl ether acetate): 3 parts by mass
Cyclohexanone: 600 parts by mass
γ-BL (γ-butyrolactone): 100 parts by mass
Test Method Next, the test method will be described. First, a silicon wafer having a diameter of about 300 mm was pre-wet with the chemical liquid 1, and then the pre-wet silicon wafer was spin-coated with the resist resin composition described above. Thereafter, the wafer was heated and dried at 150° C. for 90 seconds on a hot plate, thereby forming a resist film having a thickness of 9 μm.

For the resist film, in order that a pattern having a line width of 30 nm and a space width of 30 nm was formed after reduction projection exposure and development, by using an ArF excimer laser scanner (manufactured by ASML, PAS5500/850C, wavelength: 248 nm), pattern exposure was performed under the exposure conditions of NA=0.60 and σ=0.75 through a mask having a line-and-space pattern. After being irradiated, the resist film was baked for 60 seconds at 120° C. Subsequently, the resist film was developed, rinsed, and then baked for 60 seconds at 110° C., thereby forming a resist pattern having a line width of 30 nm and a space width of 30 nm.

By using a critical dimension SEM (CG4600, manufactured by Hitachi High-Technologies Corporation), 100 shots of the resist pattern were captured. The number of defects in the form of a crosslink between patterns (bridge defects) was counted, and the number of defects per unit area was determined. The results were evaluated based on the following standard. The evaluation results are shown in the table. Note that the smaller the number of defects in the form of a crosslink between patterns, the better the bridge defect inhibition performance of the chemical liquid.

For the chemical liquids 2 to 92, those described as "Pre-wetting" in the column of "Evaluation method" in the table were evaluated in terms of the bridge defect inhibition performance by the same method as that used for the chemical liquid 1. The chemical liquids described as "Developer" in the column of "Evaluation method" in the table were evaluated in terms of the bridge defect inhibition performance according to the same procedure as that used for evaluating the chemical liquid 1, except that the chemical liquids were not subjected to pre-wetting described in the procedure for evaluating the chemical liquid 1, and the chemical liquids described in the table were used as a developer. The chemical liquids described as "Rinsing" in the column of "Evaluation method" in the table were evaluated in terms of the bridge defect inhibition performance according to the same procedure as that used for evaluating the chemical liquid 1, except that the chemical liquids were not subjected to pre-wetting described in the procedure for evaluating the chemical liquid 1, and the chemical liquids described in the table were used as a rinsing solution. The results are shown in the table.

AA The number of bridge defects was less than $1/cm^2$.

A The number of bridge defects was equal to or greater than $1/cm^2$ and less than $2/cm^2$.

B The number of bridge defects was equal to or greater than $2/cm^2$ and less than $5/cm^2$.

C The number of bridge defects was equal to or greater than $5/cm^2$ and less than $10/cm^2$.

D The number of bridge defects was equal to or greater than $10/cm^2$ and less than $15/cm^2$.

E The number of bridge defects was equal to or greater than $15/cm^2$.

Evaluation 3: Uniformity of Pattern Width

By using a critical dimension SEM (CG4600, manufactured by Hitachi High-Technologies Corporation), 100 shots of the resist pattern were captured, and the absolute value of a difference between an average Line Width Roughness (LWR) and a maximum (or minimum) line width was determined. The results were evaluated based on the following standard. The evaluation results are shown in the table. Note that the smaller the "absolute value of difference", the better the uniformity of the pattern width formed using the chemical liquid. "Absolute value of the difference between the average line width and the maximum (minimum) line width" means that between the difference between the average LWR and the maximum line width and the difference between the average LWR and the minimum line width, the larger one in terms of absolute value was used to evaluate the pattern width uniformity.

AA The absolute value of a difference between the average line width and the maximum (minimum) line width was less than 2% with respect to the average.

A The absolute value of a difference between the average line width and the maximum (minimum) line width was equal to or greater than 2% and less than 5% with respect to the average.

B The absolute value of a difference between the average line width and the maximum (minimum) line width was equal to or greater than 5% and less than 10% with respect to the average.

C The absolute value of a difference between the average line width and the maximum (minimum) line width was equal to or greater than 10% and less than 20% with respect to the average.

D The absolute value of a difference between the average line width and the maximum (minimum) line width was equal to or greater than 20% with respect to the average.

E The line width could not be measured in some of the shots.

Evaluation 4: Evaluation of Pot Life of Filter

Figure 24:
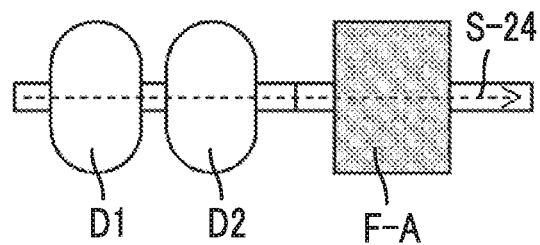
FIG. 24 is a schematic view illustrating a purification device according to a conventional technique.

The liquid to be purified was continuously purified using each of the purification devices (or filtering devices) described in the table. After the liquid to be purified was passed and the purification device (or filtering device) was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the residue defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life obtained in a case where the filtering device described in FIG. 24 was used was regarded as 1, and the pot life of the filter of each device was evaluated based on a ratio to 1. The results were evaluated based on the following standard. The evaluation results are shown in the table. The evaluation result obtained using the device in FIG. 24 is described as "Standard".

AA The pot life was equal to or longer than 10.
A The pot life was equal to or longer than 5 and less than 10.
B The pot life was equal to or longer than 2 and less than 5.
C The pot life was longer than 1 and less than 2.
D The pot life was equal to or shorter than 1.

Test Example 2: Purification of Aqueous Liquid to be Purified and Evaluation of Performance of Chemical Liquid

[Manufacturing of Chemical Liquid 201 and Chemical Liquid 202]

Sulfuric acid-Hydrogen Peroxide Mixture (SPM) and an aqueous phosphoric acid solution (phosphoric acid content: 85% by mass) were purchased and prepared as a liquid to be purified. SPM is a 4:1 mixture (based on volume) of sulfuric acid and hydrogen peroxide.

Figure 20:
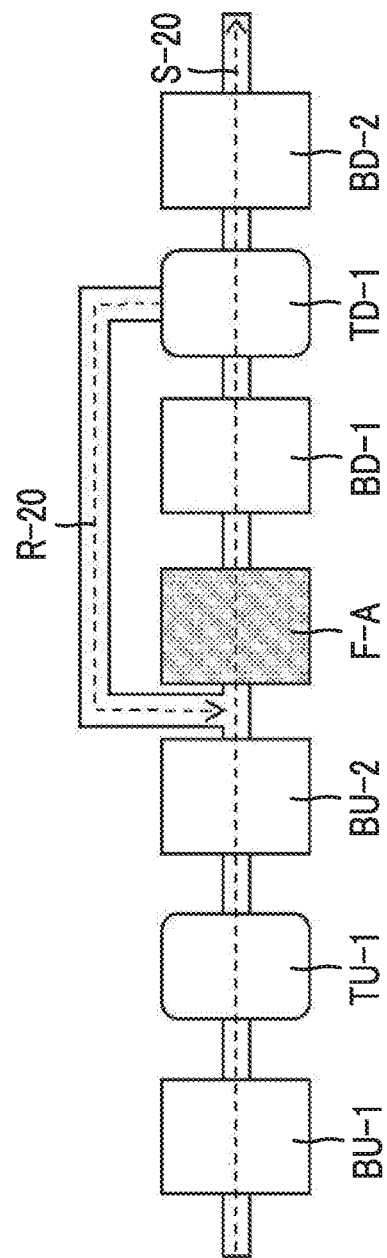
FIG. 20 is a schematic view illustrating a filtering device according to an embodiment of the present invention.

Then, chemical liquids 201 and 202 were manufactured using the filtering device described in FIG. 20. In the filtering device shown In FIG. 20, a filter BU-1, a tank TU-1, a filter BU-2, a filter F-A, a filter BD-1, a tank TD-1, and a filter BD-2 are connected in series between an inlet portion and an outlet portion so as to form a flow path S-20. Furthermore, in the filtering device shown in FIG. 20, a return flow path R-20 was formed which is capable of returning a liquid to be purified from the downstream side of the filter F-A from the downstream side of the filter BD-1, and circulation filtration of the liquid to be purified was performed three times.

The following table shows the material components contained in each of the filters in the filtering device shown in FIG. 20 and the pore size of the filters.

The abbreviations relating to the material components of the filters in the table will not be described because they are the same as those described above.

[Manufacturing of Chemical Liquid 203 and Chemical Liquid 204]

Figure 25:
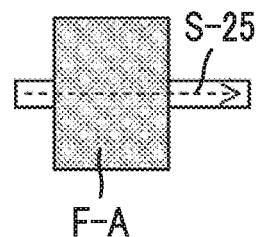
FIG. 25 is a schematic view illustrating a filtering device according to a conventional technique.

A chemical liquid 203 and a chemical liquid 204 were manufactured by the same method as that used for manufacturing the chemical liquid 201 and the chemical liquid 202, except that a filtering device (with a filter F-A and a flow path S-25) illustrated in FIG. 25 was used instead of the filtering device illustrated in FIG. 20. The material components of the filter F-A and the like are shown in the table. During the manufacturing of the chemical liquids, circulation filtration was not performed.

Evaluation 1: Evaluation of Defect Inhibition Performance of Chemical Liquid (Particle Defects and Stain-Like Defects)

A bare silicon wafer having a diameter of about 300 mm was prepared, and 100 ml of each chemical liquid was jetted at a jetting frequency of 5 ml/s for 20 seconds to the wafer that was rotating under the condition of 500 rpm. Thereafter, the wafer was rotated at 2,000 rpm for 30 seconds to perform a spin dry treatment. The resulting wafer was used as a wafer for evaluation. Then, by using a wafer inspection device "SP-5" manufactured by KLA-Tencor Corporation. and a fully automatic defect review/classification device "SEMVision G6" manufactured by Applied Materials, Inc, the number of defects having a size equal to or greater than 26 nm existing on the entire surface of the wafer and the composition of the defects were investigated.

Among the measured defects, particle-like foreign substances were counted as particle defects, and others are counted as stain-like defects. The defect inhibition performance was evaluated based on the following standard. The results are shown in the columns of "particle defect inhibition performance" and "Stain-like defect inhibition performance" in the table. "Number of defects" means the total number of particle defects and stain-like defects.

A The number of defects was equal to or smaller than 50/wafer.
B The number of defects was greater than 50/wafer and equal to or smaller than 300/wafer.
C The number of defects was greater than 300/wafer.

Evaluation 2: Evaluation of Pot Life of Filter

The liquid to be purified was continuously purified using each of the filtering devices described in the table. After the liquid to be purified was passed and the filtering device was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the particle defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life obtained in a case (chemical liquid 203) where the filtering device described in FIG. 25 was used was regarded as 1, and the pot life of the filter of each device was evaluated based on a ratio to 1. The results were evaluated based on the following standard. The evaluation results are shown in the table. For the chemical liquid 203, "Standard" is listed in the column showing the evaluation result.

A The pot life was equal to or longer than 10.

B The pot life was equal to or longer than 5 and less than 10.

C The pot life was longer than 1 and less than 5.

D The pot life was equal to or shorter than 1.

Test Example 3: Manufacturing of Chemical Liquid as Resist Resin Composition and Evaluation of Performance of Chemical Liquid

[Manufacturing of Chemical Liquid 301]

A resist resin composition 2 containing the following components was prepared as a liquid to be purified.

Resin A-2 synthesized by the following method: 0.79 g

<Resin (A-2)>

Synthesis of Resin (A-2)

A 2 L flask was filled with 600 g of cyclohexanone and then subjected to nitrogen purging for 1 hour at a flow rate of 100 mL/min. Thereafter, 0.02 mol of a polymerization initiator V-601 (manufactured by Wako Pure Chemical Industries, Ltd.) was added thereto, and the flask was heated until the internal temperature became 80° C. Subsequently, the following monomers 1 to 3 and 0.02 mol of a polymerization initiator V-601 (manufactured by Wako Pure Chemical Industries, Ltd.) were dissolved in 200 g of cyclohexanone, thereby preparing a monomer solution. The monomer solution was added dropwise for 6 hours to the flask heated to 80° C. After the dropwise addition ended, the reaction was further performed at 80° C. for 2 hours.

Monomer 1: 0.3 mol

Monomer 2: 0.6 mol

Monomer 3: 0.1 mol

Monomer 1

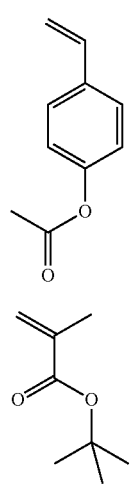

Monomer 2

Monomer 3

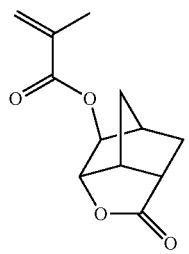

The reaction solution was cooled to room temperature and added dropwise to 3 L of hexane so as to precipitate a polymer. The filtered solids were dissolved in 500 mL of acetone, added dropwise again to 3 L of hexane, and the filtered solids were dried under reduced pressure, thereby obtaining a copolymer (A-2) of the monomers 1 to 3.

A reaction container was filled with 10 g of the polymer obtained as above, 40 mL of methanol, 200 mL of 1-methoxy-2-propanol, and 1.5 mL of concentrated hydrochloric acid, and the mixture was heated to 80° C. and stirred for 5 hours. The reaction solution was left to cool to room temperature and added dropwise to 3 L of distilled water. The filtered solids were dissolved in 200 mL of acetone, added dropwise again to 3 L of distilled water, and the filtered solids were dried under reduced pressure, thereby obtaining a resin (A-2) (8.5 g). The weight-average molecular weight (Mw) of the resin measured by gel permeation chromatography (GPC) (solvent: THF (tetrahydrofuran)) and expressed in terms of standard polystyrene was 12,300, and the molecular weight dispersity (Mw/Mn) of the resin was 1.51.

The composition (molar ratio) of the resin was calculated by $^1$H-NMR (nuclear magnetic resonance) measurement. The weight-average molecular weight (Mw: in terms of polystyrene) and the dispersity (Mw/Mn) of the resin were calculated by GPC (solvent: THF) spectroscopy.

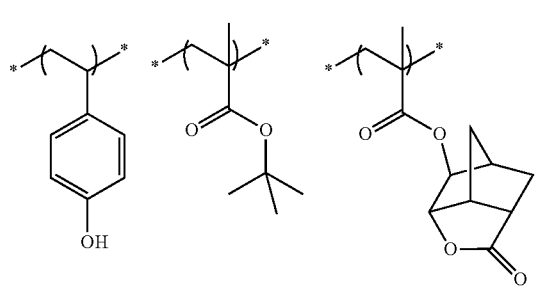

The composition of the resin A-2 was 30/60/10 (molar ratio) in this order from the constitutional unit at the very left. The resin A-2 had a weight-average molecular weight (Mw) of 12,300 and Mw/Mn of 1.51.

The following aid generator (B-2): 0.18 g

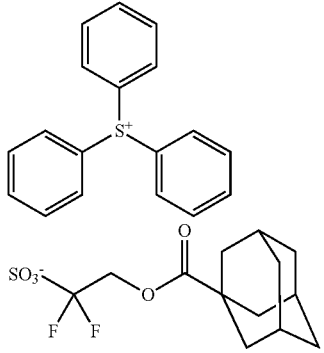

(B-2)

The following basic compound (E-1): 0.03 g

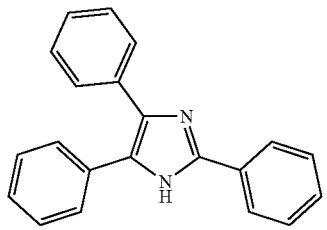

(E-1)

Figure 26:
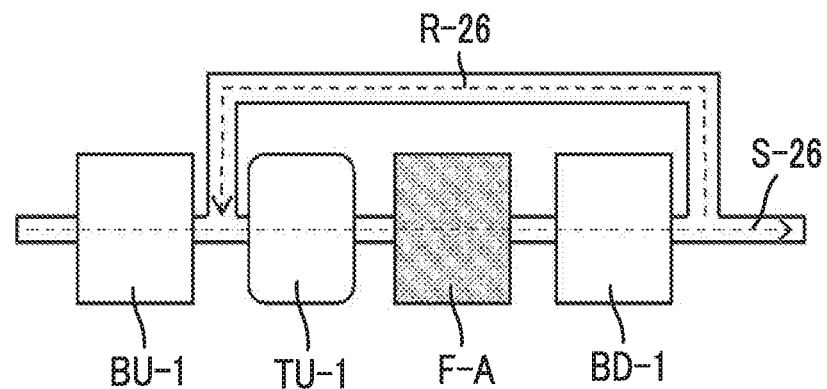
FIG. 26 is a schematic view illustrating a filtering device according to an embodiment of the present invention.

Propylene glycol monomethyl ether acetate: 45 g
Propylene glycol monomethyl ether: 30 g A chemical liquid 301 was manufactured using the filtering device illustrated in FIG. 26. In the filtering device in FIG. 26, a filter BU-1, a tank TU-1, a filter F-A, and a filter BD-1 are connected in series between an inlet portion and an outlet portion. The units form a flow path S-26 together with piping. Furthermore, a return flow path R-26 is formed which is capable of returning a liquid to be purified to a position, which is on the downstream side of the filter BU-1 and on the upstream side of the tank TA-1, from the downstream side of the filter BD-1. The liquid to be purified was returned by the return flow path R-26 and then subjected to circulation filtration three times.

The following table shows the material components contained in the filters used for purification and the pore sizes of the filters.

[Manufacturing of Chemical Liquid 302, Chemical Liquid 303, Chemical Liquid 310, and Chemical Liquid 311]

A chemical liquid 302, chemical liquid 303, chemical liquid 310, and chemical liquid 311 were manufactured by the same method as that used for manufacturing the chemical liquid 301, except that the filtering device described in the table was used. During the manufacturing of the chemical liquid 303, circulation filtration was not performed.

[Manufacturing of Chemical Liquid 304]

A resist resin composition 3 containing the following components was prepared as a liquid to be purified.

Resin A-14 synthesized by the following method: 0.785 g
<Resin (A-14)>

Synthesis of Resin (A-14)

A resin (A-14) having the following structure was obtained by the same method as that used for synthesizing the resin (A-2), except that the used monomer was changed.

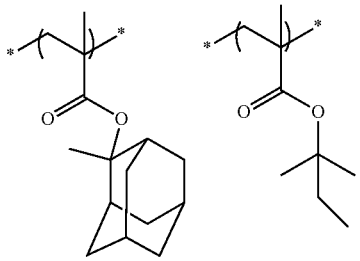

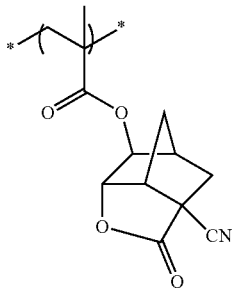

The composition of the resin A-14 was 20/40/40 (molar ratio) in this order from the constitutional unit at the very left. The resin A-14 had a weight-average molecular weight (Mw) of 11,000 and Mw/Mn of 1.45.

The following acid generator (B-9): 0.18 g

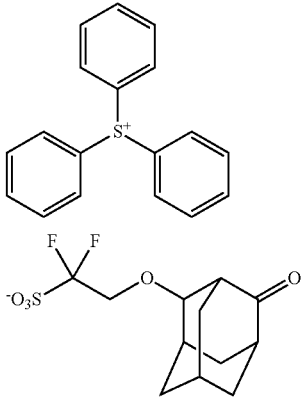

(B-9)

The following basic compound (E-2): 0.03 g

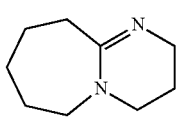

(E-2)

Propylene glycol monomethyl ether acetate: 45 g
Cyclohexanone: 30 g

The following hydrophobic resin (3b) shown below: 0.005 g

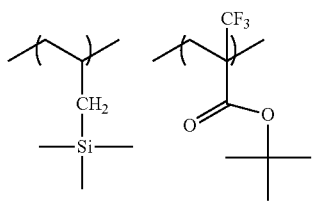

(3b)

A chemical liquid 304 was manufactured using the filtering device illustrated in FIG. 26. In the filtering device in FIG. 26, a filter BU-1, a tank TU-1, a filter F-A, and a filter BD-1 are connected in series between an inlet portion and an outlet portion. The units form a flow path S-26 together with piping. Furthermore, a return flow path R-26 is formed which is capable of returning a liquid to be purified to a position, which is on the downstream side of the filter BU-1 and on the upstream side of the tank TU-1, from the downstream side of the filter BD-1. The liquid to be purified was returned by the return flow path R-26 and then subjected to circulation filtration three times.

The table shows the material components contained in the filters used for purification and the pore sizes of the filters.

[Manufacturing of Chemical Liquid 305, Chemical Liquid 306, Chemical Liquid 312, and Chemical Liquid 313]

A chemical liquid 305, chemical liquid 306, chemical liquid 312, and chemical liquid 313 were manufactured by the same method as that used for manufacturing the chemical liquid 304, except that the filtering device described in the table was used. During the manufacturing of the chemical liquid 306, circulation filtration was not performed.

[Manufacturing of Chemical Liquid 307]

A resist resin composition 4 containing the following components was prepared as a liquid to be purified.

A resist resin composition 4 containing the following components was prepared as a liquid to be purified.

Resin (A-1)-3 synthesized by the following method: 97% by mass

<Resin (A-1)-3>

The resin (A-1)-3 was synthesized with reference to the description in paragraphs "0131" to "0134" of JP2009-265609A. The repeating units of the resin (A-1)-3 are represented by the following formulas, and the composition (molar ratio) thereof is 50/40/10 from the left. The resin (A-1)-3 had a weight-average molecular weight of 20,000 and a dispersity represented by Mw/Mn of 1.57.

(A-1)-3

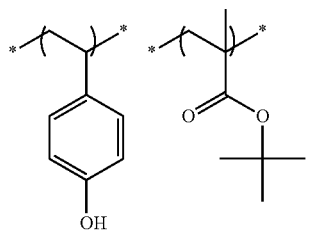

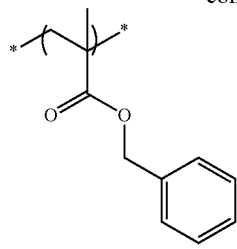

The following acid generator (B-35): 2.5% by mass (B35)

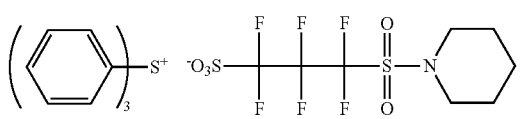

C-1 dicyclohexylmethylamine: 0.4% by mass

D-1 fluorine-based surfactant, MEGAFACE F-176 (manufactured by DIC Corporation): 0.1% by mass Here, the content of (A-1)-3 to D-1 means the content in the solid contents of the resist resin composition 4 based on mass.

Solvent

Propylene glycol monomethyl ether acetate: 80% by mass
Propylene glycol monomethyl ether: 20% by mass Here, the content of the solvent means the content of each solvent in the solvents contained in the resist resin composition 4 (content determined by regarding the total mass of the solvents as 100% by mass). The solid contents of the resist resin composition 4 were adjusted to 10% by mass.

A chemical liquid 307 was manufactured using the filtering device illustrated in FIG. 26. In the filtering device in FIG. 26, a filter BU-1, a tank TU-1, a filter F-A, and a filter BD-1 are connected in series between an inlet portion and an outlet portion. The units form a flow path S-26 together with piping. Furthermore, a return flow path R-26 is formed which is capable of returning a liquid to be purified to a position, which is on the downstream side of the filter BU-1 and on the upstream side of the tank TU-1, from the downstream side of the filter BD-1. The liquid to be purified was returned by the return flow path R-26 and then subjected to circulation filtration three times.

The table shows the material components contained in the filters used for purification and the pore sizes of the filters.

[Manufacturing of Chemical Liquid 308 and Chemical Liquid 309]

A chemical liquid 308 and chemical liquid 309 were manufactured by the same method as that used for manufacturing the chemical liquid 307, except that the filtering device described in the table was used. During the manufacturing of the chemical liquid 309, circulation filtration was not performed.

[Evaluation of Defect Inhibition Performance of Chemical Liquid: Defect Inhibition Performance During EUV Exposure]

By using the chemical liquids 301 to 303 and the chemical liquids 310 and 311, the defect inhibition performance (post-development defect inhibition performance and bridge defect inhibition performance) of the chemical liquids was evaluated by the following operation. EUV exposure refers to a pattern forming method by exposure using EUV.

A 12-inch silicon wafer was coated with each of the chemical liquids 301 to 303 and the chemical liquids 310 and 311 and baked for 60 seconds under the condition of 120° C., thereby forming a resist film having a film thickness of 40 nm.

(Exposure Conditions for Evaluating Post-Development Defect Inhibition Performance)

The wafer prepared as above was subjected to EUV exposure using a dipole lighting (Dipole 60×, outer sigma 0.81, inner sigma 0.43) at a lens numerical aperture (NA) of 0.25. Specifically, the entire surface of the negative resist was exposed at an exposure amount of 1 mJ/cm$^2$ without using a mask.

(Exposure Conditions for Evaluating Bridge Defect Inhibition Performance)

The wafer prepared as above was subjected to EUV exposure using Quasar lighting (Quasar 45, outer sigma 0.81, inner sigma 0.51) at a lens numerical aperture (NA) of 0.25. Specifically, through a mask including a pattern (for evaluating C/H removability) for forming a contact hole pattern with dimensions of a pitch of 60 nm and a hole size of 30 nm on a wafer and a line-and-space (LS) pattern with a line width of 22 nm and a pitch of 50 nm, the exposure amount was adjusted, and then the entire surface of the wafer was subjected to EUV expose at an exposure amount yielding a line width of 22 nm.

(Development Conditions)

Immediately after the exposure was performed under the above conditions, the wafer was baked for 60 seconds under the condition of 100° C.

Thereafter, by using a shower-type developing machine (ADE3000S manufactured by ActesKyosan inc.), the developer (23° C.) was sprayed and jetted to the wafer, which was rotating at 50 rpm, for 30 seconds at a flow rate of 200 mL/min so as to perform development, thereby obtaining a sample for evaluation.

Evaluation 1: Evaluation of Bridge Defect Inhibition Performance

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in the table.

AA: The number of defects was equal to or smaller than 10 (number/visual field).

A: The number of defects was greater than 10 (number/visual field) and equal to or smaller than 30 (number/visual field).

B: The number of defects was greater than 30 (number/visual field) and equal to or smaller than 100 (number/visual field).

C: The number of defects was greater than 100 (number/visual field) and equal to or smaller than 300 (number/visual field).

D: The number of defects was greater than 300 (number/visual field).

Evaluation 2: Evaluation of Post-Development Defect Inhibition Performance

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in the table.

A: The number of defects was equal to or smaller than 200/wafer.

B: The number of defects was greater than 200/wafer and equal to or smaller than 500/wafer.

C: The number of defects was greater than 500/wafer and equal to or smaller than 1,000/wafer.

D: The number of defects was greater than 1,000/wafer and equal to or smaller than 1,500/wafer.

E: The number of defects was greater than 1,500/wafer.

[Evaluation of Defect Inhibition Performance of Chemical Liquid: Defect Inhibition Performance During ArF Expose]

By using the chemical liquids 304 to 306 and the chemical liquids 312 and 313, the defect inhibition performance (post-development defect inhibition performance and bridge defect inhibition performance) of the chemical liquids was evaluated by the following operation. The ArF exposure means a pattern forming method by exposure using an ArF excimer laser.

A 12-inch silicon wafer was coated with each of the chemical liquids 304 to 306 and the chemical liquids 312 and 313 and baked for 60 seconds under the condition of 90° C. to 120° C., thereby forming a resist film having a film thickness of 40 nm.

Before being coated with the resist film, the silicon wafer was coated with an organic antireflection film ARC29SR (manufactured by Brewer Science Inc.) and baked for 60 seconds at 205° C. so as to form an antireflection film having a film thickness of 86 nm.

(Exposure Conditions for Evaluating Post-Development Defect Inhibition Performance)

The Wafer Prepared as Above was Subjected to ArF Exposure Using an ArF Excimer laser immersion scanner (XT1700i manufactured by ASML, NA1.20, Dipole, outer sigma 0.900, inner sigma 0.700, Y polarization). Specifically, the entire surface of the negative resist was exposed at an exposure amount of 1 mJ/cm$^2$ without using a mask.

(Exposure Conditions for Evaluating Bridge Defect Inhibition Performance)

The obtained wafer was subjected to pattern exposure using an ArF excimer laser immersion scanner (XT1700i manufactured by ASML, NA1.20, Dipole, outer sigma 0.900, inner sigma 0.700, Y polarization). As a reticle, a 6% halftone mask having a line size=50 nm and a line:space=1:1 was used. Ultrapure water was used as an immersion solution.

The conditions were adjusted so as to obtain a line-and-space pattern having a pitch of 100 nm, a space width of 35 nm, and a line width of 65 nm.

(Development Conditions)

The wafer was baked (Post Exposure Bake; PEB) at 100° C. and then subjected to puddle development in a developer for 30 seconds, thereby preparing a wafer in which a pattern was formed. In a case where a rinsing treatment was performed, the wafer was developed by puddling for 30 seconds in a developer, then rinsed by puddling in a rinsing solution before being dried, and then rotated for 30 seconds at a rotation speed of 4,000 rpm. In this way, a sample for evaluation was obtained.

Evaluation 1: Evaluation of Bridge Defect Inhibition Performance

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in the table.

AA: The number of defects was equal to or smaller than 10 (number/visual field).
    A: The number of defects was greater than 10 (number/visual field) and equal to or smaller than 30 (number/visual field).
    B: The number of defects was greater than 30 (number/visual field) and equal to or smaller than 100 (number/visual field).
    C: The number of defects was greater than 100 (number/visual field) and equal to or smaller than 300 (number/visual field).
    D: The number of defects was greater than 300 (number/visual field).

Evaluation 2: Evaluation of Post-Development Defect Inhibition Performance

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in the table.

A: The number of defects was equal to or smaller than 200/wafer.
    B: The number of defects was greater than 200/wafer and equal to or smaller than 500/wafer.
    C: The number of defects was greater than 500/wafer and equal to or smaller than 1,000/wafer.
    D: The number of defects was greater than 1,000/wafer and equal to or smaller than 1,500/wafer.
    E: The number of defects was greater than 1,500/wafer.

[Evaluation of Defect Inhibition Performance of Chemical Liquid: Defect Inhibition Performance During KRF Expose]

By using the chemical liquids 307 to 309, the defect inhibition performance (post-development defect inhibition performance and bridge defect inhibition performance) of the chemical liquids was evaluated by the following operation. KrF means a pattern forming method by exposure using a KrF excimer laser.

The silicon wafer was treated with hexamethyldisilazane (HMDS) (110° C. for 35 seconds), and by using the chemical liquids 307 to 309, a resist film having a thickness of 100 nm was formed on the wafer. Before the coating with the chemical liquids, an oxide film having a thickness of 100 nm was formed on the silicon wafer.

(Exposure Conditions for Evaluating Post-Development Defect Inhibition Performance)

By using a KrF excimer laser scanner (PAS5500/850 manufactured by ASML) (NA 0.80), KrF expose was performed on the wafer prepared as above. Specifically, the entire surface of the negative resist was exposed at an exposure amount of 1 mJ/cm$^2$ without using a mask.

(Exposure conditions for evaluating bridge defect inhibition performance)

The obtained wafer was subjected to pattern exposure using a KrF excimer laser scanner (PAS5500/850, manufactured by ASML) (NA 0.80). As a reticle, a binary mask was used which had a line-and-space pattern with a line size of 175 nm and a space size of 263 nm. The conditions were adjusted so as to obtain a line-and-space pattern having a pitch of 438 nm, a space width of 130 nm, and a line width of 308 nm.

(Development Conditions)

Then, after baking (Post Exposure Bake; PEB) under the condition of 100° C. for 60 seconds, puddle development with a developer was performed for 30 seconds, puddle rinsing with a rinsing solution was performed in a case where a rinsing process was carried out, and then the wafer was rotated for 30 seconds at a rotation speed of 4000 rpm, thereby obtaining a sample for evaluation.

As the developer, FHD-5 manufactured by Fuji Film Electronics Materials Co., Ltd. was used.

Evaluation 1: Evaluation of Bridge Defect Inhibition Performance

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in the table.

AA: The number of defects was equal to or smaller than 10 (number/visual field).
    A: The number of defects was greater than 10 (number/visual field) and equal to or smaller than 30 (number/visual field).
    B: The number of defects was greater than 30 (number/visual field) and equal to or smaller than 100 (number/visual field).
    C: The number of defects was greater than 100 (number/visual field) and equal to or smaller than 300 (number/visual field).
    D: The number of defects was greater than 300 (number/visual field).

Evaluation 2: Evaluation of Post-Development Defect Inhibition Performance

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in the table.

A: The number of defects was equal to or smaller than 200/wafer.
    B: The number of defects was greater than 200/wafer and equal to or smaller than 500/wafer.
    C: The number of defects was greater than 500/wafer and equal to or smaller than 1,000/wafer.
    D: The number of defects was greater than 1,000/wafer and equal to or smaller than 1,500/wafer.
    E: The number of defects was greater than 1,500/wafer.

[Evaluation 3: Evaluation of Pot Life of Filter]

The liquid to be purified was continuously purified using each of the filtering devices described in the table. After the liquid to be purified was passed and the filtering device was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the bridge defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life obtained in a case (chemical liquid 303) where the filtering device described in FIG. 25 was used was regarded as 1, and the pot life of the filter of each device was evaluated based on a ratio to 1. The results were evaluated based on the following standard. The evaluation results are shown in the table. For the device used for purifying the chemical liquid 303, "Standard" is listed as the evaluation result.

AA The pot life was equal to or longer than 10.
A The pot life was equal to or longer than 5 and less than 10.
B The pot life was longer than 1 and less than 5.
C The pot life was equal to or shorter than 1.

TABLE 1

Table 1 (1-1)

Figure 14:
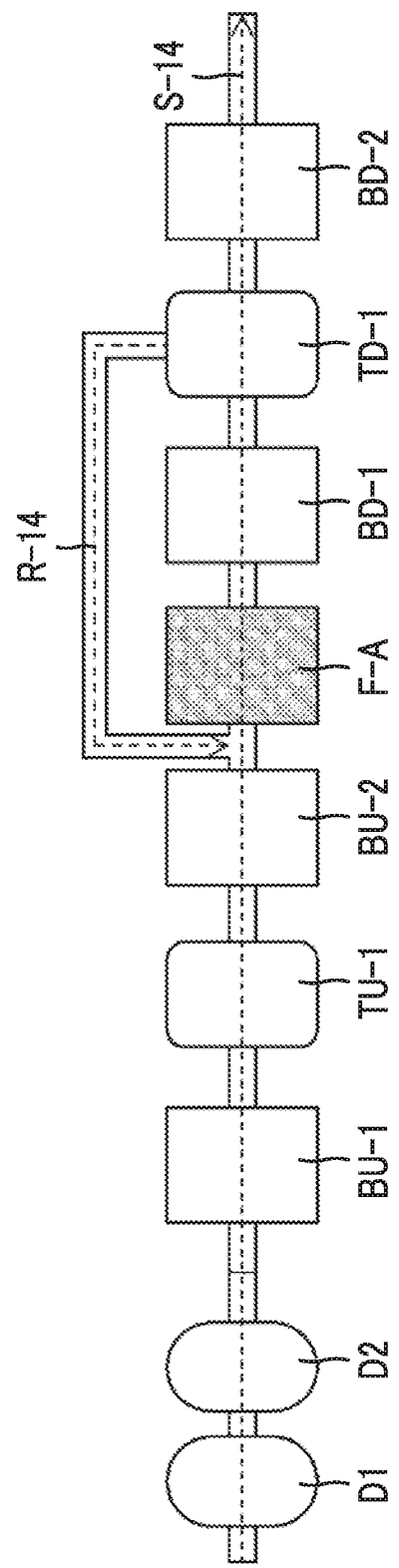
FIG. 14 is a schematic view illustrating a purification device according to an embodiment of the present invention.
Figure 15:
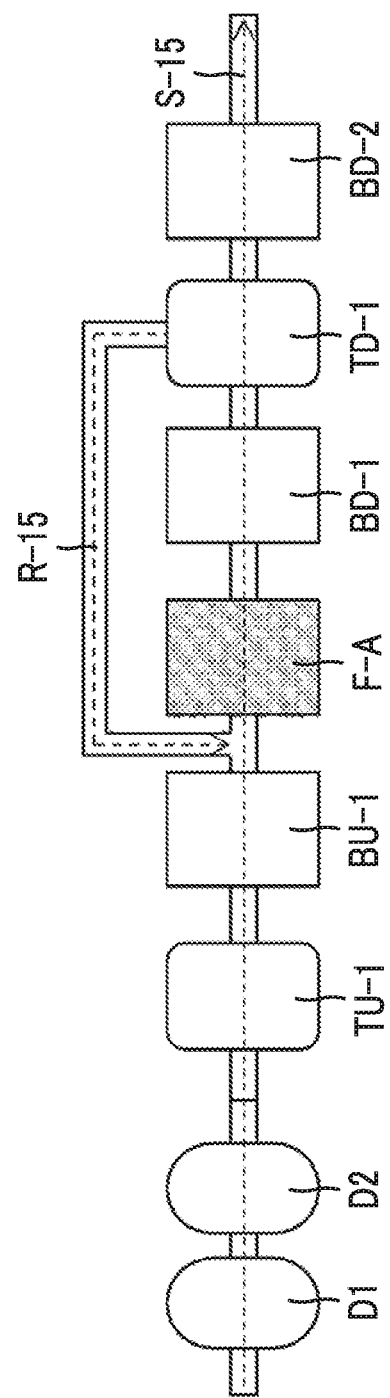
FIG. 15 is a schematic view illustrating a purification device according to an embodiment of the present invention.
Figure 16:
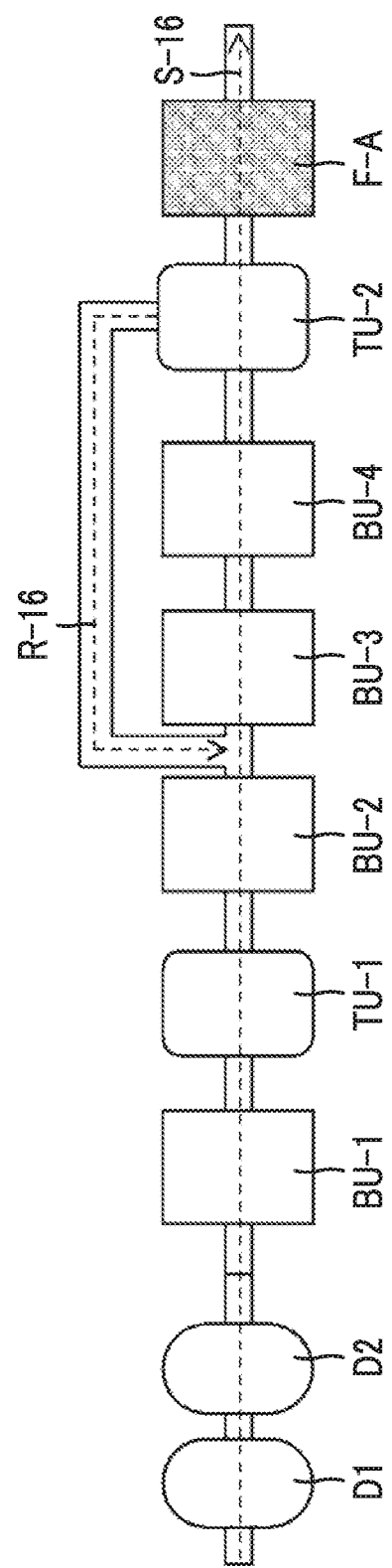
FIG. 16 is a schematic view illustrating a purification device according to an embodiment of the present invention.
Figure 17:
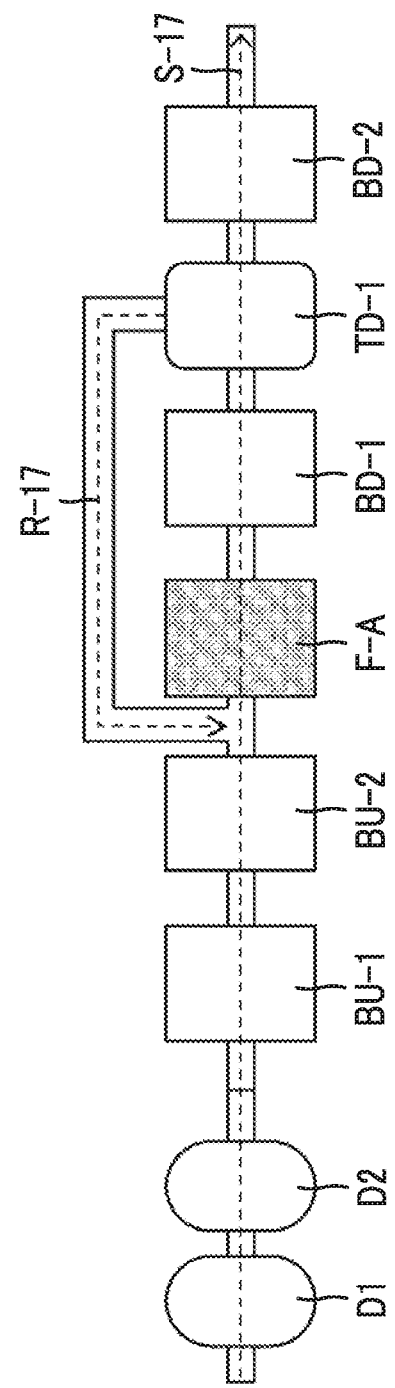
FIG. 17 is a schematic view illustrating a purification device according to an embodiment of the present invention.
Figure 18:
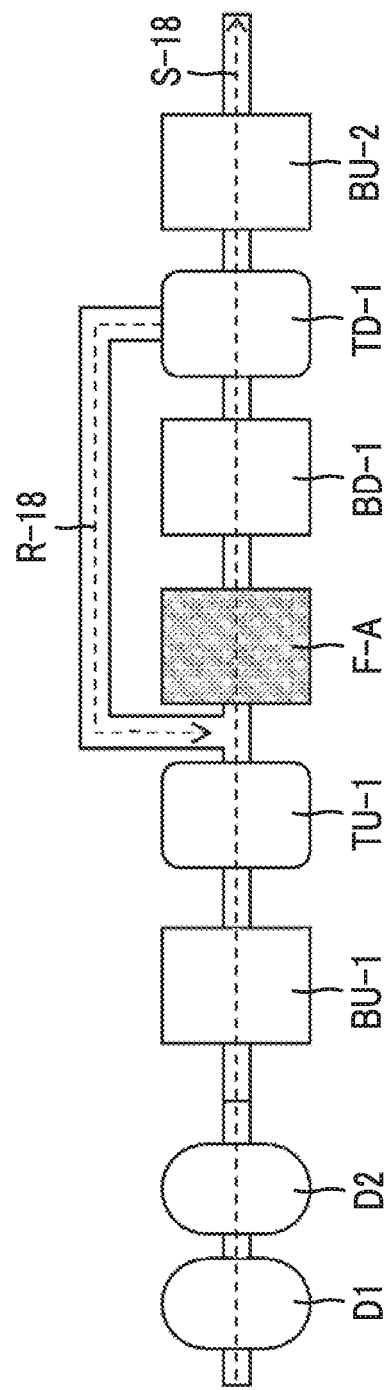
FIG. 18 is a schematic view illustrating a purification device according to an embodiment of the present invention.
Figure 19:
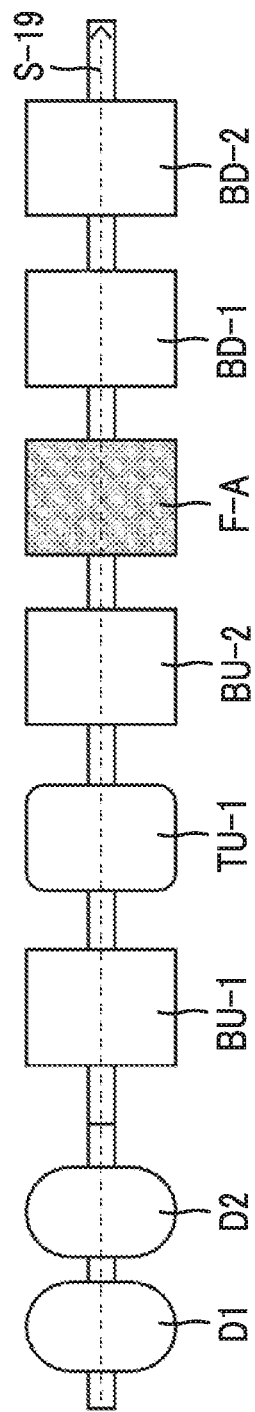
FIG. 19 is a schematic view illustrating a purification device according to an embodiment of the present invention.
Figure 21:
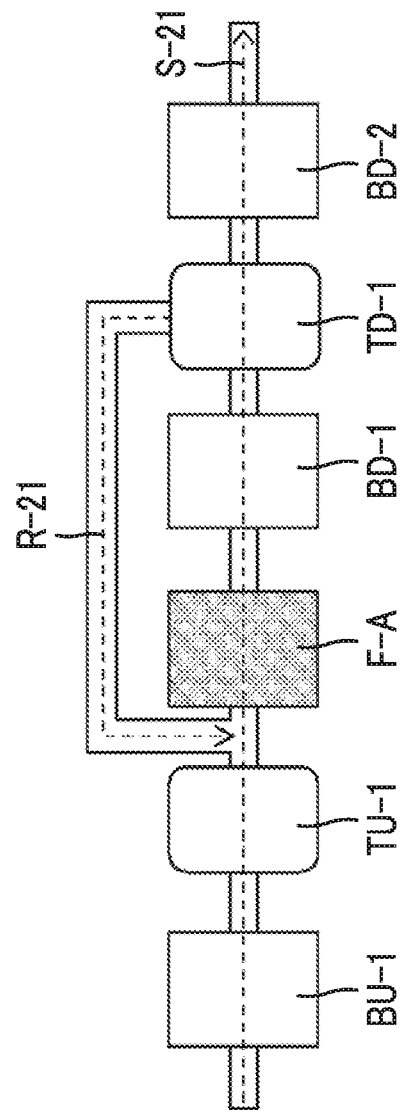
FIG. 21 is a schematic view illustrating a filtering device according to an embodiment of the present invention.
Figure 22:
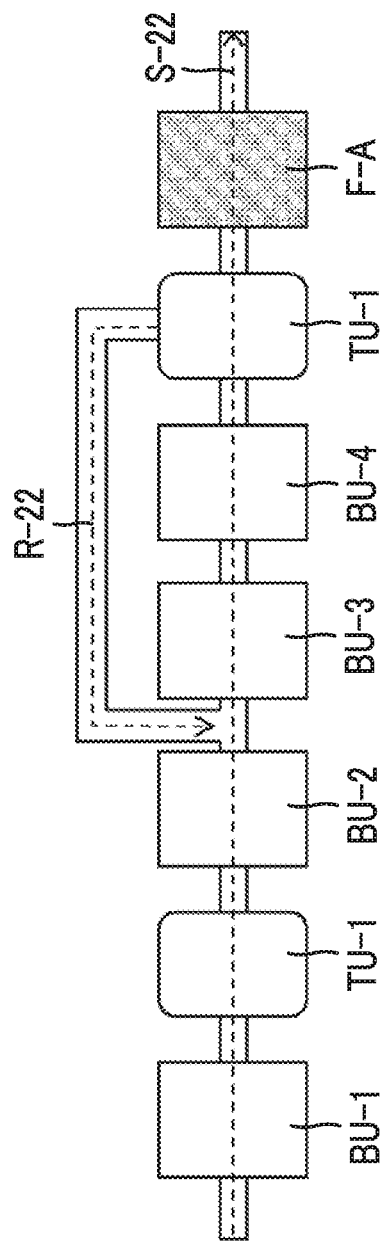
FIG. 22 is a schematic view illustrating a filtering device according to an embodiment of the present invention.
Figure 23:
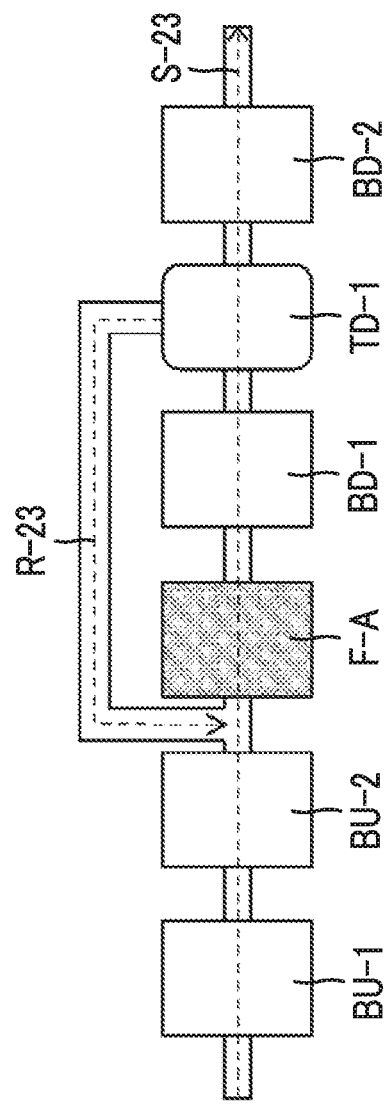
FIG. 23 is a schematic view illustrating a filtering device according to an embodiment of the present invention.

| | Purification device (or filtering device) | Liquid to be purified | | Pre-washing of filter |
|---|---|---|---|---|
| | | Solvent | SP value | |
| Chemical liquid 1 | FIG. 14 | PGMEA | 17.8 | PGMEA 1 day immersion |
| Chemical liquid 2 | FIG. 15 | PGMEA | 17.8 | PGMEA 1 day immersion |
| Chemical liquid 3 | FIG. 16 | PGMEA | 17.8 | PGMEA 1 day immersion |
| Chemical liquid 4 | FIG. 14 | PGMEA | 17.8 | PGMEA 1 day immersion |
| Chemical liquid 5 | FIG. 17 | PGMEA | 17.8 | PGMEA 1 day immersion |
| Chemical liquid 6 | FIG. 14 | PGMEA | 17.8 | PGMEA 1 day immersion |
| Chemical liquid 7 | FIG. 14 | PGMEA | 17.8 | PGMEA 1 day immersion |
| Chemical liquid 8 | FIG. 14 | PGMEA | 17.8 | PGMEA 1 day immersion |
| Chemical liquid 9 | FIG. 14 | PGMEA | 17.8 | PGMEA 1 day immersion |
| Chemical liquid 10 | FIG. 14 | PGMEA | 17.8 | PGMEA 1 day immersion |
| Chemical liquid 11 | FIG. 14 | PGMEA | 17.8 | PGMEA 1 day immersion |
| Chemical liquid 12 | FIG. 18 | PGMEA | 17.8 | PGMEA 1 day immersion |
| Chemical liquid 13 | FIG. 14 | PGMEA | 17.8 | PGMEA 1 day immersion |
| Chemical liquid 14 | FIG. 19 | PGMEA | 17.8 | PGMEA 1 day immersion |
| Chemical liquid 15 | FIG. 14 | PGMEA | 17.8 | — |
| Chemical liquid 16 | FIG. 20 | PGMEA | 17.8 | PGMEA 1 day immersion |
| Chemical liquid 17 | FIG. 21 | PGMEA | 17.8 | PGMEA 1 day immersion |
| Chemical liquid 18 | FIG. 22 | PGMEA | 17.8 | PGMEA 1 day immersion |
| Chemical liquid 19 | FIG. 20 | PGMEA | 17.8 | PGMEA 1 day immersion |
| Chemical liquid 20 | FIG. 23 | PGMEA | 17.8 | PGMEA 1 day immersion |
| Chemical liquid 21 | FIG. 20 | PGMEA | 17.8 | PGMEA 1 day immersion |
| Chemical liquid 22 | FIG. 20 | PGMEA | 17.8 | PGMEA 1 day immersion |
| Chemical liquid 23 | FIG. 20 | PGMEA | 17.8 | PGMEA 1 day immersion |
| Chemical liquid 24 | FIG. 20 | PGMEA | 17.8 | PGMEA 1 day immersion |
| Chemical liquid 25 | FIG. 20 | PGMEA | 17.8 | PGMEA 1 day immersion |
| Chemical liquid 26 | FIG. 20 | PGMEA | 17.8 | PGMEA 1 day immersion |
| Chemical liquid 27 | FIG. 21 | PGMEA | 17.8 | PGMEA 1 day immersion |
| Chemical liquid 28 | FIG. 20 | PGMEA | 17.8 | PGMEA 1 day immersion |

TABLE 1-continued

Figure 30:
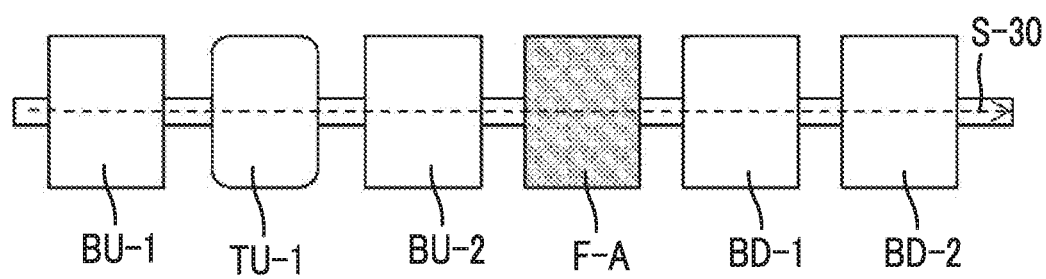
FIG. 30 is a schematic view illustrating a filtering device according to an embodiment of the present invention.

| | | | | | |
|---|---|---|---|---|---|
| Chemical liquid 29 | FIG. 30 | PGMEA | 17.8 | PGMEA 1 day immersion |
| Chemical liquid 30 | FIG. 20 | PGMEA | 17.8 | — |

Table 1 (1-2)

| | | BU-1 | | BU-2 | | BU-3 | | BU-4 | |
|---|---|---|---|---|---|---|---|---|---|
| | Distiller | Material component | Pore size (nm) | Material component | Pore size (nm) | Material component | Pore size (nm) | Material component | Pore size (nm) |
| Chemical liquid 1 | Duplex | UPE | 50 | IEX | 15 | — | — | — | — |
| Chemical liquid 2 | Duplex | IEX | 15 | — | — | — | — | — | — |
| Chemical liquid 3 | Duplex | PP | 200 | IEX | 15 | Nylon | 20 | Nylon | 20 |
| Chemical liquid 4 | Duplex | PP | 200 | IEX | 200 | — | — | — | — |
| Chemical liquid 5 | Duplex | PP | 200 | IEX | 15 | — | — | — | — |
| Chemical liquid 6 | Duplex | PTFE | 20 | IEX | 15 | — | — | — | — |
| Chemical liquid 7 | Duplex | PP | 200 | IEX | 15 | — | — | — | — |
| Chemical liquid 8 | Duplex | PP | 200 | IEX | 15 | — | — | — | — |
| Chemical liquid 9 | Duplex | PP | 200 | IEX | 15 | — | — | — | — |
| Chemical liquid 10 | Duplex | PP | 200 | IEX | 15 | — | — | — | — |
| Chemical liquid 11 | Duplex | PP | 200 | IEX | 15 | — | — | — | — |
| Chemical liquid 12 | Duplex | PP | 200 | — | — | — | — | — | — |
| Chemical liquid 13 | Duplex | PP | 200 | IEX | 15 | — | — | — | — |
| Chemical liquid 14 | Duplex | PP | 200 | IEX | 15 | — | — | — | — |
| Chemical liquid 15 | Duplex | PP | 200 | IEX | 15 | — | — | — | — |
| Chemical liquid 16 | — | PP | 200 | IEX | 15 | — | — | — | — |
| Chemical liquid 17 | — | IEX | 15 | — | — | — | — | — | — |
| Chemical liquid 18 | — | PP | 200 | IEX | 15 | Nylon | 20 | Nylon | 20 |
| Chemical liquid 19 | — | PP | 200 | IEX | 200 | — | — | — | — |
| Chemical liquid 20 | — | PP | 200 | IEX | 15 | — | — | — | — |
| Chemical liquid 21 | — | PTFE | 20 | IEX | 15 | — | — | — | — |
| Chemical liquid 22 | — | PP | 200 | IEX | 15 | — | — | — | — |
| Chemical liquid 23 | — | PP | 200 | IEX | 15 | — | — | — | — |
| Chemical liquid 24 | — | PP | 200 | IEX | 15 | — | — | — | — |
| Chemical liquid 25 | — | PP | 200 | IEX | 15 | — | — | — | — |
| Chemical liquid 26 | — | PP | 200 | IEX | 15 | — | — | — | — |
| Chemical liquid 27 | — | PP | 200 | — | — | — | — | — | — |
| Chemical liquid 28 | — | PP | 200 | IEX | 15 | — | — | — | — |
| Chemical liquid 29 | — | PP | 200 | IEX | 15 | — | — | — | — |
| Chemical liquid 30 | — | PP | 200 | IEX | 15 | — | — | — | — |

TABLE 1-continued

Table 1 (1-3)

| | Tank (upstream side) | | F-A | | | BD-1 | |
|---|---|---|---|---|---|---|---|
| | TU-1 | TU-2 | Type | Imidization ratio | Pore size (nm) | Material component | Pore size (nm) |
| Chemical liquid 1 | Present | — | Filter X1 | 1.48 | 10 | Nylon | 10 |
| Chemical liquid 2 | Present | — | Filter X1 | 1.48 | 10 | Nylon | 10 |
| Chemical liquid 3 | Present | Present | Filter X1 | 1.48 | 10 | — | — |
| Chemical liquid 4 | Present | — | Filter X1 | 1.48 | 10 | Nylon | 10 |
| Chemical liquid 5 | — | — | Filter X1 | 1.48 | 10 | Nylon | 10 |
| Chemical liquid 6 | Present | — | Filter X1 | 1.48 | 12 | Nylon | 10 |
| Chemical liquid 7 | Present | — | Filter X1 | 1.48 | 15 | Nylon | 10 |
| Chemical liquid 8 | Present | — | Filter X1 | 1.48 | 7 | Nylon | 10 |
| Chemical liquid 9 | Present | — | Filter X1 | 1.48 | 7 | Nylon | 10 |
| Chemical liquid 10 | Present | — | Filter X1 | 1.48 | 10 | Nylon | 10 |
| Chemical liquid 11 | Present | — | Filter X1 | 1.48 | 10 | Nylon | 10 |
| Chemical liquid 12 | Present | — | Filter X1 | 1.48 | 12 | Nylon | 10 |
| Chemical liquid 13 | Present | — | Filter X1 | 1.48 | 15 | PTFE | 10 |
| Chemical liquid 14 | Present | — | Filter X1 | 1.48 | 7 | Nylon | 10 |
| Chemical liquid 15 | Present | — | Filter X1 | 1.48 | 7 | Nylon | 10 |
| Chemical liquid 16 | Present | — | Filter X1 | 1.48 | 10 | Nylon | 10 |
| Chemical liquid 17 | Present | — | Filter X1 | 1.48 | 15 | Nylon | 10 |
| Chemical liquid 18 | Present | Present | Filter X1 | 1.48 | 15 | — | — |
| Chemical liquid 19 | Present | — | Filter X1 | 1.48 | 10 | Nylon | 10 |
| Chemical liquid 20 | — | — | Filter X1 | 1.48 | 12 | Nylon | 10 |
| Chemical liquid 21 | Present | — | Filter X1 | 1.48 | 15 | Nylon | 10 |
| Chemical liquid 22 | Present | — | Filter X1 | 1.48 | 7 | Nylon | 10 |
| Chemical liquid 23 | Present | — | Filter X1 | 1.48 | 7 | Nylon | 10 |
| Chemical liquid 24 | Present | — | Filter X1 | 1.48 | 10 | Nylon | 10 |
| Chemical liquid 25 | Present | — | Filter X1 | 1.48 | 10 | Nylon | 10 |
| Chemical liquid 26 | Present | — | Filter X1 | 1.48 | 12 | Nylon | 10 |
| Chemical liquid 27 | Present | — | Filter X1 | 1.48 | 15 | Nylon | 10 |
| Chemical liquid 28 | Present | — | Filter X1 | 1.48 | 7 | PTFE | 10 |
| Chemical liquid 29 | Present | — | Filter X1 | 1.48 | 7 | Nylon | 10 |
| Chemical liquid 30 | Present | — | Filter X1 | 1.48 | 10 | Nylon | 10 |

Table 1 (1-4)

| | BD-2 | | Tank (downstream side) | | |
|---|---|---|---|---|---|
| | Material component | Pore size (nm) | TD-1 | Circulation | Evaluation method |
| Chemical liquid 1 | UPE | 3 | Present | Performed | Pre-wetting |
| Chemical liquid 2 | UPE | 3 | Present | Performed | Pre-wetting |

TABLE 1-continued

| | | | | | |
|---|---|---|---|---|---|
| Chemical liquid 3 | — | — | — | Performed | Pre-wetting |
| Chemical liquid 4 | UPE | 3 | Present | Performed | Pre-wetting |
| Chemical liquid 5 | UPE | 3 | Present | Performed | Pre-wetting |
| Chemical liquid 6 | UPE | 3 | Present | Performed | Pre-wetting |
| Chemical liquid 7 | PTFE | 20 | Present | Performed | Pre-wetting |
| Chemical liquid 8 | PTFE | 7 | Present | Performed | Pre-wetting |
| Chemical liquid 9 | Nylon | 5 | Present | Performed | Pre-wetting |
| Chemical liquid 10 | UPE | 5 | Present | Performed | Pre-wetting |
| Chemical liquid 11 | UPE | 1 | Present | Performed | Pre-wetting |
| Chemical liquid 12 | UPE | 3 | Present | Performed | Pre-wetting |
| Chemical liquid 13 | UPE | 3 | Present | Performed | Pre-wetting |
| Chemical liquid 14 | UPE | 3 | — | — | Pre-wetting |
| Chemical liquid 15 | UPE | 3 | Present | Performed | Pre-wetting |
| Chemical liquid 16 | UPE | 3 | Present | Performed | Pre-wetting |
| Chemical liquid 17 | UPE | 3 | Present | Performed | Pre-wetting |
| Chemical liquid 18 | — | — | — | Performed | Pre-wetting |
| Chemical liquid 19 | UPE | 3 | Present | Performed | Pre-wetting |
| Chemical liquid 20 | UPE | 3 | Present | Performed | Pre-wetting |
| Chemical liquid 21 | UPE | 3 | Present | Performed | Pre-wetting |
| Chemical liquid 22 | PTFE | 20 | Present | Performed | Pre-wetting |
| Chemical liquid 23 | PTFE | 7 | Present | Performed | Pre-wetting |
| Chemical liquid 24 | Nylon | 5 | Present | Performed | Pre-wetting |
| Chemical liquid 25 | UPE | 3 | Present | Performed | Pre-wetting |
| Chemical liquid 26 | UPE | 1 | Present | Performed | Pre-wetting |
| Chemical liquid 27 | UPE | 3 | Present | Performed | Pre-wetting |
| Chemical liquid 28 | UPE | 3 | Present | Performed | Pre-wetting |
| Chemical liquid 29 | UPE | 3 | — | — | Pre-wetting |
| Chemical liquid 30 | UPE | 3 | Present | Performed | Pre-wetting |

Table 1 (1-5)

| | Evaluation 1 | | Evaluation 2 | | |
|---|---|---|---|---|---|
| | Residue defect inhibition performance | Stain-like defect inhibition performance | Bridge defect inhibition performance | Evaluation 3 Pattern width uniformity | Evaluation 4 Pot life |
| Chemical liquid 1 | AA | AA | AA | AA | AA |
| Chemical liquid 2 | A | AA | AA | A | B |
| Chemical liquid 3 | B | AA | A | A | AA |
| Chemical liquid 4 | A | AA | AA | B | AA |
| Chemical liquid 5 | A | AA | A | A | AA |
| Chemical liquid 6 | A | AA | AA | AA | A |
| Chemical liquid 7 | A | AA | B | A | AA |

TABLE 1-continued

| | | | | | |
|---|---|---|---|---|---|
| Chemical liquid 8 | A | AA | A | A | AA |
| Chemical liquid 9 | A | AA | AA | A | AA |
| Chemical liquid 10 | A | AA | AA | AA | AA |
| Chemical liquid 11 | AA | AA | AA | AA | AA |
| Chemical liquid 12 | A | AA | A | C | AA |
| Chemical liquid 13 | B | AA | A | A | AA |
| Chemical liquid 14 | B | AA | B | A | AA |
| Chemical liquid 15 | A | B | AA | A | AA |
| Chemical liquid 16 | AA | B | AA | AA | AA |
| Chemical liquid 17 | A | B | AA | A | B |
| Chemical liquid 18 | B | B | A | A | AA |
| Chemical liquid 19 | A | B | AA | B | AA |
| Chemical liquid 20 | A | B | A | A | AA |
| Chemical liquid 21 | A | B | AA | AA | A |
| Chemical liquid 22 | A | B | B | A | AA |
| Chemical liquid 23 | A | B | A | A | AA |
| Chemical liquid 24 | A | B | AA | A | AA |
| Chemical liquid 25 | A | B | AA | AA | AA |
| Chemical liquid 26 | AA | B | AA | AA | AA |
| Chemical liquid 27 | A | B | A | C | AA |
| Chemical liquid 28 | B | B | A | A | AA |
| Chemical liquid 29 | B | B | B | A | AA |
| Chemical liquid 30 | A | D | AA | A | AA |

Table 1 (2-1)

Figure 28:
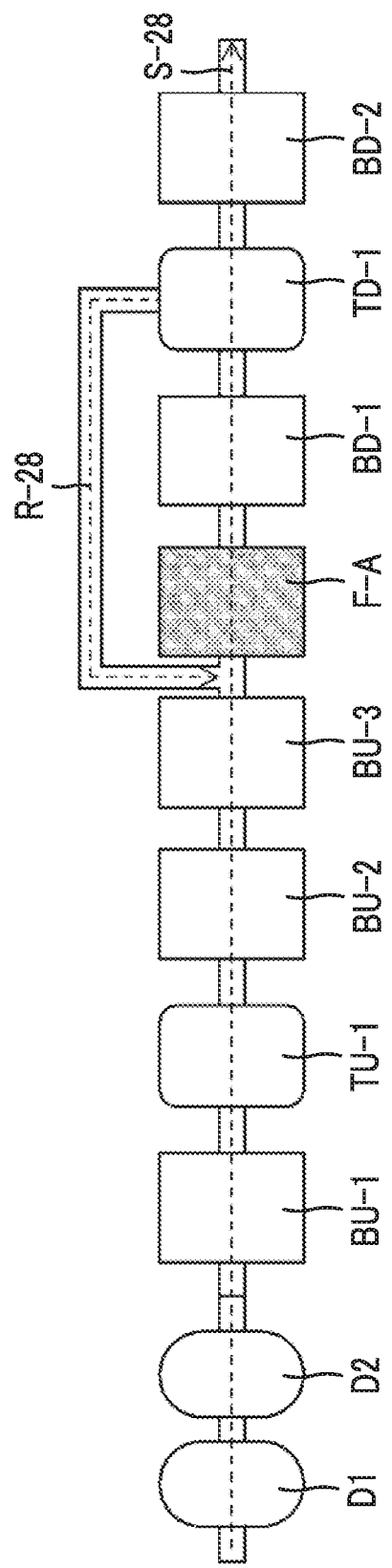
FIG. 28 is a schematic view illustrating a purification device according to an embodiment of the present invention.
Figure 29:
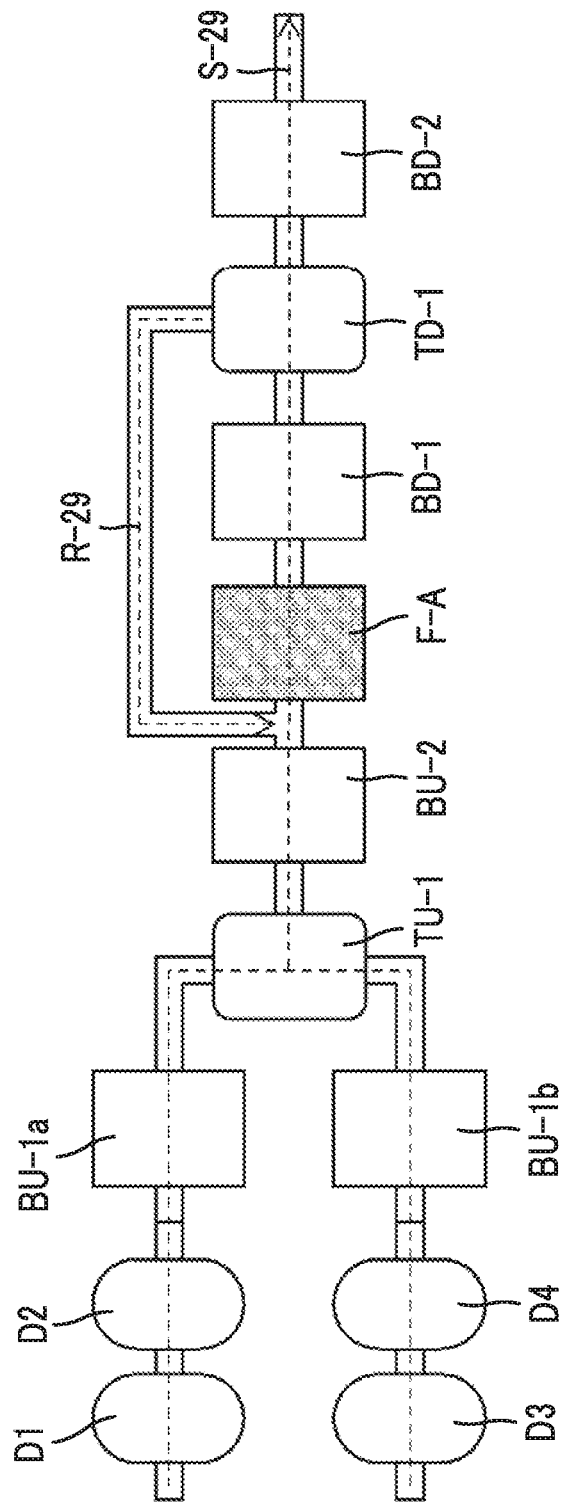
FIG. 29 is a schematic view illustrating a purification device according to an embodiment of the present invention.

| | Purification device (or filtering device) | Liquid to be purified | | Pre-washing of filter |
|---|---|---|---|---|
| | | Solvent | SP value | |
| Chemical liquid 31 | FIG. 29 | PGMEA/ PGME (7:3) | 19.4 | PGMEA 1 day immersion |
| Chemical liquid 32 | FIG. 14 | nBA | 17.8 | PGMEA 1 day immersion |
| Chemical liquid 33 | FIG. 29 | PC/ PGMEA (1:9) | 18.2 | PGMEA 1 day immersion |
| Chemical liquid 34 | FIG. 24 | PGMEA | 17.8 | PGMEA 1 day immersion |
| Chemical liquid 35 | FIG. 14 | PGME | 23.1 | PGMEA 1 day immersion |
| Chemical liquid 36 | FIG. 14 | PGME | 23.1 | PGMEA 1 day immersion |
| Chemical liquid 37 | FIG. 28 | PGME | 23.1 | PGMEA 1 day immersion |
| Chemical liquid 38 | FIG. 28 | PGME | 23.1 | PGMEA 1 day immersion |
| Chemical liquid 39 | FIG. 14 | MIBC | 22.7 | PGMEA 1 day immersion |
| Chemical liquid 40 | FIG. 14 | MIBC | 22.7 | PGMEA 1 day immersion |
| Chemical liquid 41 | FIG. 28 | MIBC | 22.7 | PGMEA 1 day immersion |
| Chemical liquid 42 | FIG. 28 | MIBC | 22.7 | PGMEA 1 day immersion |

TABLE 1-continued

| | | | | |
|---|---|---|---|---|
| Chemical liquid 43 | FIG. 14 | nBA | 17.8 | PGMEA 1 day immersion |
| Chemical liquid 44 | FIG. 14 | nBA | 17.8 | PGMEA 1 day immersion |
| Chemical liquid 45 | FIG. 14 | nBA | 17.8 | PGMEA 1 day immersion |
| Chemical liquid 46 | FIG. 14 | iAA | 17.4 | PGMEA 1 day immersion |
| Chemical liquid 47 | FIG. 14 | iAA | 17.4 | PGMEA 1 day immersion |
| Chemical liquid 48 | FIG. 14 | iAA | 17.4 | PGMEA 1 day immersion |
| Chemical liquid 49 | FIG. 14 | PGME | 23.1 | PGMEA 1 day immersion |
| Chemical liquid 50 | FIG. 14 | PGME | 23.1 | PGMEA 1 day immersion |
| Chemical liquid 51 | FIG. 14 | PGME | 23.1 | PGMEA 1 day immersion |
| Chemical liquid 52 | FIG. 14 | PGME | 23.1 | PGMEA 1 day immersion |
| Chemical liquid 53 | FIG. 14 | PGME | 23.1 | PGMEA 1 day immersion |
| Chemical liquid 54 | FIG. 14 | PGME | 23.1 | PGMEA 1 day immersion |
| Chemical liquid 55 | FIG. 14 | PGME | 23.1 | PGMEA 1 day immersion |
| Chemical liquid 56 | FIG. 14 | PGME | 23.1 | PGMEA 1 day immersion |

Table 1 (2-2)

| | | BU-1 | | BU-2 | | BU-3 | | BU-4 | |
|---|---|---|---|---|---|---|---|---|---|
| | Distiller | Material component | Pore size (nm) | Material component | Pore size (nm) | Material component | Pore size (nm) | Material component | Pore size (nm) |
| Chemical liquid 31 | Duplex | PP | 200 | IEX | 15 | — | — | — | — |
| Chemical liquid 32 | Duplex | PP | 200 | IEX | 15 | — | — | — | — |
| Chemical liquid 33 | Duplex | PP | 200 | IEX | 15 | — | — | — | — |
| Chemical liquid 34 | Duplex | — | — | — | — | — | — | — | — |
| Chemical liquid 35 | Duplex | PP | 200 | IEX | 50 | — | — | — | — |
| Chemical liquid 36 | Duplex | PP | 200 | IEX | 50 | — | — | — | — |
| Chemical liquid 37 | Duplex | PP | 200 | IEX | 50 | Filter 2 (1.40) | 20 | — | — |
| Chemical liquid 38 | Duplex | PP | 200 | IEX | 15 | Filter 2 (1.40) | 20 | — | — |
| Chemical liquid 39 | Duplex | PP | 200 | IEX | 50 | — | — | — | — |
| Chemical liquid 40 | Duplex | PP | 200 | IEX | 50 | — | — | — | — |
| Chemical liquid 41 | Duplex | PP | 200 | IEX | 50 | Filter 2 (1.40) | 20 | — | — |
| Chemical liquid 42 | Duplex | PP | 200 | IEX | 15 | Filter 2 (1.40) | 20 | — | — |
| Chemical liquid 43 | Duplex | PP | 200 | IEX | 50 | — | — | — | — |
| Chemical liquid 44 | Duplex | PP | 200 | IEX | 50 | — | — | — | — |
| Chemical liquid 45 | Duplex | PP | 200 | IEX | 15 | — | — | — | — |
| Chemical liquid 46 | Duplex | PP | 200 | IEX | 50 | — | — | — | — |
| Chemical liquid 47 | Duplex | PP | 200 | IEX | 50 | — | — | — | — |
| Chemical liquid 48 | Duplex | PP | 200 | IEX | 15 | — | — | — | — |
| Chemical liquid 49 | Duplex | PE | 50 | IEX | 15 | — | — | — | — |
| Chemical liquid 50 | Duplex | PE | 50 | IEX | 15 | — | — | — | — |
| Chemical liquid 51 | Duplex | PE | 50 | IEX | 15 | — | — | — | — |
| Chemical liquid 52 | Duplex | PE | 50 | IEX | 15 | — | — | — | — |

TABLE 1-continued

| | | | | | | | | | |
|---|---|---|---|---|---|---|---|---|---|
| Chemical liquid 53 | Duplex | PE | 50 | IEX | 15 | — | — | — | — |
| Chemical liquid 54 | Duplex | PE | 50 | IEX | 15 | — | — | — | — |
| Chemical liquid 55 | Duplex | PE | 50 | IEX | 15 | — | — | — | — |
| Chemical liquid 56 | Duplex | PE | 50 | IEX | 15 | — | — | — | — |

Table 1 (2-3)

| | Tank (upstream side) | | F-A | | | BD-1 | |
|---|---|---|---|---|---|---|---|
| | TU-1 | TU-2 | Type | Imidization ratio | Pore size (nm) | Material component | Pore size (nm) |
| Chemical liquid 31 | Present | — | Filter X1 | 1.48 | 10 | Nylon | 10 |
| Chemical liquid 32 | Present | — | Filter X1 | 1.48 | 12 | Nylon | 10 |
| Chemical liquid 33 | Present | — | Filter X1 | 1.48 | 15 | Nylon | 10 |
| Chemical liquid 34 | — | — | Filter X1 | 1.48 | 7 | — | — |
| Chemical liquid 35 | Present | — | Filter X1 | 1.48 | 20 | Nylon | 10 |
| Chemical liquid 36 | Present | — | Filter Y1 | 1.85 | 20 | Nylon | 10 |
| Chemical liquid 37 | Present | — | Filter Y1 | 1.85 | 20 | Nylon | 10 |
| Chemical liquid 38 | Present | — | Filter Y1 | 1.85 | 20 | Nylon | 5 |
| Chemical liquid 39 | Present | — | Filter X1 | 1.48 | 15 | Nylon | 10 |
| Chemical liquid 40 | Present | — | Filter Y1 | 1.85 | 15 | Nylon | 10 |
| Chemical liquid 41 | Present | — | Filter Y1 | 1.85 | 15 | Nylon | 10 |
| Chemical liquid 42 | Present | — | Filter Y1 | 1.85 | 15 | Nylon | 5 |
| Chemical liquid 43 | Present | — | Filter X1 | 1.48 | 15 | Nylon | 10 |
| Chemical liquid 44 | Present | — | Filter X2 | 1.33 | 15 | Nylon | 10 |
| Chemical liquid 45 | Present | — | Filter X2 | 1.33 | 15 | Nylon | 5 |
| Chemical liquid 46 | Present | — | Filter X1 | 1.48 | 15 | Nylon | 10 |
| Chemical liquid 47 | Present | — | Filter X2 | 1.33 | 15 | Nylon | 10 |
| Chemical liquid 48 | Present | — | Filter X2 | 1.33 | 15 | Nylon | 5 |
| Chemical liquid 49 | Present | — | Filter X3 | 1.43 | 12 | Nylon | 10 |
| Chemical liquid 50 | Present | — | Filter X4 | 1.51 | 15 | Nylon | 10 |
| Chemical liquid 51 | Present | — | Filter Y3 | 1.6 | 7 | Nylon | 10 |
| Chemical liquid 52 | Present | — | Filter X5 | 1.3 | 7 | Nylon | 10 |
| Chemical liquid 53 | Present | — | Filter X7 | 1.21 | 10 | Nylon | 10 |
| Chemical liquid 54 | Present | — | Filter Y5 | 1.68 | 12 | Nylon | 10 |
| Chemical liquid 55 | Present | — | Filter X8 | 1.75 | 12 | Nylon | 10 |
| Chemical liquid 56 | Present | — | Filter Y2 | 1.82 | 15 | Nylon | 10 |

TABLE 1-continued

Table 1 (2-4)

| | BD-2 | | Tank | | |
| | Material component | Pore size (nm) | (downstream side) TD-1 | Circulation | Evaluation method |
|---|---|---|---|---|---|
| Chemical liquid 31 | UPE | 3 | Present | Performed | Pre-wetting |
| Chemical liquid 32 | UPE | 3 | Present | Performed | Developer |
| Chemical liquid 33 | UPE | 3 | Present | Performed | Pre-wetting |
| Chemical liquid 34 | — | — | — | — | Pre-wetting |
| Chemical liquid 35 | UPE | 3 | Present | Performed | Pre-wetting |
| Chemical liquid 36 | UPE | 3 | Present | Performed | Pre-wetting |
| Chemical liquid 37 | UPE | 3 | Present | Performed | Pre-wetting |
| Chemical liquid 38 | UPE | 3 | Present | Performed | Pre-wetting |
| Chemical liquid 39 | UPE | 3 | Present | Performed | Rinsing |
| Chemical liquid 40 | UPE | 3 | Present | Performed | Rinsing |
| Chemical liquid 41 | UPE | 3 | Present | Performed | Rinsing |
| Chemical liquid 42 | UPE | 3 | Present | Performed | Rinsing |
| Chemical liquid 43 | UPE | 3 | Present | Performed | Developer |
| Chemical liquid 44 | UPE | 3 | Present | Performed | Developer |
| Chemical liquid 45 | UPE | 3 | Present | Performed | Developer |
| Chemical liquid 46 | UPE | 3 | Present | Performed | Developer |
| Chemical liquid 47 | UPE | 3 | Present | Performed | Developer |
| Chemical liquid 48 | UPE | 3 | Present | Performed | Developer |
| Chemical liquid 49 | UPE | 3 | Present | Performed | Pre-wetting |
| Chemical liquid 50 | UPE | 3 | Present | Performed | Pre-wetting |
| Chemical liquid 51 | UPE | 3 | Present | Performed | Pre-wetting |
| Chemical liquid 52 | UPE | 3 | Present | Performed | Pre-wetting |
| Chemical liquid 53 | UPE | 3 | Present | Performed | Pre-wetting |
| Chemical liquid 54 | UPE | 3 | Present | Performed | Pre-wetting |
| Chemical liquid 55 | UPE | 3 | Present | Performed | Pre-wetting |
| Chemical liquid 56 | UPE | 3 | Present | Performed | Pre-wetting |

Table 1 (2-5)

| | Evaluation 1 | | Evaluation 2 | | |
| | Residue defect inhibition performance | Stain-like defect inhibition performance | Bridge defect inhibition performance | Evaluation 3 Pattern width uniformity | Evaluation 4 Pot life |
|---|---|---|---|---|---|
| Chemical liquid 31 | AA | AA | AA | AA | AA |
| Chemical liquid 32 | AA | AA | AA | AA | AA |
| Chemical liquid 33 | AA | AA | AA | AA | AA |
| Chemical liquid 34 | E | E | E | E | Standard |
| Chemical liquid 35 | A | A | A | A | AA |
| Chemical liquid 36 | AA | A | A | A | AA |

TABLE 1-continued

| | | | | | |
|---|---|---|---|---|---|
| Chemical liquid 37 | AA | AA | A | A | AA |
| Chemical liquid 38 | AA | AA | AA | A | AA |
| Chemical liquid 39 | A | A | A | A | AA |
| Chemical liquid 40 | AA | A | A | A | AA |
| Chemical liquid 41 | AA | AA | A | A | AA |
| Chemical liquid 42 | AA | AA | AA | A | AA |
| Chemical liquid 43 | A | A | A | A | AA |
| Chemical liquid 44 | AA | AA | A | A | AA |
| Chemical liquid 45 | AA | AA | AA | A | AA |
| Chemical liquid 46 | A | A | A | A | AA |
| Chemical liquid 47 | AA | AA | A | A | AA |
| Chemical liquid 48 | AA | AA | AA | A | AA |
| Chemical liquid 49 | A | A | A | AA | AA |
| Chemical liquid 50 | A | AA | A | AA | AA |
| Chemical liquid 51 | A | AA | AA | AA | AA |
| Chemical liquid 52 | A | A | A | AA | AA |
| Chemical liquid 53 | A | A | A | AA | AA |
| Chemical liquid 54 | A | AA | AA | AA | AA |
| Chemical liquid 55 | A | AA | AA | AA | AA |
| Chemical liquid 56 | AA | AA | AA | AA | AA |

Table 1 (3-1)

| | Purification device (or filtering device) | Liquid to be purified | | Pre-washing of filter |
|---|---|---|---|---|
| | | Solvent | SP value | |
| Chemical liquid 57 | FIG. 14 | PGME | 23.1 | PGMEA 1 day immersion |
| Chemical liquid 58 | FIG. 14 | PGME | 23.1 | PGMEA 1 day immersion |
| Chemical liquid 59 | FIG. 14 | nBA | 17.8 | PGMEA 1 day immersion |
| Chemical liquid 60 | FIG. 14 | nBA | 17.8 | PGMEA 1 day immersion |
| Chemical liquid 61 | FIG. 14 | nBA | 17.8 | PGMEA 1 day immersion |
| Chemical liquid 62 | FIG. 14 | nBA | 17.8 | PGMEA 1 day immersion |
| Chemical liquid 63 | FIG. 14 | nBA | 17.8 | PGMEA 1 day immersion |
| Chemical liquid 64 | FIG. 14 | nBA | 17.8 | PGMEA 1 day immersion |
| Chemical liquid 65 | FIG. 14 | nBA | 17.8 | PGMEA 1 day immersion |
| Chemical liquid 66 | FIG. 14 | CHN | 20.3 | Specific washing solution 1 (10 h immersion) |
| Chemical liquid 67 | FIG. 29 | PGMEA/ PGME (7:3) | 19.4 | Specific washing solution 2 (20 h immersion) |
| Chemical liquid 68 | FIG. 14 | nBA | 17.8 | Specific washing solution 3 (10 h immersion) |
| Chemical liquid 69 | FIG. 29 | PC/ PGMEA (1:9) | 18.2 | Specific washing solution 4 (20 h immersion) |
| Chemical liquid 70 | FIG. 14 | CHN | 20.3 | Specific washing solution 5 (10 h immersion) |
| Chemical liquid 71 | FIG. 14 | CHN | 20.3 | PGMEA 1 day immersion |

TABLE 1-continued

| | | | | |
|---|---|---|---|---|
| Chemical liquid 72 | FIG. 14 | CHN | 20.3 | PGMEA 1 day immersion |
| Chemical liquid 73 | FIG. 14 | CHN | 20.3 | PGMEA 1 day immersion |
| Chemical liquid 74 | FIG. 14 | CHN | 20.3 | PGMEA 1 day immersion |
| Chemical liquid 75 | FIG. 14 | CHN | 20.3 | PGMEA 1 day immersion |
| Chemical liquid 76 | FIG. 14 | CHN | 20.3 | PGMEA 1 day immersion |
| Chemical liquid 77 | FIG. 14 | CHN | 20.3 | PGMEA 1 day immersion |
| Chemical liquid 78 | FIG. 14 | MIBC | 22.7 | PGMEA 1 day immersion |
| Chemical liquid 79 | FIG. 14 | MIBC | 22.7 | PGMEA 1 day immersion |
| Chemical liquid 80 | FIG. 14 | MIBC | 22.7 | PGMEA 1 day immersion |
| Chemical liquid 81 | FIG. 14 | MIBC | 22.7 | PGMEA 1 day immersion |
| Chemical liquid 82 | FIG. 14 | MIBC | 22.7 | PGMEA 1 day immersion |
| Chemical liquid 83 | FIG. 14 | MIBC | 22.7 | PGMEA 1 day immersion |
| Chemical liquid 84 | FIG. 14 | MIBC | 22.7 | PGMEA 1 day immersion |
| Chemical liquid 85 | FIG. 14 | nBA | 17.8 | PGMEA 1 day immersion |
| Chemical liquid 86 | FIG. 14 | nBA | 17.8 | PGMEA 1 day immersion |
| Chemical liquid 87 | FIG. 14 | nBA | 17.8 | PGMEA 1 day immersion |
| Chemical liquid 88 | FIG. 14 | nBA | 17.8 | PGMEA 1 day immersion |
| Chemical liquid 89 | FIG. 14 | nBA | 17.8 | PGMEA 1 day immersion |
| Chemical liquid 90 | FIG. 14 | nBA | 17.8 | PGMEA 1 day immersion |
| Chemical liquid 91 | FIG. 14 | nBA | 17.8 | PGMEA 1 day immersion |
| Chemical liquid 92 | FIG. 14 | nBA | 17.8 | PGMEA 1 day immersion |

Table 1 (3-2)

| | | BU-1 | | BU-2 | | BU-3 | | BU-4 | |
|---|---|---|---|---|---|---|---|---|---|
| | Distiller | Material component | Pore size (nm) | Material component | Pore size (nm) | Material component | Pore size (nm) | Material component | Pore size (nm) |
| Chemical liquid 57 | Duplex | PE | 50 | IEX | 15 | — | — | — | — |
| Chemical liquid 58 | Duplex | PE | 50 | IEX | 15 | — | — | — | — |
| Chemical liquid 59 | Duplex | PE | 50 | IEX | 15 | — | — | — | — |
| Chemical liquid 60 | Duplex | PE | 50 | IEX | 15 | — | — | — | — |
| Chemical liquid 61 | Duplex | PE | 50 | IEX | 15 | — | — | — | — |
| Chemical liquid 62 | Duplex | PE | 50 | IEX | 15 | — | — | — | — |
| Chemical liquid 63 | Duplex | PE | 50 | IEX | 15 | — | — | — | — |
| Chemical liquid 64 | Duplex | PE | 50 | IEX | 15 | — | — | — | — |
| Chemical liquid 65 | Duplex | PE | 50 | IEX | 15 | — | — | — | — |
| Chemical liquid 66 | Duplex | PP | 200 | IEX | 15 | — | — | — | — |
| Chemical liquid 67 | Duplex | PP | 200 | IEX | 15 | — | — | — | — |
| Chemical liquid 68 | Duplex | PP | 200 | IEX | 15 | — | — | — | — |
| Chemical liquid 69 | Duplex | PP | 200 | IEX | 15 | — | — | — | — |
| Chemical liquid 70 | Duplex | PP | 200 | IEX | 15 | — | — | — | — |
| Chemical liquid 71 | Duplex | PE | 50 | IEX | 15 | — | — | — | — |

TABLE 1-continued

| | | | | | | | | | | |
|---|---|---|---|---|---|---|---|---|---|---|
| Chemical liquid 72 | Duplex | PE | 50 | IEX | 15 | — | — | — | — | |
| Chemical liquid 73 | Duplex | PE | 50 | IEX | 15 | — | — | — | — | |
| Chemical liquid 74 | Duplex | PE | 50 | IEX | 15 | — | — | — | — | |
| Chemical liquid 75 | Duplex | PE | 50 | IEX | 15 | — | — | — | — | |
| Chemical liquid 76 | Duplex | PE | 50 | IEX | 15 | — | — | — | — | |
| Chemical liquid 77 | Duplex | PE | 50 | IEX | 15 | — | — | — | — | |
| Chemical liquid 78 | Duplex | PE | 50 | IEX | 15 | — | — | — | — | |
| Chemical liquid 79 | Duplex | PE | 50 | IEX | 15 | — | — | — | — | |
| Chemical liquid 80 | Duplex | PE | 50 | IEX | 15 | — | — | — | — | |
| Chemical liquid 81 | Duplex | PE | 50 | IEX | 15 | — | — | — | — | |
| Chemical liquid 82 | Duplex | PE | 50 | IEX | 15 | — | — | — | — | |
| Chemical liquid 83 | Duplex | PE | 50 | IEX | 15 | — | — | — | — | |
| Chemical liquid 84 | Duplex | PE | 50 | IEX | 15 | — | — | — | — | |
| Chemical liquid 85 | Duplex | PE | 50 | IEX | 15 | — | — | — | — | |
| Chemical liquid 86 | Duplex | PE | 50 | IEX | 15 | — | — | — | — | |
| Chemical liquid 87 | Duplex | PE | 50 | IEX | 15 | — | — | — | — | |
| Chemical liquid 88 | Duplex | PE | 50 | IEX | 15 | — | — | — | — | |
| Chemical liquid 89 | Duplex | PE | 50 | IEX | 15 | — | — | — | — | |
| Chemical liquid 90 | Duplex | PE | 50 | IEX | 15 | — | — | — | — | |
| Chemical liquid 91 | Duplex | PE | 50 | IEX | 15 | — | — | — | — | |
| Chemical liquid 92 | Duplex | PE | 50 | IEX | 15 | — | — | — | — | |

Table 1 (3-3)

| | Tank (upstream side) | | F-A | | | BD-1 | |
|---|---|---|---|---|---|---|---|
| | TU-1 | TU-2 | Type | Imidization ratio | Pore size (nm) | Material component | Pore size (nm) |
| Chemical liquid 57 | Present | — | Filter Y4 | 1.93 | 7 | Nylon | 10 |
| Chemical liquid 58 | Present | — | Filter X6 | 2 | 10 | Nylon | 10 |
| Chemical liquid 59 | Present | — | Filter X3 | 1.43 | 12 | Nylon | 10 |
| Chemical liquid 60 | Present | — | Filter X4 | 1.51 | 15 | Nylon | 10 |
| Chemical liquid 61 | Present | — | Filter Y3 | 1.6 | 7 | Nylon | 10 |
| Chemical liquid 62 | Present | — | Filter X5 | 1.3 | 7 | Nylon | 10 |
| Chemical liquid 63 | Present | — | Filter X7 | 1.21 | 10 | Nylon | 10 |
| Chemical liquid 64 | Present | — | Filter Y5 | 1.68 | 12 | Nylon | 10 |
| Chemical liquid 65 | Present | — | Filter X8 | 1.75 | 12 | Nylon | 10 |
| Chemical liquid 66 | Present | — | Filter Y5 | 1.68 | 10 | Nylon | 10 |
| Chemical liquid 67 | Present | — | Filter Y5 | 1.68 | 10 | Nylon | 10 |
| Chemical liquid 68 | Present | — | Filter X1 | 1.48 | 12 | Nylon | 10 |
| Chemical liquid 69 | Present | — | Filter X1 | 1.48 | 15 | Nylon | 10 |
| Chemical liquid 70 | Present | — | Filter R | 1.45 | 13 | Nylon | 10 |

TABLE 1-continued

| | | | | | | | |
|---|---|---|---|---|---|---|---|
| Chemical liquid 71 | Present | — | Filter X3 | 1.43 | 12 | Nylon | 10 |
| Chemical liquid 72 | Present | — | Filter X4 | 1.51 | 15 | Nylon | 10 |
| Chemical liquid 73 | Present | — | Filter X5 | 1.3 | 7 | Nylon | 10 |
| Chemical liquid 74 | Present | — | Filter X7 | 1.21 | 10 | Nylon | 10 |
| Chemical liquid 75 | Present | — | Filter Y5 | 1.68 | 12 | Nylon | 10 |
| Chemical liquid 76 | Present | — | Filter Y2 | 1.82 | 15 | Nylon | 10 |
| Chemical liquid 77 | Present | — | Filter Y4 | 1.93 | 7 | Nylon | 10 |
| Chemical liquid 78 | Present | — | Filter X3 | 1.43 | 12 | Nylon | 10 |
| Chemical liquid 79 | Present | — | Filter X4 | 1.51 | 15 | Nylon | 10 |
| Chemical liquid 80 | Present | — | Filter X5 | 1.3 | 7 | Nylon | 10 |
| Chemical liquid 81 | Present | — | Filter X7 | 1.21 | 10 | Nylon | 10 |
| Chemical liquid 82 | Present | — | Filter Y5 | 1.68 | 12 | Nylon | 10 |
| Chemical liquid 83 | Present | — | Filter Y2 | 1.82 | 15 | Nylon | 10 |
| Chemical liquid 84 | Present | — | Filter Y4 | 1.93 | 7 | Nylon | 10 |
| Chemical liquid 85 | Present | — | Filter X3 | 1.43 | 12 | Nylon | 10 |
| Chemical liquid 86 | Present | — | Filter X4 | 1.51 | 15 | Nylon | 10 |
| Chemical liquid 87 | Present | — | Filter Y3 | 1.6 | 7 | Nylon | 10 |
| Chemical liquid 88 | Present | — | Filter X5 | 1.3 | 7 | Nylon | 10 |
| Chemical liquid 89 | Present | — | Filter X7 | 1.21 | 10 | Nylon | 10 |
| Chemical liquid 90 | Present | — | Filter Y5 | 1.68 | 12 | Nylon | 10 |
| Chemical liquid 91 | Present | — | Filter X8 | 1.75 | 12 | Nylon | 10 |
| Chemical liquid 92 | Present | — | Filter Y6 | 0.88 | 12 | Nylon | 10 |

Table 1 (3-4)

| | BD-2 | | Tank | | |
|---|---|---|---|---|---|
| | Material component | Pore size (nm) | (downstream side) TD-1 | Circulation | Evaluation method |
| Chemical liquid 57 | UPE | 3 | Present | Performed | Pre-wetting |
| Chemical liquid 58 | UPE | 3 | Present | Performed | Pre-wetting |
| Chemical liquid 59 | UPE | 3 | Present | Performed | Developer |
| Chemical liquid 60 | UPE | 3 | Present | Performed | Developer |
| Chemical liquid 61 | UPE | 3 | Present | Performed | Developer |
| Chemical liquid 62 | UPE | 3 | Present | Performed | Developer |
| Chemical liquid 63 | UPE | 3 | Present | Performed | Developer |
| Chemical liquid 64 | UPE | 3 | Present | Performed | Developer |
| Chemical liquid 65 | UPE | 3 | Present | Performed | Developer |
| Chemical liquid 66 | UPE | 1 | Present | Performed | Pre-wetting |
| Chemical liquid 67 | UPE | 3 | Present | Performed | Pre-wetting |
| Chemical liquid 68 | UPE | 3 | Present | Performed | Developer |
| Chemical liquid 69 | UPE | 3 | Present | Performed | Pre-wetting |
| Chemical liquid 70 | UPE | 1 | Present | Performed | Pre-wetting |

TABLE 1-continued

| | | | | | |
|---|---|---|---|---|---|
| Chemical liquid 71 | Present | UPE | 3 | Performed | Pre-wetting |
| Chemical liquid 72 | Present | UPE | 3 | Performed | Pre-wetting |
| Chemical liquid 73 | Present | UPE | 3 | Performed | Pre-wetting |
| Chemical liquid 74 | Present | UPE | 3 | Performed | Pre-wetting |
| Chemical liquid 75 | Present | UPE | 3 | Performed | Pre-wetting |
| Chemical liquid 76 | Present | UPE | 3 | Performed | Pre-wetting |
| Chemical liquid 77 | Present | UPE | 3 | Performed | Pre-wetting |
| Chemical liquid 78 | Present | UPE | 3 | Performed | Rinsing |
| Chemical liquid 79 | Present | UPE | 3 | Performed | Rinsing |
| Chemical liquid 80 | Present | UPE | 3 | Performed | Rinsing |
| Chemical liquid 81 | Present | UPE | 3 | Performed | Rinsing |
| Chemical liquid 82 | Present | UPE | 3 | Performed | Rinsing |
| Chemical liquid 83 | Present | UPE | 3 | Performed | Rinsing |
| Chemical liquid 84 | Present | UPE | 3 | Performed | Rinsing |
| Chemical liquid 85 | Present | UPE | 3 | Performed | Developer |
| Chemical liquid 86 | Present | UPE | 3 | Performed | Developer |
| Chemical liquid 87 | Present | UPE | 3 | Performed | Developer |
| Chemical liquid 88 | Present | UPE | 3 | Performed | Developer |
| Chemical liquid 89 | Present | UPE | 3 | Performed | Developer |
| Chemical liquid 90 | Present | UPE | 3 | Performed | Developer |
| Chemical liquid 91 | Present | UPE | 3 | Performed | Developer |
| Chemical liquid 92 | Present | UPE | 3 | Performed | Developer |

Table 1 (3-5)

| | Evaluation 1 | | Evaluation 2 | | |
|---|---|---|---|---|---|
| | Residue defect inhibition performance | Stain-like defect inhibition performance | Bridge defect inhibition performance | Evaluation 3 Pattern width uniformity | Evaluation 4 Pot life |
| Chemical liquid 57 | AA | AA | AA | A | AA |
| Chemical liquid 58 | AA | AA | AA | A | AA |
| Chemical liquid 59 | AA | AA | AA | AA | AA |
| Chemical liquid 60 | AA | AA | AA | AA | AA |
| Chemical liquid 61 | AA | AA | AA | A | AA |
| Chemical liquid 62 | A | AA | A | AA | AA |
| Chemical liquid 63 | A | A | A | AA | AA |
| Chemical liquid 64 | AA | AA | AA | A | AA |
| Chemical liquid 65 | AA | AA | AA | A | AA |
| Chemical liquid 66 | AA | AA | AA | AA | AA |
| Chemical liquid 67 | AA | AA | AA | AA | AA |
| Chemical liquid 68 | AA | AA | AA | AA | AA |
| Chemical liquid 69 | AA | AA | AA | AA | AA |

TABLE 1-continued

| | | | | | |
|---|---|---|---|---|---|
| Chemical liquid 70 | AA | AA | AA | AA | AA |
| Chemical liquid 71 | A | A | A | A | AA |
| Chemical liquid 72 | A | AA | A | AA | AA |
| Chemical liquid 73 | A | A | A | A | AA |
| Chemical liquid 74 | A | A | A | A | AA |
| Chemical liquid 75 | A | AA | AA | AA | AA |
| Chemical liquid 76 | AA | AA | AA | AA | AA |
| Chemical liquid 77 | AA | AA | AA | A | AA |
| Chemical liquid 78 | A | A | A | AA | AA |
| Chemical liquid 79 | A | AA | A | AA | AA |
| Chemical liquid 80 | A | A | A | AA | AA |
| Chemical liquid 81 | A | A | A | AA | AA |
| Chemical liquid 82 | A | AA | AA | AA | AA |
| Chemical liquid 83 | AA | AA | AA | AA | AA |
| Chemical liquid 84 | AA | AA | AA | A | AA |
| Chemical liquid 85 | AA | AA | AA | AA | AA |
| Chemical liquid 86 | AA | AA | AA | A | AA |
| Chemical liquid 87 | AA | AA | AA | A | AA |
| Chemical liquid 88 | AA | AA | AA | AA | AA |
| Chemical liquid 89 | AA | AA | AA | AA | AA |
| Chemical liquid 90 | AA | AA | AA | A | AA |
| Chemical liquid 91 | AA | AA | AA | A | AA |
| Chemical liquid 92 | A | AA | A | A | AA |

Table 1 is divided into a first group: Table 1 (1-1) to Table 1 (1-5), a second group: Table 1 (2-1) to Table 1 (2-5), and a third group: Table 1 (3-1) to Table 1 (3-5).

In the corresponding lines of five tables of each group subdivided from Table 1, the filters included in the filtering device (or the purification device) used for the purifying each chemical liquid and the evaluation results of the obtained chemical liquid are described.

For example, in the first line in Table 1 (1-1) to Table 1 (1-5) as the first group, the chemical liquid 1 is described.

The first line shows that the chemical liquid 1 was manufactured by the purification device described in FIG. 14, the liquid to be purified used for manufacturing the chemical liquid 1 contained PGMEA, and the SP value thereof was 17.8. In addition, the first line shows that the filter of the purification device used for manufacturing the chemical liquid 1 was washed in advance under the condition of "PGMEA 1 day immersion". Furthermore, the first line shows that the purification device has a duplex distiller, BU-1 (UPE-containing filter having a pore size of 50 nm disposed on the uppermost stream side of the flow path), BU-2 (IEX filter having a pore size of 15 nm disposed on the downstream side of BU-1), a tank TU-1 disposed on the upstream side of the filter A (F-A), the filter X1 having a pore size of 10 nm as F-A (filter A), BD-1 (nylon-containing filter having a pore size of 10 nm) and BD-2 (UPE-containing filter having a pore size of 3 nm) arranged on the downstream side of the filter F-A, and a tank TD-1 disposed on the downstream side of the filter F-A. The first line also shows that the circulation filtration was "performed".

The first line also shows that the chemical liquid 1 was evaluated by the "Pre-wetting" method, the residue defect inhibition performance was AA, the stain-like defect inhibition performance was AA, the bridge defect inhibition performance was AA, the pattern width uniformity was AA, and the pot life of the filter of the purification device was AA.

Likewise, for the chemical liquids 2 to 30, the results are described in the tables of the first group, and for the chemical liquids 31 to 56, the results are described in the tables of the second group. Furthermore, for the chemical liquids 57 to 92, the results are described in each table of the third group.

As is evident from the results shown in the table, the chemical liquids, which were manufactured using the filtering device (purification device) having a predetermined filter A and a filter B different from the filter A, had excellent defect inhibition performance. In contrast, the filtering device having only the filter A did not have the effects of the present invention.

Moreover, compared to the chemical liquid 92, the chemical liquid 1, which was purified using the filtering device with the filter A having an imidization ratio equal to or higher than 1.0, had better residue defect inhibition performance and better bridge defect inhibition performance and resulted in better pattern width uniformity.

TABLE 2

Table 2 (1-1)

| | Filtering device | Liquid to be purified | Pre-washing of filter | Distiller |
|---|---|---|---|---|
| Chemical liquid 201 | FIG. 20 | SPM (4:1) | PGMEA 1 day immersion | — |
| Chemical liquid 202 | FIG. 20 | 85% phosphoric acid | PGMEA 1 day immersion | — |
| Chemical liquid 203 | FIG. 25 | SPM (4:1) | PGMEA 1 day immersion | — |
| Chemical liquid 204 | FIG. 25 | 85% phosphoric acid | PGMEA 1 day immersion | — |

Table 2 (1-2)

| | BU-1 | | BU-2 | | |
|---|---|---|---|---|---|
| | Material component | Pore size (nm) | Material component | Pore size (nm) | Tank TU-1 |
| Chemical liquid 201 | PTFE | 200 | PTFE | 20 | Present |
| Chemical liquid 202 | PTFE | 200 | PTFE | 20 | Present |
| Chemical liquid 203 | — | — | — | — | — |
| Chemical liquid 204 | — | — | — | — | — |

Table 2 (1-3)

| | F-A | | | BD-1 | | BD-2 | |
|---|---|---|---|---|---|---|---|
| | Type | Imidization ratio | Pore size (nm) | Material component | Pore size (nm) | Material component | Pore size (nm) |
| Chemical liquid 201 | Filter X3 | 1.43 | 15 | PTFE | 10 | PTFE | 10 |
| Chemical liquid 202 | Filter X3 | 1.43 | 7 | PTFE | 10 | PTFE | 10 |
| Chemical liquid 203 | Filter X3 | 1.43 | 15 | — | — | — | — |
| Chemical liquid 204 | Filter X3 | 1.43 | 7 | — | — | — | — |

Table 2 (1-4)

| | | | Evaluation 1 | | |
|---|---|---|---|---|---|
| | Tank TD-1 | Circulation | Particle defect inhibition performance | Stain-like defect inhibition performance | Evaluation 2 Pot life |
| Chemical liquid 201 | Present | Performed | A | A | A |
| Chemical liquid 202 | Present | Performed | A | A | A |
| Chemical liquid 203 | — | — | C | B | Standard |
| Chemical liquid 204 | — | — | C | B | D |

Table 2 is divided into Table 2 (1-1) to Table 2 (1-4). In the corresponding lines of the tables subdivided from Table 2, the filtering devices used for purifying the chemical liquids and the obtained evaluation results of chemical liquids are described.

For example, in the first line of each of the subdivision tables, the chemical liquid 201 is described.

The first line shows that the chemical liquid 201 was manufactured by the filtering device illustrated in FIG. 20, and the liquid to be purified used for manufacturing the chemical liquid 201 was SPM (4:1). In addition, the first line shows that the filter of the filtering device used for manufacturing the chemical liquid 201 was washed in advance under the condition of "PGMEA 1 day immersion". Furthermore, the first line shows that the filtering device has BU-1 (a PTFE-containing filter having a pore size of 200 nm), BU-2 (a PTFE-containing filter having a pore size of 20 nm), a tank TU-1 disposed on the upstream side of the filter F-A, the filter X3 having a pore size of 15 nm as F-A (filter A), and has BD-1 (a PTFE-containing filter having a pore size of 10 nm), BD-2 (a PTFE-containing filter having a pore size of 10 nm), and a tank TD-1 which are disposed on the downstream side of the filter F-A. The first line also shows that the circulation filtration was "performed".

As is evident from the first line, the chemical liquid 201 was evaluated as A for the particle defect inhibition performance, A for the stain-like defect inhibition performance, and A for the pot life of the filter of the filtering device.

Likewise, for the chemical liquids 202 to 204, the results are described in the above tables.

From the results described in the table, it has been revealed that the chemical liquids 201 and 202 purified using a filtering device having a filter A and a filter B different from the filter A have desired effects. In contrast, the chemical liquids 203 and 204 purified using a filtering device having only the filter A did not have desired effects.

TABLE 3

Table 3 (1-1)

Figure 27:
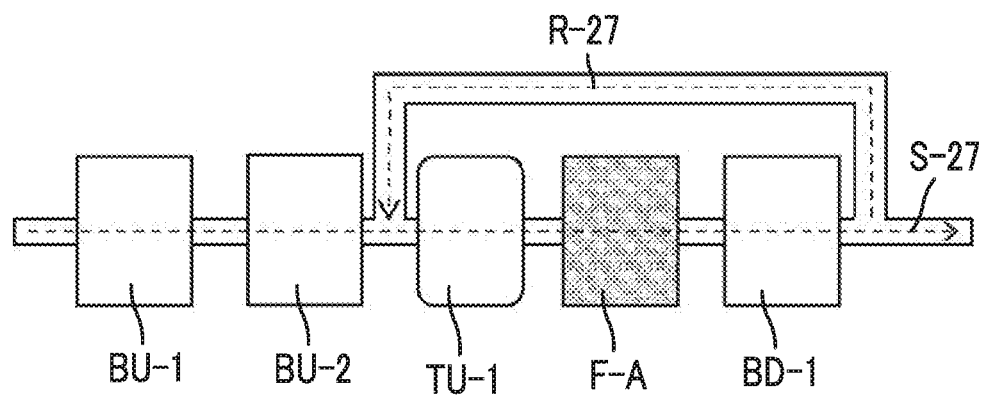
FIG. 27 is a schematic view illustrating a filtering device according to an embodiment of the present invention.

| | Filtering device | Liquid to be purified | Pre-washing of filter | Distiller | BU-1 Material component | BU-1 Pore size (nm) |
|---|---|---|---|---|---|---|
| Chemical liquid 301 | FIG. 26 | Resist resin composition 2 | PGMEA 1 day immersion | — | Nylon | 10 |
| Chemical liquid 302 | FIG. 27 | Resist resin composition 2 | PGMEA 1 day immersion | — | Nylon | 20 |
| Chemical liquid 303 | FIG. 25 | Resist resin composition 2 | PGMEA 1 day immersion | — | — | — |
| Chemical liquid 304 | FIG. 26 | Resist resin composition 3 | PGMEA 1 day immersion | — | Nylon | 10 |
| Chemical liquid 305 | FIG. 27 | Resist resin composition 3 | PGMEA 1 day immersion | — | Nylon | 20 |
| Chemical liquid 306 | FIG. 25 | Resist resin composition 3 | PGMEA 1 day immersion | — | — | — |
| Chemical liquid 307 | FIG. 26 | Resist resin composition 4 | PGMEA 1 day immersion | — | Nylon | 10 |
| Chemical liquid 308 | FIG. 27 | Resist resin composition 4 | PGMEA 1 day immersion | — | Nylon | 20 |
| Chemical liquid 309 | FIG. 25 | Resist resin composition 4 | PGMEA 1 day immersion | — | — | — |

Table 3 (1-2)

| | BU-2 Material component | BU-2 Pore size (nm) | Tank TU-1 | F-A Type | F-A Imidization ratio | F-A Pore size (nm) | BD-1 Material component | BD-1 Pore size (nm) |
|---|---|---|---|---|---|---|---|---|
| Chemical liquid 301 | — | — | Present | Filter X3 | 1.43 | 15 | UPE | 1 |
| Chemical liquid 302 | Nylon | 10 | Present | Filter X3 | 1.43 | 15 | UPE | 1 |
| Chemical liquid 303 | — | — | — | Filter X3 | 1.43 | 15 | — | — |
| Chemical liquid 304 | — | — | Present | Filter X3 | 1.43 | 7 | UPE | 1 |
| Chemical liquid 305 | Nylon | 10 | Present | Filter X3 | 1.43 | 7 | UPE | 1 |
| Chemical liquid 306 | — | — | — | Filter X3 | 1.43 | 7 | — | — |
| Chemical liquid 307 | — | — | Present | Filter X3 | 1.43 | 10 | UPE | 1 |
| Chemical liquid 308 | Nylon | 10 | Present | Filter X3 | 1.43 | 10 | UPE | 1 |
| Chemical liquid 309 | — | — | — | Filter X3 | 1.43 | 10 | — | — |

Table 3 (1-3)

| | Tank TD-1 | Circulation | Evaluation 1 Bridge defect inhibition performance | Evaluation 2 Post-development defect inhibition performance | Evaluation 3 Pot life |
|---|---|---|---|---|---|
| Chemical liquid 301 | — | Performed | A | A | A |
| Chemical liquid 302 | — | Performed | A | A | AA |
| Chemical liquid 303 | — | — | C | C | Standard |
| Chemical liquid 304 | — | Performed | A | A | A |
| Chemical liquid 305 | — | Performed | A | A | AA |
| Chemical liquid 306 | — | — | C | C | D |
| Chemical liquid 307 | — | Performed | A | A | A |

TABLE 3-continued

| Chemical liquid 308 | — | Performed | A | A | AA |
|---|---|---|---|---|---|
| Chemical liquid 309 | — | — | C | C | D |

Table 3 is divided into Table 3 (1-1) to Table 3 (1-3). In the corresponding lines of the tables subdivided from Table 3, the filtering devices used for purifying the chemical liquids and the obtained evaluation results of chemical liquids are described.

For example, in the first line of each of the subdivision tables, the chemical liquid 301 is described.

The first line shows that the chemical liquid 301 was manufactured by the filtering device illustrated in FIG. 26, and the liquid to be purified used for manufacturing the chemical liquid 301 was the resist resin composition 2. In addition, the first line shows that the filter of the filtering device used for manufacturing the chemical liquid 301 was washed in advance under the condition of "PGMEA 1 day immersion". Furthermore, the first line shows that the filtering device has BU-1 (a nylon-containing filter having a pore size of 10 nm), a tank TU-1 on the upstream side of the filter F-A, the filter X3 having a pore size of 15 nm as F-A (filter A), and BD-1 (a UPE-containing filter having a pore size of 1 nm) on the downstream side of the filter F-A. The first line also shows that the circulation filtration was "performed".

As is evident from the first line, the chemical liquid 301 was evaluated as A for the bridge defect inhibition performance, A for the post-development defect inhibition performance, and A for the pot life of the filter of the filtering device.

Likewise, for the chemical liquids 302 to 309, the results are described in the above tables.

From the results described in the table, it has been revealed that the chemical liquids 301 and 302, the chemical liquids 304 and 305, and the chemical liquids 307 and 308 purified using a filtering device having a filter A and a filter B different from the filter A have desired effects. In contrast, the chemical liquid 303, the chemical liquid 306, and the chemical liquid 309, which were purified using the filtering device having only the filter A, did not have the desired effects.

TABLE 4

Table 4 (1-1)

| | Filtering device | Liquid to be purified | Pre-washing of filter | Distiller | BU-1 Material component | BU-1 Pore size (nm) |
|---|---|---|---|---|---|---|
| Chemical liquid 310 | FIG. 27 | Resist resin composition 2 | PGMEA 1 day immersion | — | Nylon | 20 |
| Chemical liquid 311 | FIG. 27 | Resist resin composition 2 | PGMEA 1 day immersion | — | Nylon | 20 |
| Chemical liquid 312 | FIG. 27 | Resist resin composition 3 | PGMEA 1 day immersion | — | Nylon | 20 |
| Chemical liquid 313 | FIG. 27 | Resist resin composition 3 | PGMEA 1 day immersion | — | Nylon | 20 |

Table 4 (1-2)

| | BU-2 Material component | BU-2 Pore size (nm) | Tank TU-1 | F-A Type | F-A Imidization ratio | F-A Pore size (nm) | F-A B value (nm) |
|---|---|---|---|---|---|---|---|
| Chemical liquid 310 | Nylon | 10 | Present | Filter S | 1.43 | 7 | 8 |
| Chemical liquid 311 | Nylon | 10 | Present | Filter T | 1.54 | 10 | 8 |
| Chemical liquid 312 | Nylon | 10 | Present | Filter S | 1.43 | 7 | 8 |
| Chemical liquid 313 | Nylon | 10 | Present | Filter T | 1.54 | 10 | 8 |

Table 4 (1-3)

| | BD-1 Material component | BD-1 Pore size (nm) | Tank TD-1 | Circulation | Evaluation 1 Bridge defect inhibition performance | Evaluation 2 Post-development defect inhibition performance | Evaluation 3 Pot life |
|---|---|---|---|---|---|---|---|
| Chemical liquid 310 | UPE | 1 | — | Performed | AA | A | A |
| Chemical liquid 311 | UPE | 1 | — | Performed | AA | A | A |

TABLE 4-continued

| Chemical liquid 312 | UPE | 1 | — | Performed | AA | A | A |
| Chemical liquid 313 | UPE | 1 | — | Performed | AA | A | A |

Table 4 is divided into Table 4 (1-1) to Table 4 (1-3). In the corresponding lines of the tables subdivided from Table 4, the filtering devices used for purifying the chemical liquids and the obtained evaluation results of chemical liquids are described.

For example, in the first line of each of the subdivision tables, the chemical liquid 310 is described.

The first line shows that the chemical liquid 310 was manufactured by the filtering device illustrated in FIG. 27, and the liquid to be purified used for manufacturing the chemical liquid 310 was the resist resin composition 2. In addition, the first line shows that the filter of the filtering device used for manufacturing the chemical liquid 310 was washed in advance under the condition of "PGMEA 1 day immersion". Furthermore, the first line shows that the filtering device has BU-1 (a nylon-containing filter having a pore size of 20 nm), a tank TU-1 on the upstream side of the filter F-A, the filter S having a pore size of 7 nm and a B value of 8 nm as F-A (filter A), and BD-1 (a UPE-containing filter having a pore size of 1 nm) on the downstream side of the filter S. The first line also shows that the circulation filtration was "performed".

As is evident from the first line, the chemical liquid 310 was evaluated as AA for the bridge defect inhibition performance, A for the post-development defect inhibition performance, and A for the pot life of the filter of the filtering device.

Likewise, for the chemical liquids 311 to 313, the results are described in the above tables.

From the results described in the table, it has been revealed that the chemical liquids 310 to 313 purified using a filtering device having a filter A and a filter different from the filter A have the effects of the present invention.

For the chemical liquids 1 to 13, the chemical liquids 15 to 28, the chemical liquids 30 to 33, the chemical liquids 35 to 92, the chemical liquids 201 and 202, the chemical liquids 301 and 302, the chemical liquids 304 and 305, the chemical liquids 307 and 308, and the chemical liquids 310 to 313, chemical liquids were prepared using the same filtering device (purification device) as that described in the tables. In this case, circulation filtration was not performed. The obtained chemical liquids were evaluated in terms of the items described in the tables. As a result, the obtained chemical liquids were found to have excellent defect inhibition performance. Furthermore, it has been confirmed that the pot life of the filter is also excellent as described above.

EXPLANATION OF REFERENCES 100, 200, 300, 400, 500, 600, 700, 800, 900, 1000: filtering device
101: inlet portion
102: outlet portion
103, 104, 201, 601, 104-1, 104-2: filter
105, 202, 301, 302, 402, 501, 502, 602, 701, 801, 802, 803, 804, 901, 1001, 1002, 1104, 1105, 1305: piping
401, 401(a), 401(b): tank
1100: manufacturing plant
1101: distillation device 1200, 1300: purification device
1102, 1203, 1303, 1304: distiller
1103: portable tank
1106: transporting unit
1201, 1301: second inlet portion
1202, 1302: second outlet portion

What is claimed is:

1. A filtering device for obtaining a chemical liquid by purifying a liquid to be purified, the filtering device comprising:
   an inlet portion;
   an outlet portion;
   a filter A;
   at least one filter B different from the filter A;
   a flow path which includes the filter A and the filter B arranged in series and extends from the inlet portion to the outlet portion; and
   a return flow path,
   wherein the filter A is a porous membrane containing a polyimide-based resin,
      the filter B includes two or more filters BD that are disposed on a downstream side of the filter A on the flow path and have a pore size smaller than a pore size of the filter A,
      the filter B further includes two or more filters BU that are disposed on an upstream side of the filter A on the flow path and have a pore size larger than the pore size of the filter A,
      the two or more filters BU include at least one filter that contains a resin having an ion exchange group,
      at least one of the two or more filters BD includes a first resin including at least one resin selected from the group consisting of polyolefin, polyamide, polyfluorocarbon, polystyrene, and polyethersulfone, and a second resin having at least one hydrophilic group, and
   the return flow path is configured to return the liquid to be purified to the upstream side of the filter A and a downstream side of at least one of the two or more filters BU from the downstream side of the filter A on the flow path.

2. The filtering device according to claim 1, wherein an imidization ratio of the polyimide-based resin is equal to or higher than 1.0.

3. The filtering device according to claim 1, wherein the pore size of at least one of the two or more filters BD is equal to or smaller than 20 nm.

4. The filtering device according to claim 1, wherein at least one of the two or more filters BD contains at least one kind of resin selected from the group consisting of polyethylene, nylon, and polytetrafluoroethylene.

5. The filtering device according to claim 1, wherein at least one of the two or more filters BD contains a second resin having a hydrophilic group.

6. The filtering device according to claim 1, wherein the pore size of at least one of the two or more filters BU is equal to or greater than 20 nm.

7. The filtering device according to claim 1,
wherein the ion exchange group is at least one kind of group selected from the group consisting of an acid group and a base group.

8. The filtering device according to claim 1, further comprising:
a tank arranged in series with the filter A on the flow path.

9. The filtering device according to claim 8, further comprising:
a filter C which is arranged in series with the tank on an upstream side of the tank in the flow path and has a pore size equal to or greater than 20 nm.

10. The filtering device according to claim 1,
wherein the return flow path is configured to return the liquid to be purified to an upstream side of a reference filter from a downstream side of the reference filter,
wherein the reference filter consists of one of the two or more filters BD.

11. A purification device comprising:
the filtering device according to claim 1; and
at least one distiller connected to the inlet portion of the filtering device.

12. The purification device according to claim 11,
wherein the at least one distiller includes a plurality of distillers connected in series.

13. A method for manufacturing a chemical liquid by purifying a liquid to be purified, comprising:
a filtration step of purifying the liquid to be purified by using the filtering device according to claim 1 so as to obtain a chemical liquid.

14. The method for manufacturing a chemical liquid according to claim 13, further comprising:
a filter washing step of washing the filter A and the filter B by using a washing solution before the filtration step.

15. The method for manufacturing a chemical liquid according to claim 13, further comprising:
a device washing step of washing a liquid contact portion of the filtering device by using a washing solution before the filtration step.

16. The method for manufacturing a chemical liquid according to claim 14,
wherein the washing solution contains at least one kind of compound selected from the group consisting of hydroxyaliphatic carboxylic acid ester, aliphatic carboxylic acid ester, chain-like or cyclic ketone, alkylene glycol monoalkyl ether, alkylene glycol monoalkyl ether acetate, and aprotic polar solvent.

17. A filtering device for obtaining a chemical liquid by purifying a liquid to be purified, the filtering device comprising:
an inlet portion;
an outlet portion;
a filter A;
at least one filter B different from the filter A;
a flow path which includes the filter A and the filter B arranged in series and extends from the inlet portion to the outlet portion; and
a return flow path,
wherein the filter A is a porous membrane containing a polyimide-based resin,
the filter B further includes at least one filter BD that is disposed on the downstream side of the filter A on the flow path and has a pore size smaller than a pore size of the filter A,
the filter BD includes a first resin including at least one resin selected from the group consisting of polyolefin, polyamide, polyfluorocarbon, polystyrene, and polyethersulfone, and a second resin having at least one hydrophilic group,
the filter B includes at least one filter BU that is disposed on an upstream side of the filter A on the flow path and has a pore size larger than a pore size of the filter A, and
the return flow path is configured to return the liquid to be purified to the upstream side of the filter A and a downstream side of the filter BU from a downstream side of the filter A on the flow path.

18. A filtering device for obtaining a chemical liquid by purifying a liquid to be purified, the filtering device comprising:
an inlet portion;
an outlet portion;
a filter A;
at least one filter B different from the filter A;
a flow path which includes the filter A and the filter B arranged in series and extends from the inlet portion to the outlet portion;
a tank arranged in series with the filter A on an upstream side of the filter A on the flow path;
a filter C which is arranged in series with the tank on an upstream side of the tank in the flow path and has a pore size equal to or greater than 20 nm, and
a return flow path,
wherein the filter A is a porous membrane containing a polyimide-based resin,
the pore size of the filter A is equal to or greater than 0.1 nm and equal to or smaller than 20 nm, and
the pore size of the filter B is equal to or greater than 1 nm and equal to or smaller than 200 nm,
the filter B further includes at least one filter BD that is disposed on the downstream side of the filter A on the flow path and has a pore size smaller than a pore size of the filter A,
the filter BD includes a first resin including at least one resin selected from the group consisting of polyolefin, polyamide, polyfluorocarbon, polystyrene, and polyethersulfone, and a second resin having at least one hydrophilic group, and
the return flow path is configured to return the liquid to be purified to the upstream side of the filter A and a downstream side of the filter C from a downstream side of the filter A on the flow path.

19. The filtering device according to claim 1,
wherein
the filter A is a cartridge filter having a core and a filter wound around the core, the cartridge being formed of a material permeable to the liquid to be purified, or the cartridge having a structure permeable to the liquid to be purified.

20. The filtering device according to claim 1,
wherein
the filter A is a filter which is disposed in a housing.

21. The filtering device according to claim 1,
wherein the pore size of the filter A is equal to or greater than 0.1 nm and equal to or smaller than 20 nm,
the pore size of at least one of the two or more filters BD is equal to or greater than 1 nm and equal to or smaller than 20 nm, and
the pore size of at least one of the two or more filters BU is equal to or greater than 15 nm and equal to or smaller than 200 nm.

22. The filtering device according to claim 1,
wherein the second resin has at least one hydrophilic group selected from the group consisting of a hydroxyl group, an ether group, an oxyalkylene group, an ester group, a carbonic acid ester group, a thiol group, a thioether group, a phosphoric acid group, and a phosphoric acid ester group.

23. The filtering device according to claim 17, wherein the filter B further includes at least one filter BD that is disposed on the downstream side of the filter A on the flow path and has a pore size smaller than the pore size of the filter A.

24. The filtering device according to claim 17, wherein the pore size of the filter A is equal to or greater than 0.1 nm and equal to or smaller than 20 nm, and the pore size of the filter BU is equal to or greater than 15 nm and equal to or smaller than 200 nm.

25. The filtering device according to claim 17, wherein the second resin has at least one hydrophilic group selected from the group consisting of a hydroxyl group, an ether group, an oxyalkylene group, an ester group, a carbonic acid ester group, a thiol group, a thioether group, a phosphoric acid group, and a phosphoric acid ester group.

\* \* \* \* \*